(12) United States Patent
Tsang et al.

(10) Patent No.: US 12,048,175 B2
(45) Date of Patent: Jul. 23, 2024

(54) ORGANIC ELECTROLUMINESCENT DEVICE

(71) Applicant: KYUSHU UNIVERSITY, NATIONAL UNIVERSITY CORPORATION, Fukuoka (JP)

(72) Inventors: Ping Kuen Daniel Tsang, Fukuoka (JP); Chihaya Adachi, Fukuoka (JP)

(73) Assignee: KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 175 days.

(21) Appl. No.: 16/066,387

(22) PCT Filed: Dec. 28, 2016

(86) PCT No.: PCT/JP2016/089032
§ 371 (c)(1),
(2) Date: Jun. 27, 2018

(87) PCT Pub. No.: WO2017/115833
PCT Pub. Date: Jul. 6, 2017

(65) Prior Publication Data
US 2018/0366677 A1 Dec. 20, 2018

(30) Foreign Application Priority Data
Dec. 28, 2015 (JP) ................. 2015-256566

(51) Int. Cl.
*H01L 51/50* (2006.01)
*C09K 11/06* (2006.01)
(Continued)

(52) U.S. Cl.
CPC ............. *H10K 50/12* (2023.02); *C09K 11/06* (2013.01); *H10K 50/18* (2023.02); *H10K 50/81* (2023.02);
(Continued)

(58) Field of Classification Search
None
See application file for complete search history.

(56) References Cited

U.S. PATENT DOCUMENTS 10,505,120 B2 12/2019 Yamazaki et al.
2003/0129449 A1* 7/2003 Parton ................. H01L 51/006
428/690

(Continued)

FOREIGN PATENT DOCUMENTS

CN 101128559 A 2/2008
EP 2958158 A1 12/2015
(Continued)

OTHER PUBLICATIONS

Machine English translation of Kondakova et al. (JP 2008-524848). Jun. 30, 2020.*
(Continued)

*Primary Examiner* — Jay Yang
(74) *Attorney, Agent, or Firm* — BROWDY AND NEIMARK, PLLC

(57) ABSTRACT

An organic electroluminescent device having a structure of at least an anode 2, a light-emitting layer 3 and a cathode 4 layered in that order, wherein the light-emitting layer 3 contains a first host material, a second host material and a light-emitting material of a dopant, and both the first host material and the second host material have a lowest excited triplet energy level higher than the lowest excited triplet energy level of the light-emitting material. The device is protected from performance deterioration with time in driving and has a long lifetime.

2 Claims, 17 Drawing Sheets

(51) Int. Cl.
  H01L 51/00 (2006.01)
  H01L 51/52 (2006.01)
  H10K 50/12 (2023.01)
  H10K 50/18 (2023.01)
  H10K 50/81 (2023.01)
  H10K 50/82 (2023.01)
  *H10K 50/11* (2023.01)
  *H10K 50/15* (2023.01)
  *H10K 50/16* (2023.01)
  *H10K 85/60* (2023.01)
  *H10K 101/00* (2023.01)
  *H10K 101/10* (2023.01)

(52) U.S. Cl.
  CPC ............ *H10K 50/82* (2023.02); *H10K 50/11* (2023.02); *H10K 50/15* (2023.02); *H10K 50/166* (2023.02); *H10K 85/654* (2023.02); *H10K 85/6572* (2023.02); *H10K 2101/10* (2023.02); *H10K 2101/90* (2023.02)

(56) References Cited

U.S. PATENT DOCUMENTS

| | | | |
|---|---|---|---|
| 2006/0134460 A1 | | 6/2006 | Kondakova et al. |
| 2006/0134461 A1* | | 6/2006 | Huo .................. C09K 11/06 428/690 |
| 2010/0090238 A1* | | 4/2010 | Mori .................. H01L 51/5012 257/98 |
| 2011/0227478 A1* | | 9/2011 | Yasuda ................ H10K 50/11 313/504 |
| 2015/0105564 A1* | | 4/2015 | Adachi ............... C07D 209/08 548/440 |

FOREIGN PATENT DOCUMENTS

| | | |
|---|---|---|
| JP | 2004022334 A | 1/2004 |
| JP | 2008-524848 A | 7/2008 |
| JP | 2008-288344 A | 11/2008 |
| JP | 2013-93455 A | 5/2013 |
| JP | 2013-116975 A | 6/2013 |
| JP | 2013239703 B2 | 11/2013 |
| JP | 2013-253121 A | 12/2013 |
| JP | 2013-256490 A | 12/2013 |
| JP | 2014-9224 A | 1/2014 |
| JP | 2014-9352 A | 1/2014 |
| JP | 2014-075249 A | 4/2014 |
| JP | 2015-129240 A | 7/2015 |
| JP | 2015-144224 A | 8/2015 |
| TW | 201136931 A | 11/2011 |
| TW | 201242132 A1 | 10/2012 |
| TW | 201406724 A | 2/2014 |
| WO | 2006/076092 A1 | 7/2006 |
| WO | 2013/011954 A1 | 1/2013 |
| WO | 2013/011955 A1 | 1/2013 |
| WO | 2013/081088 A1 | 6/2013 |
| WO | 2013/133359 A1 | 9/2013 |
| WO | 2013/154064 A1 | 10/2013 |
| WO | 2013/161437 A1 | 10/2013 |
| WO | 2014/034535 A1 | 3/2014 |
| WO | 2014/115743 A1 | 7/2014 |
| WO | 2014/122895 A1 | 8/2014 |
| WO | 2014/126200 A1 | 8/2014 |
| WO | 2014/133121 A1 | 9/2014 |
| WO | 2014/136758 A1 | 9/2014 |
| WO | 2014/136860 A1 | 9/2014 |
| WO | 2014/168101 A1 | 10/2014 |
| WO | 2014/189122 A1 | 11/2014 |
| WO | 2014/196585 A1 | 12/2014 |
| WO | 2014/203840 A1 | 12/2014 |
| WO | 2015/002213 A1 | 1/2015 |
| WO | 2015/008580 A1 | 1/2015 |
| WO | 2015/016200 A1 | 2/2015 |
| WO | 2015/019725 A1 | 2/2015 |
| WO | 2015/072470 A1 | 5/2015 |
| WO | 2015/072537 A1 | 5/2015 |
| WO | 2015/080182 A1 | 6/2015 |
| WO | 2015/080183 A1 | 6/2015 |
| WO | 2015/108049 A1 | 7/2015 |
| WO | 2015/129714 A1 | 9/2015 |
| WO | 2015/129715 A1 | 9/2015 |
| WO | 2015/133501 A1 | 9/2015 |
| WO | 2015/136880 A1 | 9/2015 |
| WO | 2015/137136 A1 | 9/2015 |
| WO | 2015/137202 A1 | 9/2015 |
| WO | 2015/137244 A1 | 9/2015 |
| WO | 2015/146541 A1 | 10/2015 |
| WO | 2015/159541 A1 | 10/2015 |

OTHER PUBLICATIONS

Mehes et al. (Organic Electronics 15 (2014) 2027-2037).*
International Preliminary Report on Patentability for corresponding PCT International Application No. PCT/JP2016/089032 dated Jul. 3, 2018, with English translation.
International Search Report for corresponding PCT International Application No. PCT/JP2016/089032.
Office Action dated May 7, 2019, issued in the corresponding Chinese patent application No. 201680076949.7 with its English Machine Translation.
Taiwanese Office Action dated Jun. 10, 2020 issued in the corresponding Taiwanese patent application No. 105143497 with English Translation.
Taiwanese Office Action dated Oct. 5, 2020, issued in the corresponding Taiwanese patent application No. 105143497 with English Translation.
Takahiro Higuchi et al., High performance TADF based OLEDs with a mixed host layer. 61st Japan Society of Applied Physics Spring Meeting, 12-228 Paragraphs 3-4 and FIGs 1 and 2 (text of Figs. 1 and 2 in English).
Chamg Woo Seo et al., Organic Electronics 13 (2012), pp. 341-349, 2011, Table 1 of p. 343.
Notice of Dispatch of Duplicates of a Written Opposition dated Feb. 10, 2021 in Japanese Patent No. 6739804.
Notice of Reasons for Revocation dated Jun. 18, 2021 in Japanese Patent No. 6739804.
Lee et al., High-efficiency organic light-emitting diodes utilizing thermally activated delayed fluorescence from triazine-based donor-acceptor hybrid molecules, Applied Physics Letters, American Institute of Physics, Aug. 30, 2012, 101, 093306 (2012).
Taiwan office action dated Mar. 28, 2022, in corresponding Taiwanese patent application No. 110118196.
Office Action dated Jul. 29, 2022 issued in the corresponding Taiwanese patent application No. 110118196 with its English Translation.

* cited by examiner

ORGANIC ELECTROLUMINESCENT DEVICE

TECHNICAL FIELD

The present invention relates to an organic electroluminescent device, in particular to prolongation of lifetime of an organic electroluminescent device.

BACKGROUND ART

An organic electroluminescent device (organic EL device) is a light-emitting device in which the light-emitting material is excited by the recombination energy or electrons and holes injected in the light-emitting layer therein and the light radiated when the excitons are restored to the ground state is taken outside for light emission, and the device is composed of at least a cathode and anode, and a light-emitting layer arranged between the cathode and the anode (for example, see PTL 1).

In that manner, an organic electroluminescent device is a spontaneous light-emitting device and therefore does not require a backlight, and the advantages thereof are that, as compared with a liquid-crystal display using a backlight, an organic electroluminescent device can be thinned, enables power consumption reduction, and can attain a high contrast and a rapid response speed. Consequently, an organic electroluminescent device is greatly expected as a light-emitting device for display systems and lighting systems, and after the problems in the early phase of development have become solved, studies for enhancing the practicability of the device have become much carried out.

CITATION LIST

Patent Literature

PTL 1: JP2013-93455A

SUMMARY OF INVENTION

Technical Problem

In practical use of display systems and lighting systems, it is important that the brightness and the drive voltage of the light-emitting device are stable for a long period of time, that is, the lifetime of the light-emitting device is sufficiently long. However, in general, many organic electroluminescence device have a short lifetime, and this is a bar to practical use of organic electroluminescence devices.

Given the situation, the present inventors mode assiduous studies for the purpose of obtaining a long-life organic electroluminescence device capable of preventing performance degradation with time in driving.

Solution to Problem

The present inventors have further made assiduous studies for the purpose of solving the above-mentioned problems and, as a result, have found that, when two kinds of host materials (first host material and second host material) whose lowest excited triplet energy level is higher than the lowest excited triplet energy level of a light-emitting material of a dopant are contained in a light-emitting layer, performance degradation with time in device driving can be effectively prevented, and the lifetime of the organic electroluminescent device of the type can be noticeably prolonged.

The present invention has been proposed on the basis of these findings, and specifically has the following constitution.

[1] An organic electroluminescent device having a structure of at least an anode, a light-emitting layer and a cathode layered in that order, wherein the light-emitting layer contains a first host material, a second host material and a light-emitting material of a dopant, and both the first host material and the second host material have a lowest excited triplet energy level higher than the lowest excited triplet energy level of the light-emitting material.

[2] The organic electroluminescent device according to [1], wherein the second host material has an electron transport property.

[3] The organic electroluminescent device according to [1] or [2], which has at least one electron transport layer between the light-emitting layer and the cathode and wherein the second host material is the same material as the constituent material of the electron transport layer nearest to the light-emitting layer among the electron transport layers.

[4] The organic electroluminescent device according to any one of [1] to [3], wherein the second host material is a compound represented by the following general formula (1) or a derivative of the compound:

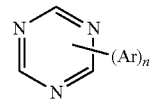

General Formula (1)

[In the general formula (1), Ar represents a substituted or unsubstituted aryl group, or a substituted or unsubstituted heteroaryl group, n represents an integer of 1 to 3, and when n is 2 or more, plural Ar's may be the same as or different from each other.]

[5] The organic electroluminescent device according to [4], wherein the compound represented by the general formula (1) is a compound represented by the following general formula (2):

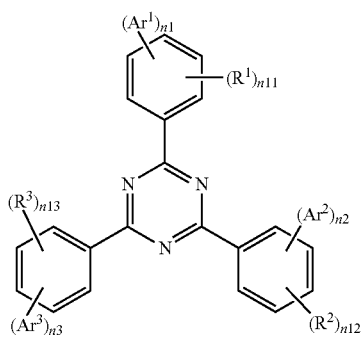

General Formula (2)

[In the general formula (2), $Ar^1$, $Ar^2$ and $Ar^3$ each independently represents substituted or unsubstituted aryl group, or a substituted or unsubstituted heteroaryl group, $R^1$, $R^2$ and $R^3$ each independently represent a substituent, and the substituent is neither a substituted or unsubstituted aryl group nor a substituted or unsubstituted heteroaryl group, n1, n2, and n3 each independently represent an integer of 1 to 5, n1, n12 and n13 each independently represent an integer of 0 to 4.]

[5] The organic electroluminescent device according to any one of [1] to [5], which has at least one electron transport layer between the light-emitting layer and the cathode and wherein the at least one electron transport layer contains a compound containing Group-1 atom, a Group-2 atom or a transition metal atom.

[7] The organic electroluminescent device according to [6], which has between the light-emitting layer and the cathode, a first electron transport layer and a second electron transport layer in that order from the side of the light-emitting layer, and wherein the second electron transport layer contains a compound containing a Group-1 atom, a Group-2 atom or a transition metal atom.

[8] The organic electroluminescent device according to [6] or [7], wherein the compound is a compound containing Li.

[9] The organic electroluminescent device according to any one of [6] to [8], wherein the compound is a 8-hydroxyquinolinolate derivative.

Advantageous Effects of Invention

In the organic electroluminescent device of the present invention, the light-emitting layer contains a first host material, a second host material and a light-emitting material of a dopant, and both the first host material and the second host material have a lowest excited triplet energy level $T1_h$ higher than the lowest excited triplet energy level $T1_d$ of the light-emitting material, and therefore, the organic electroluminescent device can prevent performance degradation with time in driving and the lifetime thereof can be thereby greatly prolonged.

DESCRIPTION OF EMBODIMENTS

The contents of the invention will be described in detail below. The constitutional elements may be described below with reference to representative embodiments and specific examples of the invention, but the invention is not limited to the embodiments and the examples. In the description, a numerical value range expressed using "A to B" denotes a range including numerical values before and after "to" as a minimum value and a maximum value, respectively. In the invention, the hydrogen atom that is present in a molecule of the compound used in the invention is not particularly limited in isotope species, and for example, all the hydrogen atoms in the molecule may be $^1H$, and all or a part of them may be $^2H$ (deuterium (D)).

The organic electroluminescent device of the present invention has a structure of at least an anode, a light-emitting layer and a cathode layered in that order, wherein the light-emitting layer contains a first host material, a second host material and a light-emitting material of a dopant, and both the first host material and the second host material have a lowest excited triplet energy level higher than the lowest excited triplet energy level of the light-emitting material.

The organic electroluminescent device of the present invention contains a first host material and a second host material in the light-emitting layer, and therefore can suppress performance degradation with time in driving and can realize significant prolongation of the lifetime thereof.

As described above, the organic electroluminescent device of the present invention has a structure of at least an anode, a light-emitting layer and a cathode layered in that order. Further, the organic electroluminescent device of the present invention may have at least one electron transport layer between the light-emitting layer and the cathode. In the case where the organic electroluminescent device of the present invention has at least one electron transport layer, the at least one electron transport layer preferably contains a compound containing a Group-1 atom, a Group-2 atom or a transition metal atom. With that, the lifetime of the organic electroluminescent device can be prolonged more.

Figure 1:
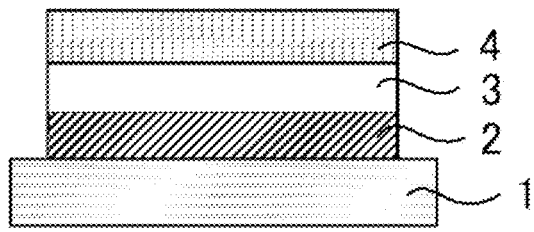
FIG. 1 This is a schematic cross-sectional view showing a layer configuration example of an organic electroluminescent device.
Figure 2:
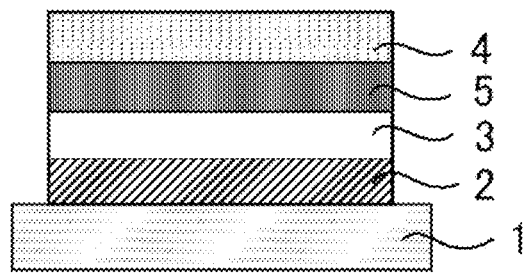
FIG. 2 This is a schematic cross-sectional view showing another layer configuration example of an organic electroluminescent device.
Figure 3:
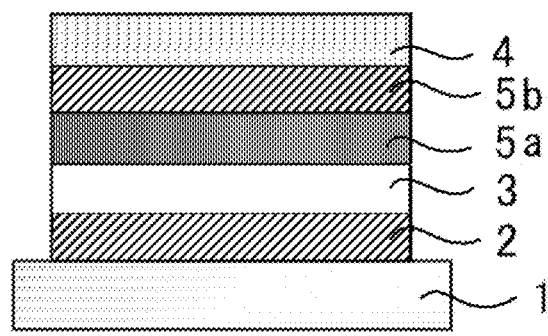
FIG. 3 This is a schematic cross-sectional view showing still another layer configuration example of an organic electroluminescent device.
Figure 4:
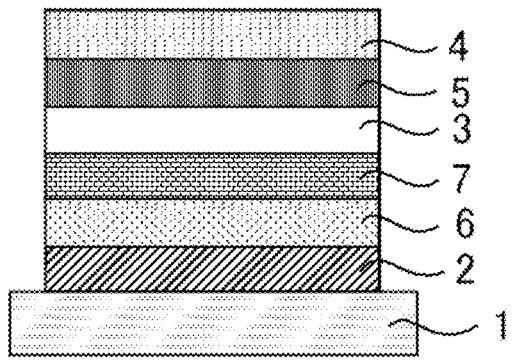
FIG. 4 This is a schematic cross-sectional view showing still another layer configuration example of an organic electroluminescent device.

The layer configuration of the organic electroluminescent device of the present invention is not specifically limited so far as the layering thereof is in the order mentioned above, and specific examples thereof include a structure of an anode 2, a light-emitting layer 3 and a cathode 4 layered in that order on a substrate 1, as shown in FIG. 1; a structure of an anode 2, a light-emitting layer 3, an electron transport layer 5 and a cathode 4 layered in that order on a substrate 1, as shown in FIG. 2; a structure of an anode 2, a light-emitting layer a first electron transport layer 5a, a second election transport layer 5b and a cathode 4 layered in that order on a substrate 1, as shown in FIG. 3. In addition to the layer configurations shown in FIGS. 1 to 3, the organic electroluminescent device may have a charge trap concentration reducing layer in the interface between the light-emitting layer 3 and the electron transport layer 5 or the first election transport layer 5a, or may have a hole injection layer or a hole transport layer between the anode 2 and the light-emitting layer 5, and may further have organic layers having any other function. The other organic layers include art electron blocking layer, a hole blocking layer, an electron injection layer, and an exciton blocking layer. The hole transport layer may be a hole injection and transport layer having a hole injection function, or the electron transport layer may be an electron injection transport layer having an electron injection function. In addition to the layer configuration shown in FIG. 3, the device has a functional layer between the first electron transport layer 5 and the second electron transport layer 5. A configuration example of an organic electroluminescent device having both a hole injection layer and a hole transport layer in the layer configuration shown in FIG. 1 is shown in FIG. 4. In FIG. 4, 1 is a substrate, 2 is an anode, 6 is a hole injection layer, 7 is a hole transport layer, 3 is a light-emitting layer, 5 is an electron transport layer, and 4 is a cathode.

In the following, the constituent members and layers of the organic electroluminescent device are described.

[Substrate]

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

[Anode]

The anode of the organic electroluminescent device used is preferably formed of as an electrode material a metal, an alloy or so electroconductive compound each having a large work function (4 eV or more), or a mixture thereof. Specific examples of the electrode material include a metal, such as Au, and an electroconductive transparent material such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 µm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred Ohm per square or less. The thickness thereof may be generally selected from a range of from 10 to 1,000 nm, and preferably from 10 to 200 nm, while depending on the material used.

[Cathode]

The cathode is preferably formed of as an electrode material a metal having a small work function (4 eV or less) (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-copper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred Ohm per square or less, and the thickness thereof may be generally selected from a range of from 10 nm to 4 µm, and preferably from 40 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

[Light-Emitting Layer]

The light-emitting layer is a layer in which holes and electrons injected from an anode and a cathode are recombined to give excitons for light emission. The light-emitting layer in the present invention contains a light-emitting material of a dopant, and a first host material and a second host material in which both the first host material and the second host material have a lowest excited triplet energy level higher than the lowest excited triplet energy level of the light-emitting material.

The light-emitting material may be a fluorescent light-emitting material or a phosphorescent light-emitting material. The light-emitting material may also be a delayed florescent material to emit delayed fluorescence along with ordinary fluorescence. Among those, when a delayed fluorescent material is used as a light-emitting material, high emission efficiency can be obtained.

The first host material and the second host material are not specifically limited so far as they are compounds having a lowest excited triplet energy level higher than the lowest excited triplet energy level of the light-emitting material. The difference between the lowest excited triplet energy level $T1_h$ of tat least one of the first hose material and the second host material and the lowest excited triplet energy level $T1_d$ the light-emitting material, $T1_h$-$T1_d$ (hereinafter referred to as "energy level difference $\Delta T1$") is preferably more than 0 eV and is preferably 1 eV or less, more preferably 0.7 eV or less, and even more preferably 0.5 eV or less.

The relationship between the lowest excited singlet energy level $S1_d$ of the light-emitting material and the lowest excited singlet energy level $S1_h$ of each of the first host material and the second host material is not specifically limited, but preferably, the first host material and the second host material each have a lowest excited singlet energy level $S1_h$ higher than the lowest excited singlet energy level $S1_2$ of the light-emitting material. Accordingly, the singlet excitons formed in the light-emitting material can be trapped in the molecule of the light-emitting material and the energy of the singlet excitons can be effectively utilized for light emission.

In this description, the lowest excited singlet energy level $S1_d$ and $S1_h$, and the lowest excited triplet energy level $T1_d$ and $T1_h$ of the light-emitting material, and the first host material and the second host material are values to be determined according to the following procedures.

(1) Lowest Excited Single Energy Level S1 ($S1_d$, $S1_h$)

The compound to be measured is vapor-deposited on a Si substrate to produce a specimen, and the specimen is measured for a fluorescent spectrum at ordinary temperature (300 K). In the fluorescent spectrum, the ordinate is the light emission and the abscissa is the wavelength. A tangent line is drawn for the downfalling part of the light emission spectrum on the short wavelength side, and the wavelength λedge (nm) of the intersection point of the tangent line and the abscissa is obtained. The wavelength value is converted to an energy value according to the following conversion expression to provide the singlet energy S1.

Conversion Expression: $S1 \text{ [eV]} = 1239.85/\lambda\text{edge}$

The light emission spectrum is measured with a nitrogen laser (MNL200, produced by Lasertechnik Berlin GmbH) as an excitation light source and Streak Camera (C4334, produced by Hamamatsu Photonics K.K.) as a detector.

(2) Lowest Excited Triplet Energy Level T1 ($T1_d$, $T1_h$)

The same specimen as used for the singlet energy S1 is cooled to 77 [K], the specimen for measuring phosphorescent light is irradiated with excitation light (337 nm), and the phosphorescence intensity is measured with a streak camera. A tangent line is drawn for the upstanding part of the phosphorescent spectrum on the short wavelength side, and Site wavelength λedge (nm) of the intersection point of the tangent line and the abscissa is obtained. The wavelength value is converted to an energy value according to the following conversion expression to provide the triplet energy T1.

Conversion Expression: $T1 \text{ [eV]} = 1239.85/\lambda\text{edge}$

The tangent line tor the upstanding part of the phosphorescent spectrum on the short wavelength side is drawn in the following manner. Over the range in the phosphorescent spectrum curve of from the short wavelength end to the maximum peak value closest to the short wavelength end among the maximum peak values of tire spectrum, a tangent line is assumed while moving within the range toward the long wavelength side. The gradient of the tangent line is increased while the curve is standing up (i.e., the value of the ordinate is increased). The tangent line that is drawn at the point where the gradient thereof becomes maximum is designated as the tangent line for the upstanding part of the phosphorescent spectrum on the short wavelength side.

A maximum peak having a peak intensity that, is 10% or less of the maximum peak point intensity of the spectrum is not included in the maximum peak values and thus is not designated as the maximum peak value closest to the short wavelength end, and the tangent line that is drawn at the point where the gradient becomes maximum that is closest to the maximum peak value closest to the short wavelength end is designated as the tangent line for the upstanding part of tire phosphorescent spectrum on the short wavelength side.

Preferably, the first host material and the second host material are organic compounds having hole transport competence and electron transport competence, capable of preventing prolongation of emission wavelength and having a high glass transition temperature. Also preferably, the first host material and the second host material differ from each other in point of the characteristics of energy level and carrier transport competence. Accordingly, the characteristics such as the emission efficiency and the lifetime of the organic electroluminescent device are easy to control.

For example, of the first host material and the second host material, preferably, at least the second host material has electron transportability. Accordingly, electrons can be smoothly moved in the light-emitting layer to prevent performance deterioration with time and to attain further prolongation of lifetime. The second host material of the type is preferably the same material as the constituent material for she electron transport layer to be mentioned below. In the case where plural electron transport layers are presided, preferably, the second host material is the same material as the constituent material of the electron transport layer nearest to the light-emitting layer (for example, the first electron transport layer).

Also preferably, the second host material significantly differs from the first host material in point of the HOMO level and the LUMO level. Accordingly, the recombination zone for electrons and holes can be controlled for enhancing characteristics such as lifetime propagation etc. The second host material of the type is, for example, preferably such that the HOMO level thereof is lower than the HOMO level of the light-emitting material and the first host material, and the LUMO level thereof is higher than the LUMO level of the light-emitting material and is lower than the LUMO level of the first host material.

For example, the following compounds are preferred for the first host material.

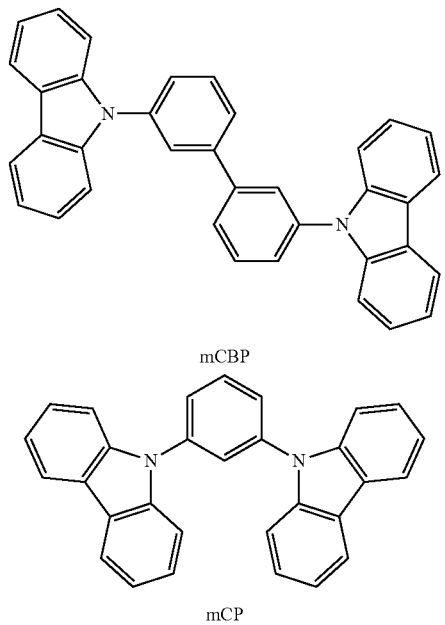

mCBP mCP

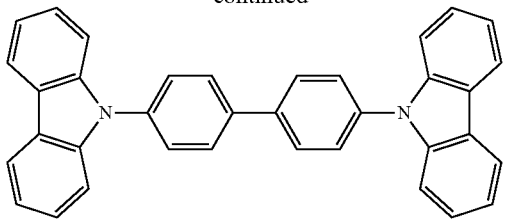

CBP

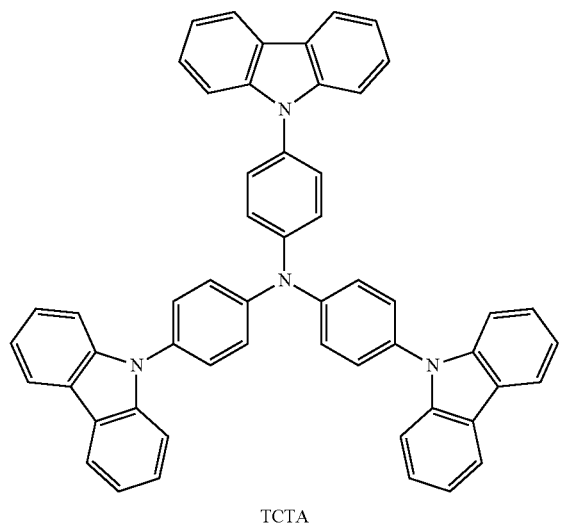

TCTA

For example, compounds represented by the following general formula (1) are preferred for the second host material.

General Formula (1)

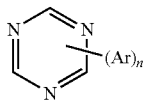

In general formula (1), Ar represents a substituted or unsubstituted aryl group, or a substituted or unsubstituted heteroaryl group, n represents and integer of 1 to 3. n is preferably 2 or more. When n is 2 or more, plural Ar's may be the same as or different from each other, but are preferably the same. For the explanation and the preferred embodiments of Ar, the explanation and the preferred embodiments of $Ar^1$, $Ar^2$ and $Ar^3$ in the following general formula (2) may be referred to. The compounds represented by the general formula (1) may have a rotationally symmetrical structure or may not have a rotationally symmetrical structure.

Compounds represented by the following general formula (2) are preferred for the second host material. The compounds represented by the general formula (2) are compounds included in the above-mentioned general formula (1).

General Formula (2)

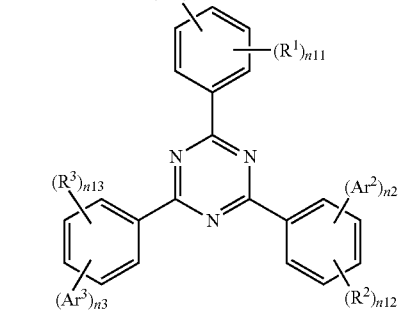

In the general formula (2), $Ar^1$, $Ar^2$ and $Ar^3$ each independently represent a substituted or unsubstituted aryl group, or a substituted or unsubstituted heteroaryl group. $Ar^1$, $Ar^2$ and $Ar^3$ may be the same as or different from each other, but are preferably the same, n1, n2 and n3 and each independently represent au integer of 1 to 5, n1, n2 and n3 each are preferably 1 to 3, more preferably 1 or 2. n1, n2 and n3 may be the same as or different from each other, but are preferably the same. When n1 is 2 or more, two or more $Ar^1$'s may be the same as or different from each other. When n2 is 2 of more, two or more $Ar^2$'s may be the same as or different from each other. When n3 is 2 or more, two or more $Ar^3$'s may be the same as or different from each other.

The aromatic ring to constitute the substituted or unsubstituted aryl group that $Ar^1$, $Ar^2$ and $Ar^3$ each may represent may be a single ring or a condensed ring of two or more aromatic rings. The number of carbon atoms to constitute the ring skeleton of the aromatic ring is preferably 6 to 22, more preferably 6 to 18, even more preferably 6 to 14, still more preferably 6 to 10. Specific examples of the aromatic ring to constitute the aryl group include a benzene ring, and a naphthalene ring. The heterocyclic aromatic ring to constitute the substituted or unsubstituted heteroaryl group that $Ar^1$, $Ar^2$ and $Ar^3$ each may represent may be a single ring or may be a condensed ring of one or more hetero rings and one or more aromatic rings, or a condensed ring of two or more hetero rings. However, the ring having the bond of $Ar^1$, $Ar^2$ and $Ar^3$ is a hetero ring. The number of atoms to constitute the ring skeleton of the hetero ring is preferably 5 to 22, more preferably 5 to 18, even more preferably 5 to 14, still more preferably 5 to 10. The number of carbon atoms to constitute the ring skeleton of the hetero ring is preferably 4 to 21, more preferably 4 to 17, even more preferably 4 to 13, still more preferably 4 to 9. The hetero atom to constitute the ring skeleton of the hetero ring is preferably a nitrogen atom, an oxygen atom and a sulfur atom, more preferably a nitrogen atom. Specific examples of the aromatic ring to constitute the heteroaryl group include a pyridine ring, a pyridazine ring, a pyrimidine ring, a triazine ring, a triazole ring, and a benzotriazole ring.

The substituent that may substitute for the aryl group to be represented by $Ar^1$, $Ar^2$ and $Ar^3$ and the substituent that may substitute for the heteroaryl group to be represented by $Ar^1$, $Ar^2$ and $Ar^3$ are not specifically limited. Examples of the substituent include a hydroxyl group, a halogen atom, a cyano group, an alkyl group having 1 to 20 carbon atoms, an alkoxy group having 1 to 20 carbon atoms, an alkylthio group having 1 to 20 carbon atoms, an alkyl-substituted amino group having 1 to 20 carbon atoms, an acyl group 1 laving 2 to 20 carbon atoms, an aryl group having 6 to 40 carbon atoms, an aryloxy group having 6 to 40 carbon atoms, an arylthio group having 6 to 40 carbon atoms, a heteroaryl group having 3 to 40 carbon atoms, a heteroaryloxy group having 3 to 40 carbon atoms, a heteroarylthio group having 3 to 40 carbon atoms, an alkenyl group having 2 to 10 carbon atoms, an alkynyl group having 2 to 10 carbon atoms, an alkoxycarbonyl group having 2 to 10 carbon atoms, an alkylsulfonyl group having 1 to 10 carbon atoms, a haloalkyl group having 1 to 10 carbon atoms, an amide group, an alkylamide group having 2 to 10 carbon atoms, a trialkylsilyl group having 3 to 20 carbon atoms, a trialkylsilylalkyl group having 4 to 20 carbon atoms, a trialkylsilylalkenyl group having 5 to 20 carbon atoms, a traiakylsilylalkynyl group having 5 to 20 carbon atoms, a nitro group, etc. Of these specific examples, those that are substitutable with any other substituent may be further substituted. More preferred substituents include a halogen atom, a cyano group, a substituted or unsubstituted alkyl group having 1 to 20 carbon atoms, an alkoxy group having 1 to 20 carbon atoms, a substituted or unsubstituted aryl group having 6 to 40 carbon atoms, a substituted or unsubstituted aryloxy group having 6 to 40 carbon atoms, a substituted or unsubstituted heteroaryl group having 3 to 40 carbon atoms, a substituted or unsubstituted heteroaryloxy group having 3 to 40 carbon atoms, and a diakyl-substituted amino group having 1 to 20 carbon atoms. Even more preferred substituents include a fluorine atom, a chlorine atom, a cyano group, a substituted or unsubstituted alkyl group having 1 to 10 carbon atoms, a substituted or unsubstituted alkoxy group having 1 to 10 carbon atoms, a substituted or unsubstituted aryl group having 6 to 15 carbon atoms, and a substituted or unsubstituted heteroaryl group having 3 to 12 carbon atoms. The number of the substituents is preferably 0 to 5, more preferably 0 to 4.

$R^1$, $R^2$ and $R^3$ in the general formula (2) each independently represent a substituent. However, the substituent is neither a substituted or unsubstituted aryl group nor a substituted or unsubstituted heteroaryl group, n11, n12 and n13 each independently represent an integer of 0 to 4, preferably an integer of 0 to 2, more preferably 0 or 1. Also preferably, at least one of n11, n12 and n13 is 0, and more preferably, all of them are 0. When n11 is 2 or more, two or more $R^1$'s may be the same as or different from each other, when n12 is 2 or more, two or more $R^2$'s may be the same as or different from each other; and when n13 is 2 or more, two or more $R^3$'s may be the same as or different from each other. $(R^1)_{n11}$, $(R^2)_{n12}$ and $(R^3)_{n13}$ may be the same as or different from each other, but are preferably the same.

For the explanation and the preferred range of the substituent represented by $R^1$, $R^2$ and $R^3$, the explanation and the preferred range of the substituent to substitute for the aryl group to be represented by $Ar^1$, $Ar^2$ and $Ar^3$ may be referred to.

The compound represented by the general formula (2) may have a rotationally symmetric, structure where the structures at the 2-position, the 4-position and the 6-position of the triazine ring are all the same, or may have a structure where the structures at only two of the 2-position, the 4-position and the 6-position are the same, or may have a structure where the structures at all the three positions differ, but preferably, the compound has a rotationally symmetric structure.

Specific examples of the compound represented by the general formula (1) include T2T and derivatives thereof.

Not limited to the compound represented by the general formula (1), the following compounds are preferably usable as the second host material. However, the second host material for use in the present invention is not limitatively interpreted by these specific examples.

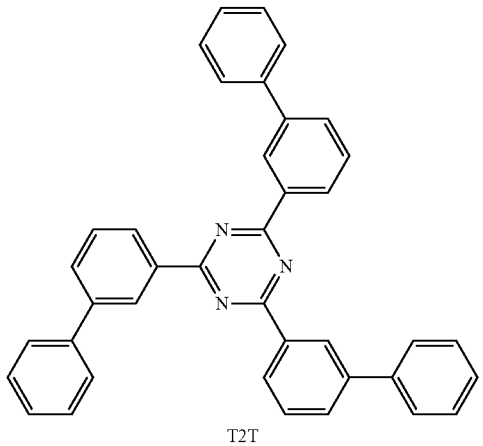

T2T

TmPyPB

TPBi

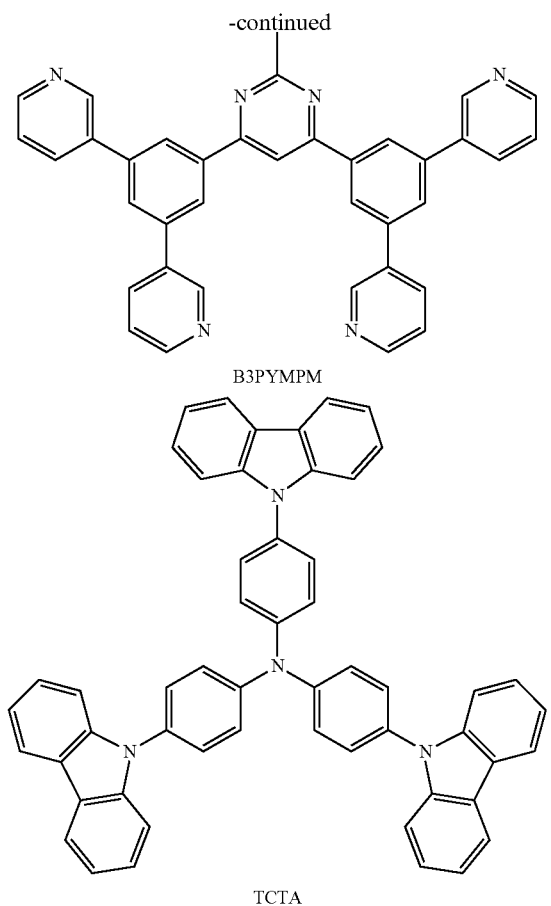

B3PYMPM

TCTA

Specific examples of the combination of a first host material and a second host material include combinations of mCBP/T2T, mCP/T2T, CBP/T2T, mCBP/TmPyPB, mCP/TmPyPB, CBP/TmPyPB, TCTA/TPBi, TCTA/B3PYMPM, mCBP/TPBi, mCP/TPBi, CBP/TPBi, mCBP/TCTA, mCP/TCTA, and CBP/TCTA.

The light-emitting layer may be composed of a light-emitting material, a that host material and a second host material, or may contain any other component. For example, the light-emitting layer may contain any other host material than the first host material and the second host material.

In the organic electroluminescent device of the present invention, emission occurs from lite light-emitting material contained in the light-emitting layer. The emission may be any of fluorescent emission, delayed fluorescein emission or phosphorescent emission, and even may be a mixture of these emission modes. In addition, a part of light emission may be partially from a host material.

The content of the light-emitting material in the light-emitting layer is preferably 0.1% by weight or more relative to the total amount of the light-emitting layer, more preferably 1% by weight or more, even more preferably 5% by weight or more. The content of the light-emitting material In the light-emitting layer is also preferably 50% by weight or less relative to the total amount, of the light-emitting layer, more preferably 20% by weight or less, even more preferably 15% by weight or less. However, in the case where a charge trap concentration reducing layer to be mentioned below is provided, the content of the light-emitting material lit the light-emitting layer is preferably 0.1% by weight or more relative to the total amount of the light-emitting layer, more preferably 1% by weight or more, even more preferably 5% by weight or more, still more preferably 10% by weight or more, and especially preferably 12% by weight or more. The content of the light-emitting material in the light-emitting layer in this case is preferably 50% by weight or less relative to the total amount of the light-emitting layer, more preferably 30% by weight or less, even more preferably 25% by weight or less, and further more preferably 20% by weight or less.

The content of the first host material in the light-emitting layer is also preferably 10% by weight or more relative to the total amount of the host materials that the light-emitting layer contains, more preferably 70% by weight or more, even more preferably 80% by weight or more. The content of the first host material in the light-emitting layer is preferably 95% by weight or less relative to the total amount of the host materials that the light-emitting layer contains, more preferably 90% by weight or less.

The content of the second host material in the light-emitting layer is preferably 5% by weight or more relative to the total amount of the host materials that the light-emitting layer contains, more preferably 10% by weight or more. Also preferably, the content of the second host material in the light-emitting layer is 90% by weight or less relative to the total amount of the host materials that the light-emitting layer contains, more preferably 70% by weight or less, even more preferably 50% by weight or less, still more preferably 30% by weight or less, and especially preferably 20% by weight or less.

As described, above, the light-emitting material in the light-emitting layer is preferably a delayed fluorescent material since it attains high emission efficiency. The reason why a delayed fluorescent material can attain high emission efficiency is because of the following principle.

In an organic electroluminescent device, carriers are injected from an anode and a cathode to a light-emitting material to form an excited state for the light-emitting material with which light is emitted. In the case of a carrier injection type organic electroluminescent device, in general, excitons that are excited to the excited singlet state are 25% of the total excitons generated, and the remaining 75% thereof are excited to the excited triplet state. Accordingly, the use of phosphorescence, which is light emission from the excited triplet state, provides a high energy utilization. However, the excited triplet state has a long lifetime and thus causes saturation of the excited state and deactivation of energy through mutual action with the excitons in the excited triplet state, and therefore the quantum yield of phosphorescence may generally be often not high. A delayed fluorescein material emits fluorescein light through the mechanism that the energy of excitons transits to the excited triplet state through intersystem crossing or the like, and then transits to the excited singlet stave through reverse intersystem crossing due to triplet-triplet annihilation or absorption of thermal energy, thereby emitting fluorescent light it is considered that among the materials, a thermal activation type delayed fluorescent material emitting light through absorption of thermal energy is particularly useful for an organic electroluminescent device. In the case where a delayed fluorescent material is used in an organic electroluminescent device, the excitons in the excited singlet state normally emit fluorescent light. On the other hand, the excitons in the excited triplet state emit fluorescent light through intersystem crossing to the excited singlet state by absorbing the heat generated by the device. At tins time, the light emitted through reverse intersystem crossing from the excited triplet state to the excited singlet state has the same wavelength as fluorescent light since it is light emission from the excited singlet state, but has a longer lifetime (light emission lifetime) than the normal fluorescent light and phosphorescent light, and thus the light is observed as fluorescent light that is delayed from the normal fluorescent light and phosphorescent light. The light may be defined as delayed fluorescent light. The use of the thermal activation type exciton transition mechanism may raise the proportion of the compound in the excited singlet state, which is generally formed in a proportion only of 25%, to 25% or more through the absorption of the thermal energy after the carrier injection. A compound that emits strong fluorescent light and delayed fluorescein light at a low temperature of lower than 100° C. undergoes the intersystem crossing from the excited triplet state to the excited singlet state sufficiently with the heat of the device, thereby emitting delayed fluorescent light, and thus the use of the compound may drastically enhance the light emission efficiency.

[Electron Transport Layer]

The electron transport layer is formed of a material having a function of transporting electrons, and the electron transport layer may be a single layer or may be formed of plural layers.

The electron transport material (often also acting as a hole blocking material) may have a function of transmitting the electrons injected from a cathode to a light-emitting layer, but is preferably one not containing a metal atom.

The electron transport layer usable here includes, for example, nitro-substituted fluorene derivatives, diphenylquinone derivatives, thiopyran dioxide derivatives, carbodiimides, fluorenylidenemethane derivatives, anthraquinodimethane and anthrone derivatives, oxadiazole derivatives, etc. Further, thiadiazole derivatives derived from the above-mentioned oxadiazole derivatives by substituting the oxygen atom in the oxadiazole ring with a sulfur atom, and quinoxaline derivatives having a quinoxaline ring known as an electron-attractive group are also usable as the electron transport material. Further, polymer materials prepared by introducing these materials into the polymer chain, or having these material in the polymer main chain are also usable.

Preferably, at least one electron transport layer contains a compound containing a Group-1 atom, a Group-2 atom or a transition metal atom. Accordingly, performance degradation of the organic electroluminescent device with time can be prevented and the lifetime thereof can be further prolonged.

The compound containing a Group-1 atom, a Group-2 atom or a transition metal atom is preferably a compound containing a Group-1 atom or a Group-2 atom, and more preferably a compound containing a lithium atom. Among the compounds containing a transition metal atom, those containing europium, ruthenium, gadolinium, terbium, dysprosium, erbium, ytterbium, rhenium, osmium, platinum or gold are preferably used. The compounds containing these atoms are preferably compounds of a combination of these atoms and air organic ligand or organic metal compounds, more preferably compounds of a combination of these atoms and an organic ligand, even more preferably 8-hydroxyquinolinolate derivatives, and above all, 8-hydroxyquinolinolate-lithium (Liq) is especially preferred.

In the case where plural electron transport layers are provided and a compound containing a Group-1 atom, a Group-2 atom or a transition metal atom is contained therein, all the electron transport layers may contain the compound, or a part of the electron transport layers may contain it. One preferred configuration, of the case where plural electron transport layers are provided is shown in FIG. 3, which exemplifies a configuration where a first electron transport layer 5a and a second electron transport layer 5b are layered in that order from the side of the light-emitting layer 3, and among these electron transport layers, the second electron transport layer 5b contains a compound containing a Group-1 atom, a Group-2 atom or a transition metal atom.

In the ease where the electron transport layer contains a compound containing a Group-1 atom, a Group-2 atom or a transition metal atom, the content of the compound containing these atoms is preferably 10% by weight or more relative to the total amount of the electron transport layer, more preferably 50% by weight or more. Also preferably, the content is 90% by weight or less relative to the total amount of the electron transport layer, more preferably 75% by weight or less.

[Charge Trap Concentration Reducing Layer]

In the present invention, a charge trap concentration reducing layer may be provided in the interface between the light-emitting layer and the electron transport layer.

In this description, the "charge trap concentration reducing layer" means a layer that reduces, owing to the formation of the layer, the peak area between 250 and 330 K in thermal stimulated current (TSC) measurement. In other words, the layer is such that, when an organic electroluminescent device having a charge trap concentration reducing layer and an organic electroluminescent device having the same configuration as that of the former organic electroluminescent device except that the latter does not have a charge trap concentration reducing layer are subjected to thermal stimulated current measurement, the peak area of a peak appearing between 250 and 320 K in the profile of the former organic electroluminescent device is smaller than that of the latter organic electroluminescent device owing to the formation of the layer. In the following description, the organic electroluminescent device having a charge trap concentration reducing layer may be referred to as "subject device", and the organic electroluminescent device having the same configuration as that of the subject device except that if does not have a charge trap concentration reducing layer may be referred to as "reference device".

For measuring the peak area, between 250 and 320 K in the TSC profile, first, the organic electroluminescent device is subjected to thermal stimulated current measurement.

Thermal stimulated current measurement is such that the charges trapped on a localized level of an organic semiconductor thin film are released by heat and are detected as a current value to provide a TSC profile (temperature profile of current value). From the temperature at the peak of the TSC profile, the depth of the localized level can be determined, and from the peak area of the peak, the charge concentration at the localized level can be estimated. Here, the charge includes both a negative charge of an electron and a positive charge of a hole.

Specifically, thermal stimulated current measurement is carried out as follows. An organic electroluminescent device of a subject for measurement is cooled in a vacuum chamber to a liquid nitrogen temperature (77 K). Next, while kept at 77 K, a bias current of 2 mA/cm$^2$ is applied to the organic electroluminescent device for 2 minutes for charge accumulation at the trap level inside the device. Subsequently, while a correcting voltage of −0.01 V is kept applied thereto, the organic electroluminescent device is heated at a rate of 5☐/min, whereupon the current detected during the process is measured to give a TSC profile. Such thermal stimulated current measurement may be carried out using a thermal stimulated current indicator (product name TSC-FETT EL2000) manufactured by Rigaku Corporation.

In the resultant TSC profile, the peak area of the peak appearing between 250 and 320 K is measured. Here, the number of the peak appearing between 250 and 320 K may be one or more. In the case where plural peaks appear between 250 and 320 K, the sum total of the peak areas of tire peaks corresponds to the "peak area between 250 and 320 K".

Figure 5:
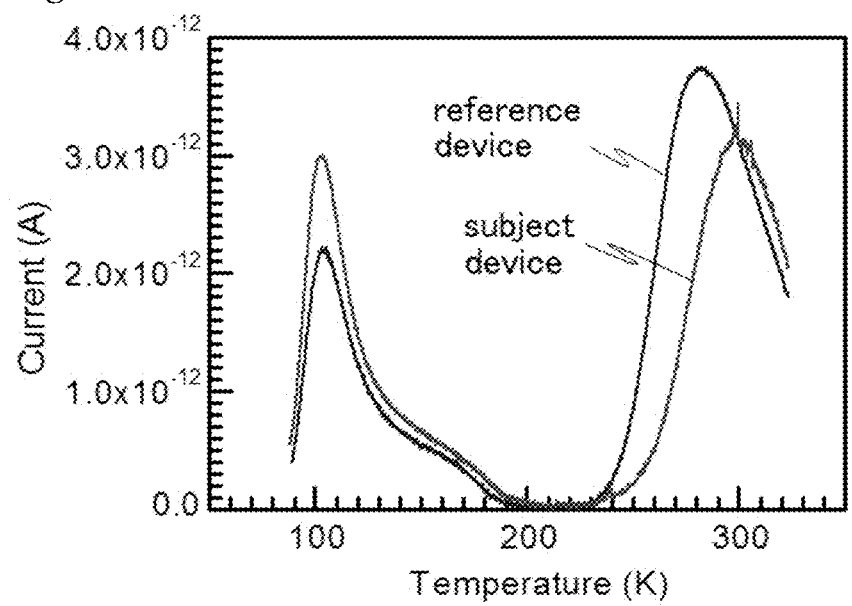
FIG. 5 This is a characteristic graph showing an example of a TSC profile measured with an organic electroluminescent device.

Some typical examples oi a TSC profile measured with an organic electroluminescent device are shown in FIG. 5. In FIG. 5, "subject device" is an organic electroluminescent device having a Liq layer formed as the charge trap concentration reducing layer, and "reference device" is an organic electroluminescent device produced in the same manner as that for the subject device except that a charge nan concentration reducing layer was not formed therein.

As shown in FIG. 5, the TSC profiles of the subject device and the reference device each have one peak in low-temperature region at around 105 K. and in a high-temperature region at 250 to 320 K. Among these, the peak in the low-temperature region corresponds to release of charges accumulated in a shallow trap level while the peak in the high-temperature region corresponds to release of charges accumulated in a deep trap level. The peak area of each peak reflects the concentration of the charges accumulated in each trap level. Here, the peaks in a high-temperature range in the two devices are compared with each other. The peak strength in the high-temperature region of the subject device noticeably reduced as compared with that of the reference device, and the peak area of the former is 1/1.41 of the peak area of the reference device. This means that, owing to the charge trap concentration reducing layer therein, the charge concentration at the deep trap level in the subject device reduced.

The "charge trap concentration reducing layer" in the this description is a material layer provided in the interface between a light-emitting layer and an electron transport layer, and the peak area in the high-temperature region (250 to 320 K) of the thus-determined TSC profile of the subject device is smaller than that of the reference device. The charge trap concentration reducing layer of the type is considered to be able to effectively suppress formation of a deep trap level inside the device and suppress accumulation of charges in a deep trap level in driving an organic electroluminescent device. Consequently, the organic electroluminescent device of the type can suppress EL performance deterioration with time and can attain noticeable prolongation of lifetime.

The peak area in a high-temperature region of the organic electroluminescent device having the charge trap concentration reducing layer preferably less than $S_0$, where $S_0$ means the peak area of a high-temperature region of a reference device not having a charge trap concentration reducing layer, and is more preferably $0.71 \times S_0$ or less, evert more preferably $0.30 \times S_0$, or less, still more preferably $0.10 \times S_0$ or less, and is ideally zero. The charge trap concentration reducing layer of the type can effectively reduce the charge concentration in a deep trap level, and can noticeably prolong the lifetime of the organic electroluminescent device having the layer.

The material of the charge trap concentration reducing layer is not specifically limited so far as a layer formed of the material can reduce the peak area between 250 and 320 K in TSC measurement, but is preferably one containing a Group-1 atom, a Group-2 atom or a transition metal atom, more preferably one containing a Group-1 atom or a Group-2 atom, even more preferably one containing a lithium atom. Among the material containing a transition metal atom, those containing europium, ruthenium, gadolinium, terbium, dysprosium, erbium, ytterbium, rhenium, osmium, platinum or gold are preferably used.

These atoms may be contained in the charge trap concentration reducing layer as elemental substances or may be contained in the charge trap concentration reducing layer as compounds containing these atoms, but are preferably contained in the charge trap concentration reducing layer as compounds containing these atoms. The compounds containing these atoms are preferably compounds of a combination of these atoms and an organic ligand or organic metal compounds, more preferably compounds of a combination of these stores and an organic ligand, even more preferably 8-hydroxyquinolinolate derivatives, and above all 8-hydroxyquinolinolate-lithium (Liq) is especially preferred. Exciton-polaron annihilation is known to cause formation of a deep trap level inside a device; however, since Liq has a low excited triplet energy level, it is presumed that the excited triplet energy of excitons can readily move to Liq to suppress exciton-polaron annihilation. Accordingly, the charge trap concentration reducing layer formed of Liq can effectively reduce the amount of charges in a deep trap level. In the case where the above-mentioned at least one electron transport layer contains a compound containing a Group-1 atom, a Group-2 atom or a transition metal atom, the compound may be tire same as or different from the compound containing a Group-1 atom, a Group-2 atom or a transition metal atom that constitute the charge trap concentration reducing layer, but is preferably the same as the latter.

The charge trap concentration reducing layer may contain a compound not containing a Group-1 atom, a Group-2 atom and a transition metal atom so far as the layer is termed of a material capable of reducing, owing to formation of the layer, the peak area between 250 and 320 K in TSC measurement. However, the content of the compound containing a Group-1 atom, a Group-2 atom or a transition metal atom in the charge trap concentration reducing layer is preferably 80% by mass or more of the total mass of the charge trap concentration reducing layer, more preferably 90% by mass or more, even more preferably 95% by mass or more, and may be 100% by mass. In particular, when a compound containing a combination of these atoms and an organic ligand is contained in the charge trap concentration reducing layer to have the above-mentioned content therein, performance degradation with time in driving can be noticeably suppressed.

The mean thickness of the charge trap concentration reducing layer is not specifically limited, but is preferably 0.1 to 100 nm, more preferably 0.5 to, 10 nm even more preferably 1 to 3 nm.

[Functional Layer]

In the present invention, a functional layer formed of a material containing a Group-1 atom, a Group-2 atom or a transition metal atom may be provided between the first electron transport layer and the second electron transport layer. Accordingly, the organic electroluminescent device of the type can more effectively prevent performance degradation with time and the lifetime thereof can be thereby more prolonged.

For the description and the preferred range of the material containing a Group-1 atom, a Group-2 atom or a transition metal atom for use in the functional layer, and the preferred range of the content ratio of the materials and the mean thickness of the functional layer, the corresponding description of the charge trap concentration reducing layer mentioned above may be referred to.

[Injection Layer]

The injection layer is a layer that is provided between the electrode and the organic layer, for decreasing the driving voltage and enhancing the light emission luminance, and includes a hole injection layer and an electron injection layer, which may be provided between the anode and the light-emitting layer or the hole transport layer and between the cathode and the electron transport layer. The injection layer may be provided depending on necessity.

[Blocking Layer]

The blocking layer is a layer that is capable of inhibiting charges (electrons or holes) and/or excitons present in the light-emitting layer from being diffused outside the light-emitting layer. The electron blocking layer may be disposed between the light-emitting layer and the hole transport layer, and inhibits electrons from passing through the light-emitting layer toward the hole transport layer. Similarly, the hole blocking layer may be disposed between the light-emitting layer and the electron transport layer, and inhibits holes front passing through the light-emitting layer toward the electron transport layer. In the present invention, the charge trap concentration reducing layer disposed between the light-emitting layer and the electron transport layer may be made to additionally have a function of the hole blocking layer. For example, experiments have confirmed that the charge trap concentration reducing layer formed of Liq can have a function as a hole blocking layer. The blocking layer may also be used for inhibiting excitons from being diffused outside the light-emitting layer. Thus, the electron blocking layer and the hole blocking layer each may also have a function as an exciton blocking layer. The term "the electron blocking layer" or "the exciton blocking layer" referred to herein is intended to include a layer that has both the functions of an electron blocking layer and an exciton blocking layer by one layer.

[Hole Blocking Layer]

The hole blocking layer has the function of an electron transport layer in a broad sense. The hole blocking layer has a function of inhibiting holes from reaching the electron transport layer while transporting electrons, and thereby enhances the recombination probability of electrons and holes in the light-emitting layer. As described above, in the present invention, the charge trap concentration reducing layer may be made to additionally have the function of the bole blocking layer.

[Electron Blocking layer]

The electron blocking layer has the function of transporting holes in a broad sense. The electron blocking layer has a function of inhibiting electrons front reaching the hole transport layer while transporting holes, and thereby enhances the recombination probability of electrons and holes in the light-emitting layer.

[Exciton Blocking Layer]

The exciton blocking layer is a layer for inhibiting excitons generated through recombination of holes and electrons in the light-emitting layer from being diffused to the charge transporting layer, and the use of the layer inserted enables effective confinement of excitons in the light-emitting layer, and thereby enhances the light emission efficiency of the device. The exciton blocking layer may be inserted adjacent to the light-emitting layer on any of the side of the anode and the side of the cathode, and on both the sides. Specifically, in the case where the exciton blocking layer is present on the side of the anode, the layer may be inserted between the hole transport layer and the light-emitting layer and adjacent to the light-emitting layer, and in the case where the layer is inserted on the side of the cathode, the layer may be inserted between the light-emitting layer and the cathode and adjacent to the light-emitting layer. Between the anode and the exciton blocking layer that is adjacent to the light-emitting layer on the side of anode, a hole injection layer, an electron blocking layer and the like may be provided, and between the cathode and the exciton blocking layer that is adjacent to the light-emitting layer on the side of the cathode, an electron injection layer, an electron transport layer, a hole blocking layer and the like may be provided. In the case where the blocking layer is provided, the material used for the blocking layer preferably has excited singlet energy and excited triplet energy, at least one of which is higher than the excited singlet energy and the excited triplet energy of the light-emitting layer, respectively. In the present invention, preferably, the charge trap concentration reducing layer is also made to additionally have the function of the exciton blocking layer.

[Hole Transport Layer]

The hole transport layer is formed of a hole transport material having a function of transporting holes, and the hole transport layer may be provided as a single layer or plural layers.

The hole transport material has one of injection or transporting property of holes and blocking property of electrons, and may be any of an organic material and an inorganic material. Examples of known hole transport materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazine derivative, a stilbene derivative, a silazane derivative, an aniline copolymer and aa electroconductive polymer oligomer, particularly a thiophene oligomer. Among these, a porphyrin compound, an aromatic tertiary amine compound and a styrylamine compound are preferably used, and an aromatic tertiary amine compound is more preferably used.

The organic electroluminescent device of the present invention may be produced, for example, by sequentially layering the above-mentioned layers in accordance with the layering position thereof. The method for forming each layer is not specifically limited, and may be formed in any of a dry process or a wet process.

Preferred materials for use for the organic electroluminescent device are concretely exemplified below. However, the materials for use in the present invention are not limitatively interpreted by the following exemplary compounds. Compounds, even though, exemplified as materials having a specific function, can also be used as other materials having any other function, R, R', $R_1$ to $R_{10}$ in the structural formulae of the following exemplary compounds each independently represent a hydrogen atom or a substituent. X represent a carbon atom or a hetero atom to form the ring skeleton, n represents an integer of 3 to 5, Y represents a substituent, and m represents an Integer of 0 or more.

The light-emitting material for use in the light-emitting layer may be a light-emitting material that emits fluorescent light, or may be a light-emitting material that emits phosphorescent light. The fluorescent light-emitting material may be a light-emitting material that emits delayed fluorescent light, or may be a light-emitting material that does not emit delayed fluorescent light. Preferred compounds for use as the light-emitting material for the light-emitting layer are mentioned below.

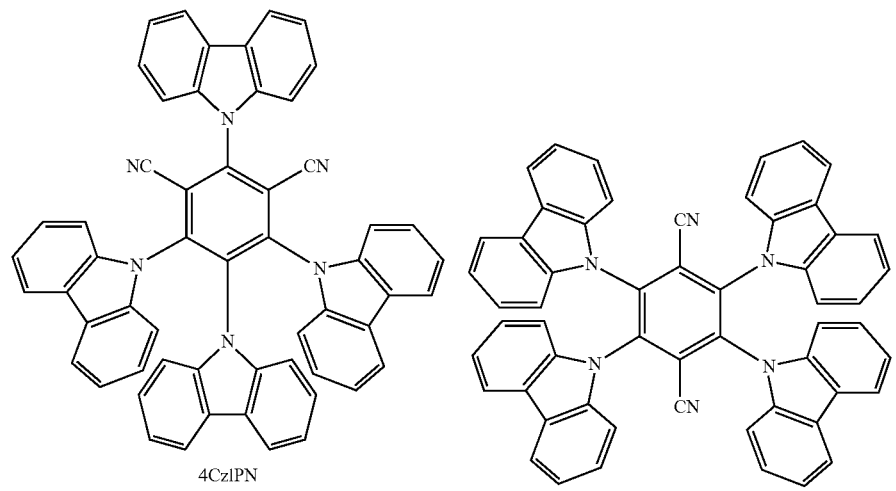
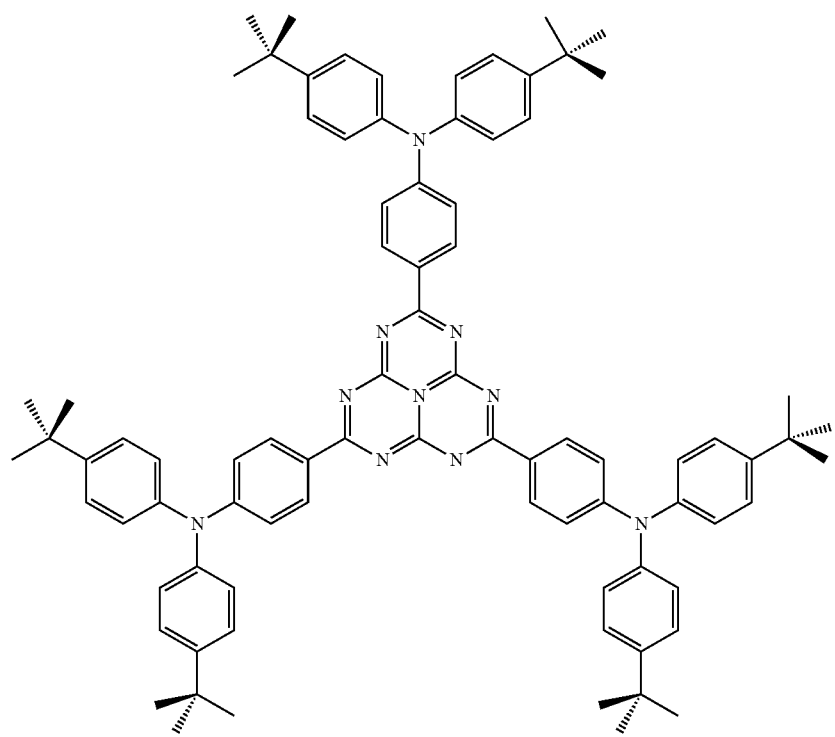

-continued
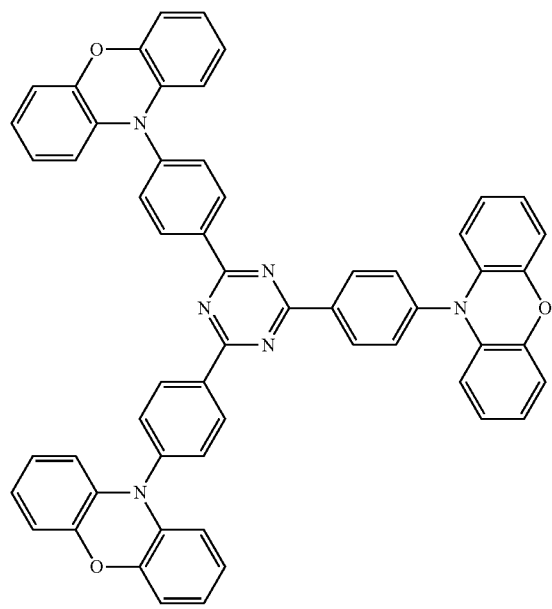
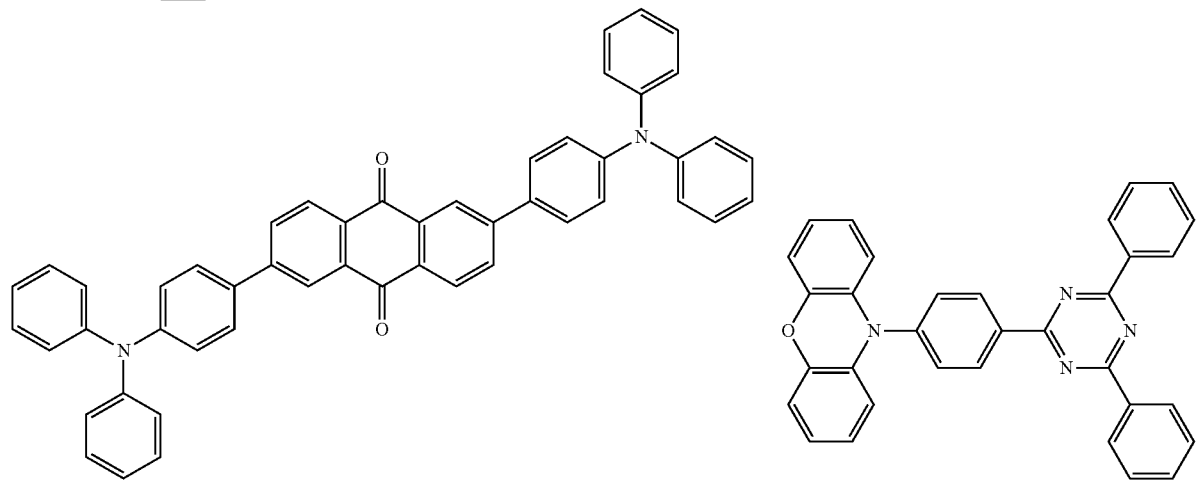
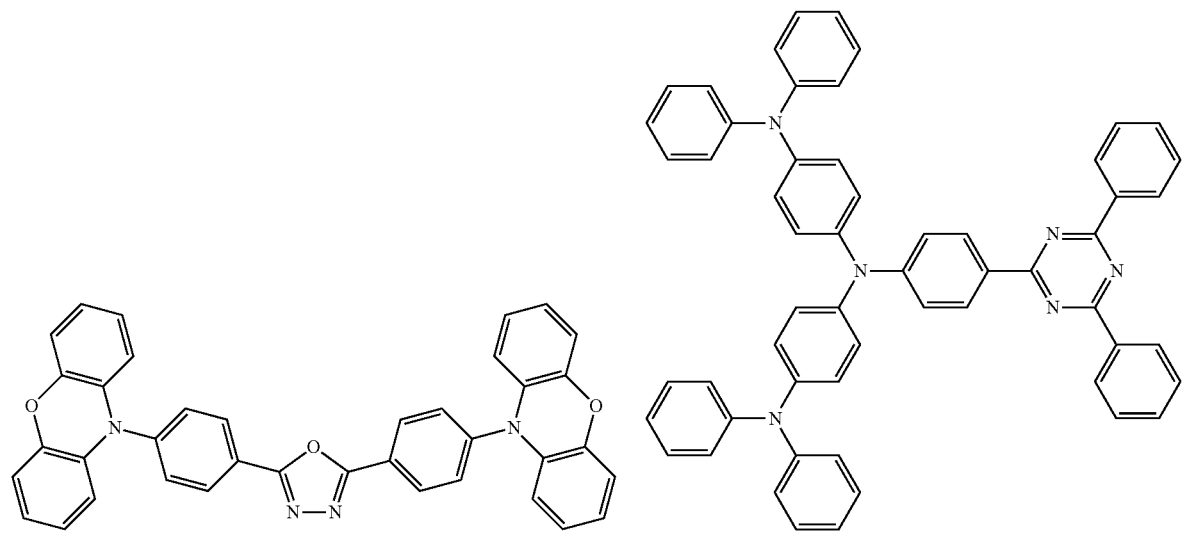

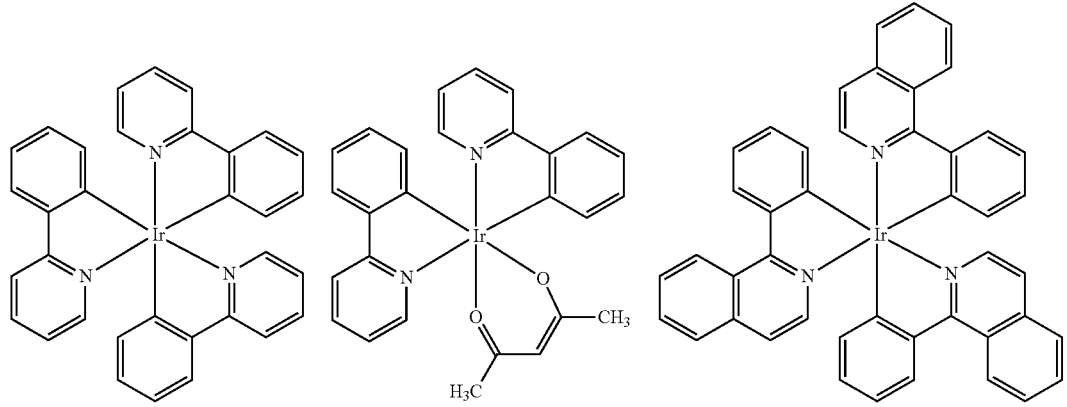

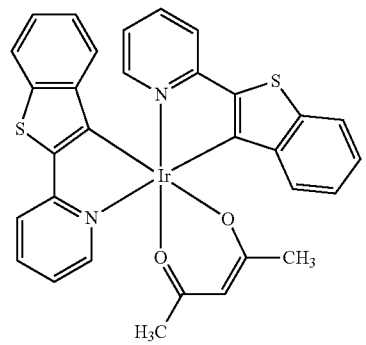

As the light-emitting material that emits delayed fluorescent light (delayed fluorescent material), compounds included in the general formulae described in WO2013/154064, paragraphs 0008 to 0048 and 0095 to 0133, WO2013/011954, paragraphs 0007 to 0047 and 0073 to 0085, WO2013/011955, paragraphs 0007 to 0033 and 0059 to 0066, WO2013/081088, paragraphs 0008 to 0071 and 0118 to 0133, JP-2013-250490A, paragraphs 0009 to 0046 and 0093 to 0134, JP-2013-116975A, paragraphs 0008 to 0020 and 0038 to 0040, WO2013/133359, paragraphs 0007 to 0032 and 0079 to 0084, WO2013/161437, paragraphs 0008 to 0054 and 0101 to 0121, JP-2014-9352A, paragraphs 0007 to 0041 and 0060 to 0069, JP-2014-9224A, paragraphs 0008 to 0048 and 0067 to 0076, especially the exemplary compounds therein are preferably mentioned. These patent publications are referred to herein as a part of the present description.

In addition, as the light-emitting material that emits delayed fluorescent light (delayed fluorescent material), compounds included m the general formulae described in JP-2013-253121A, WO2013/133359, WO2014/034535, WO2014/115743, WO2014/122895, WO2014/126200, WO2014/136758, WO2014/133121, WO2014/136860, WO2014/196585, WO2014/189122, WO2014/168101, WO2015/008580, WO2014/203840, WO2015/002213 WO2015/016200, WO2015/019725, WO2015/072470, WO2015/108049, WO2015/080182, WO2015/072537, WO2015/080183, JP-2015-129240A, WO2015/129714, WO2015/129715, WO2015/133501, WO2015/136880, WO2015/137244, WO2015/137202, WO2015/137136, WO2015/146541 and WO2015/159541, especially the exemplary compounds therein are preferably mentioned. These patent publications are also referred to herein as a part of the present description.

Next, preferred compounds for use as the host material to the light-emitting layer are mentioned below.

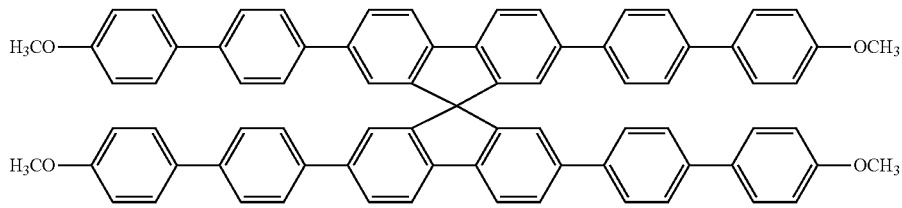

-continued
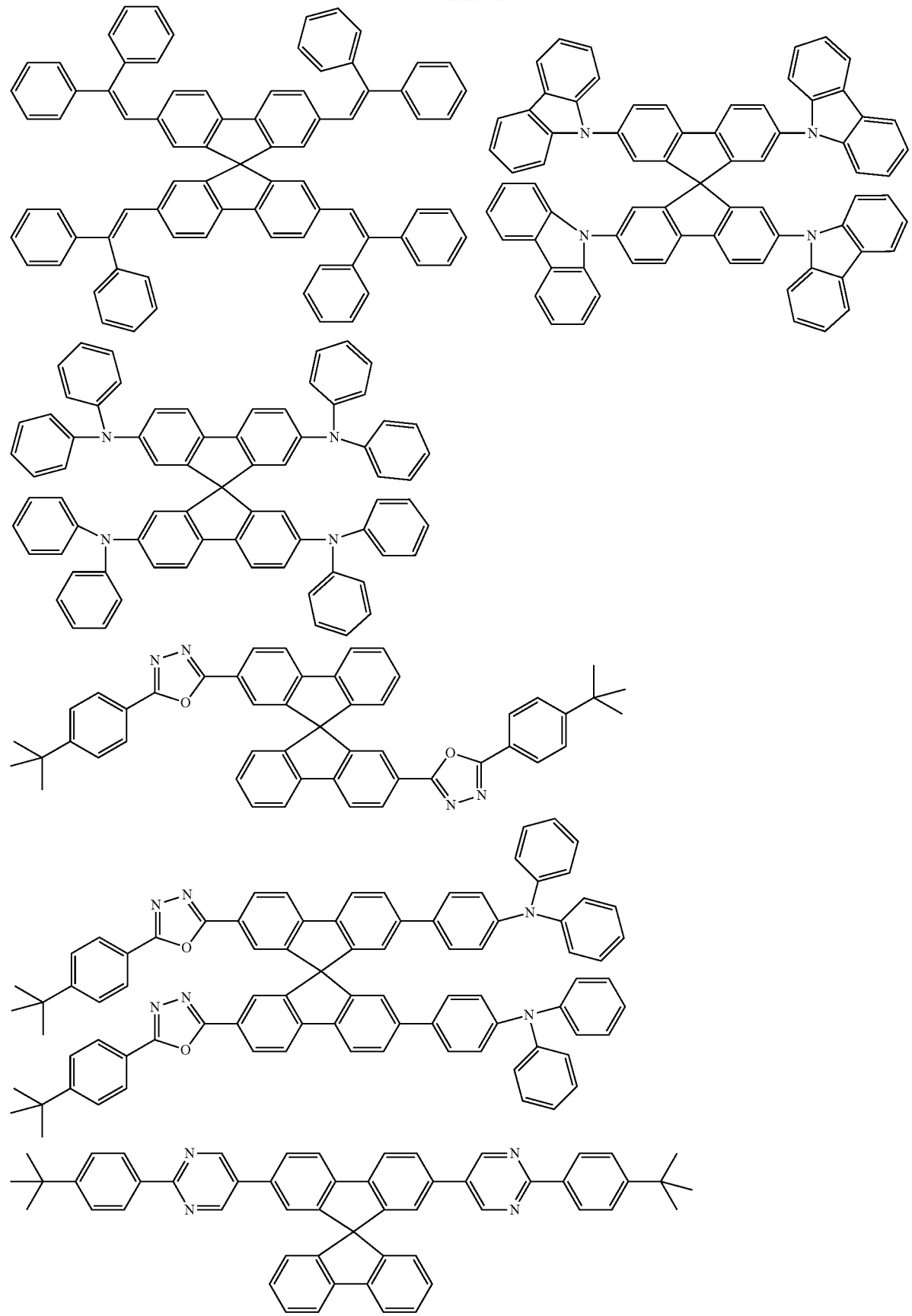

-continued
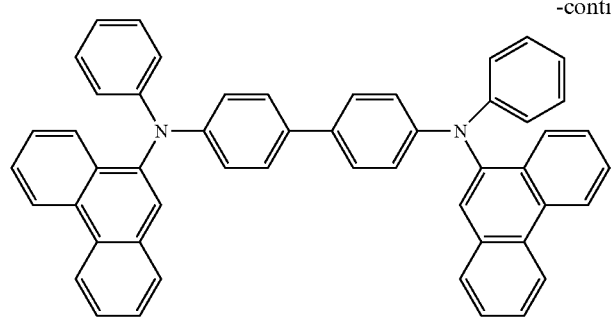
31
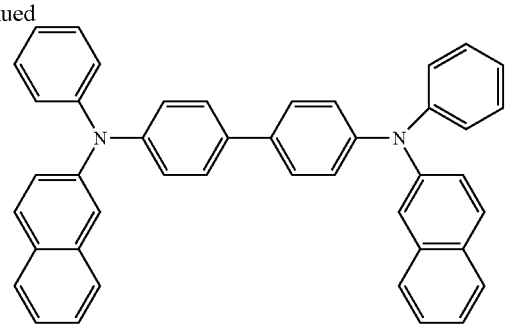
32
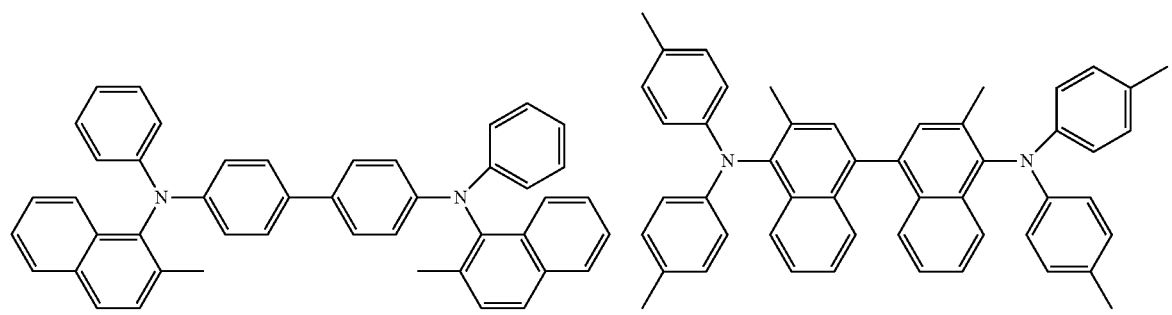
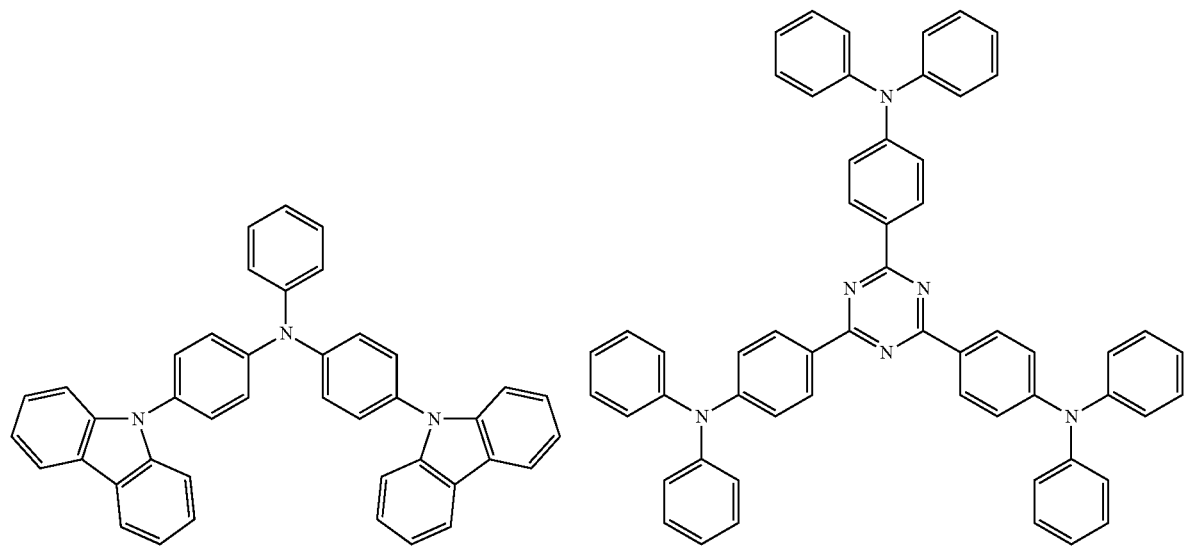

-continued
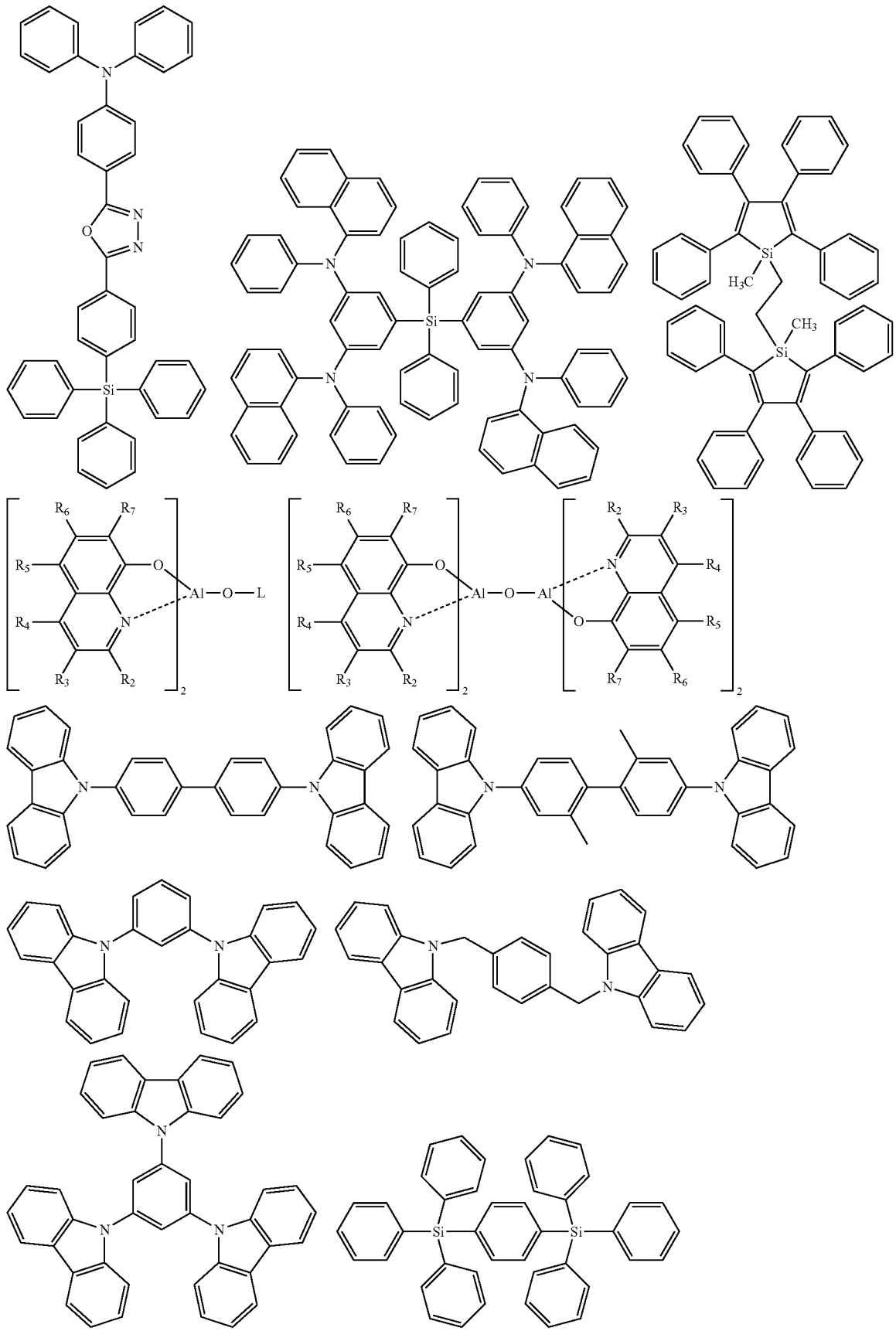

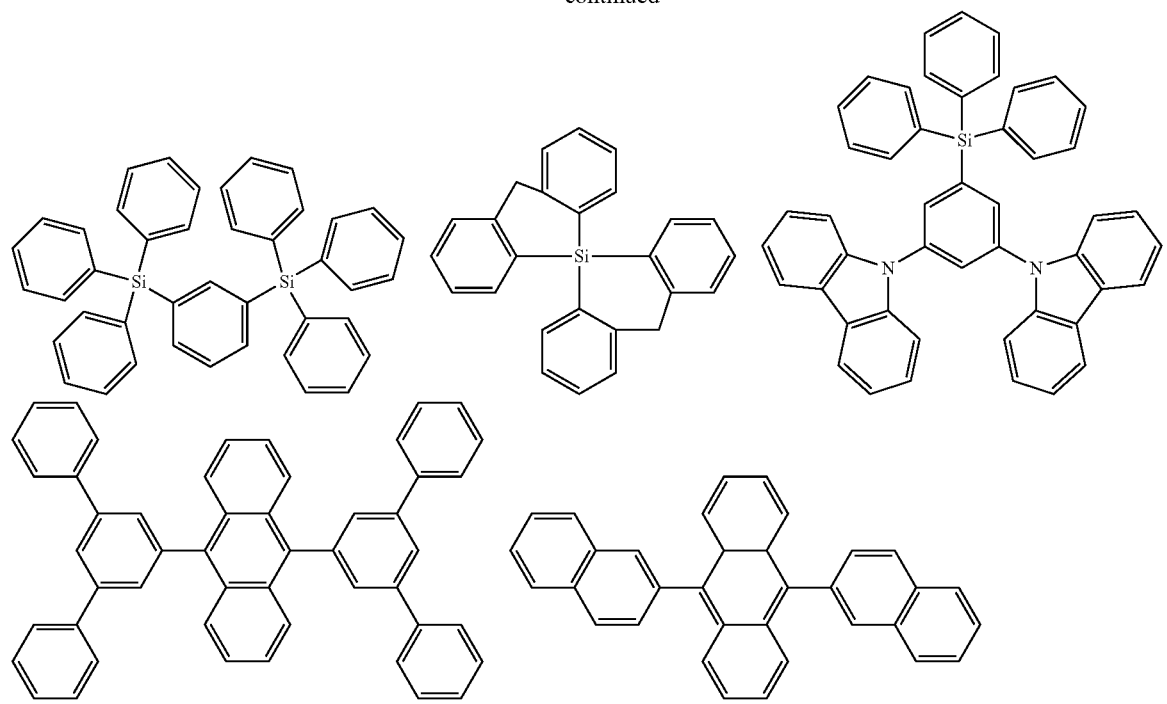
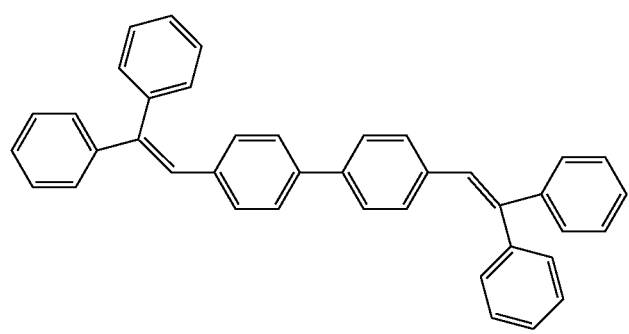
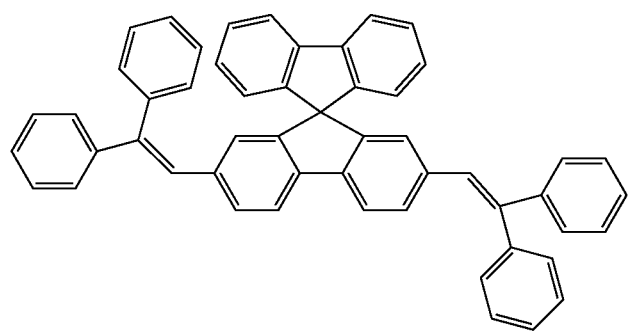

-continued
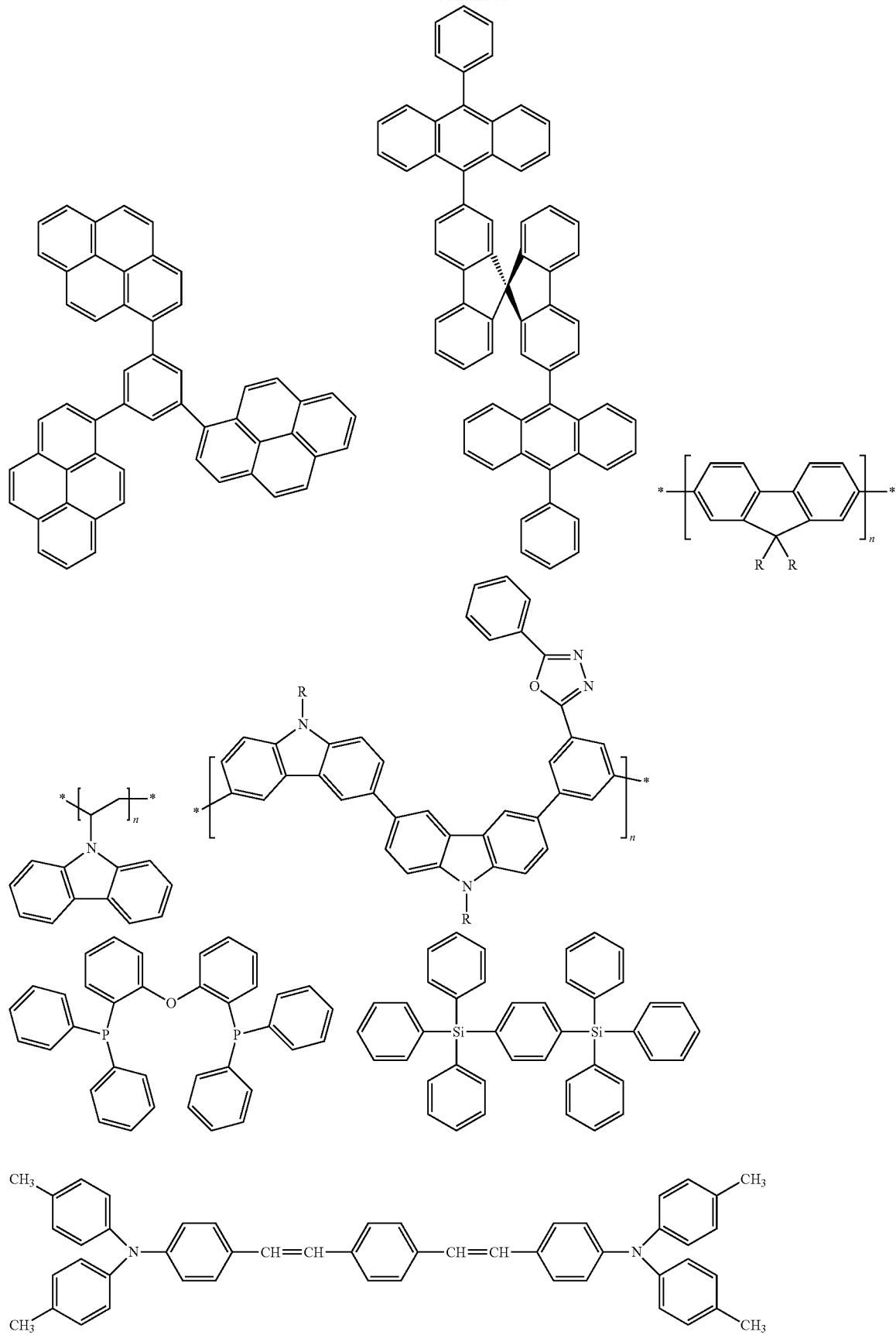

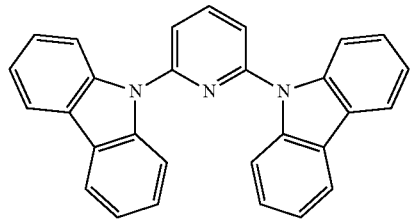 [SMILES: c1cc(-n2c3ccccc3c3ccccc32)nc(-n2c3ccccc3c3ccccc32)c1]
-continued
Next, preferred compound examples for use as the hole injection material are mentioned below.
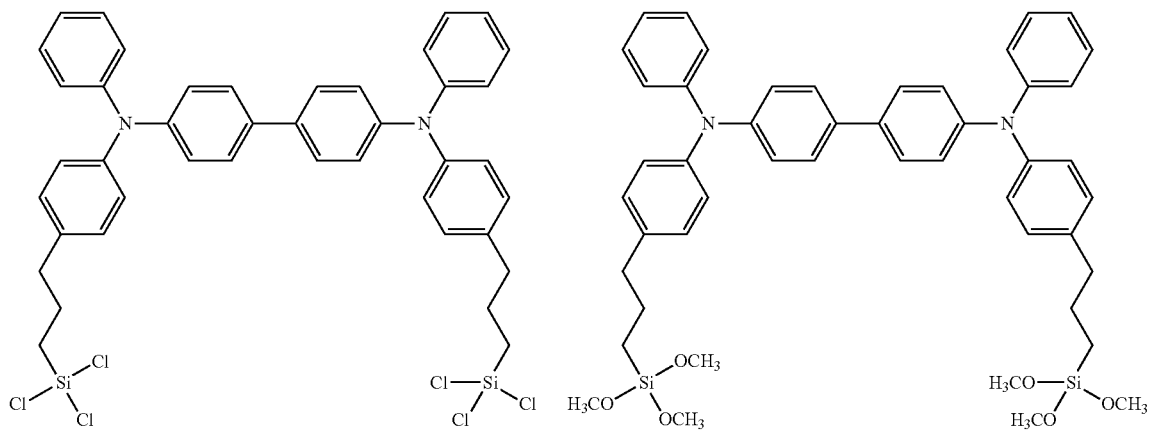
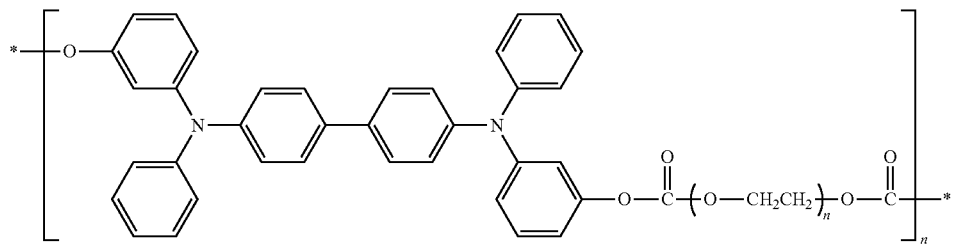
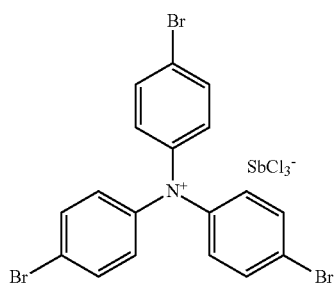

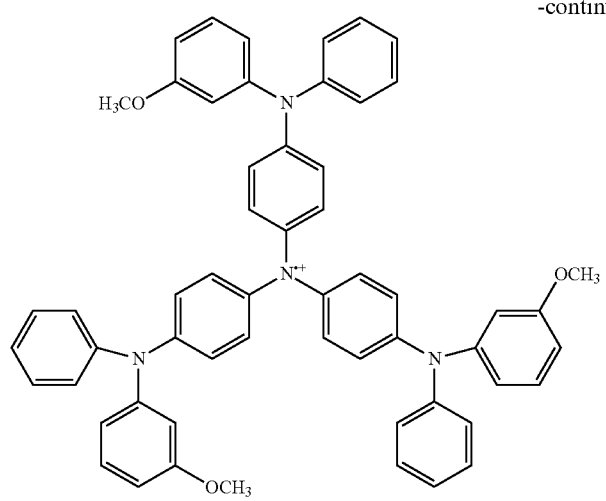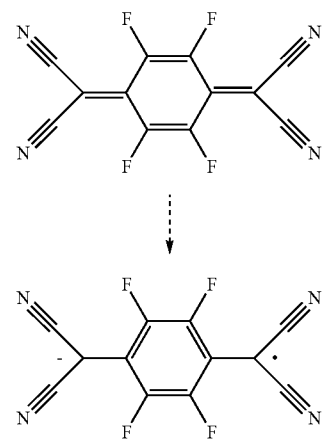
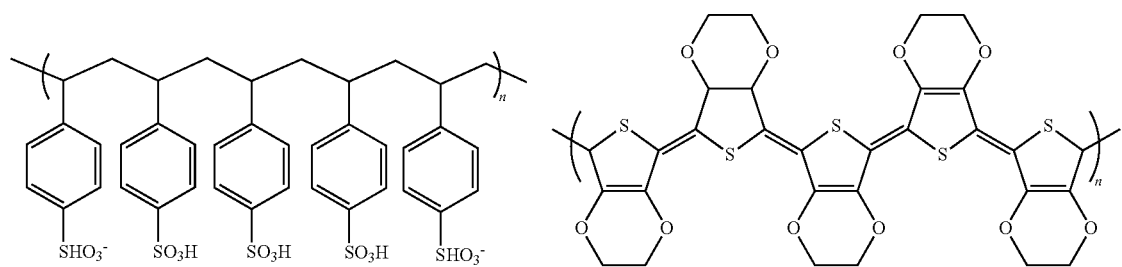
Next, preferred compound examples for use as the hole transport material are mentioned below.
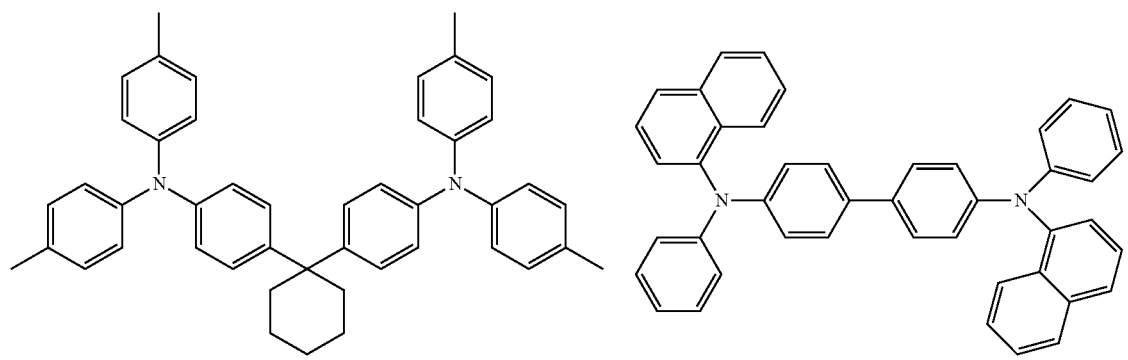

-continued
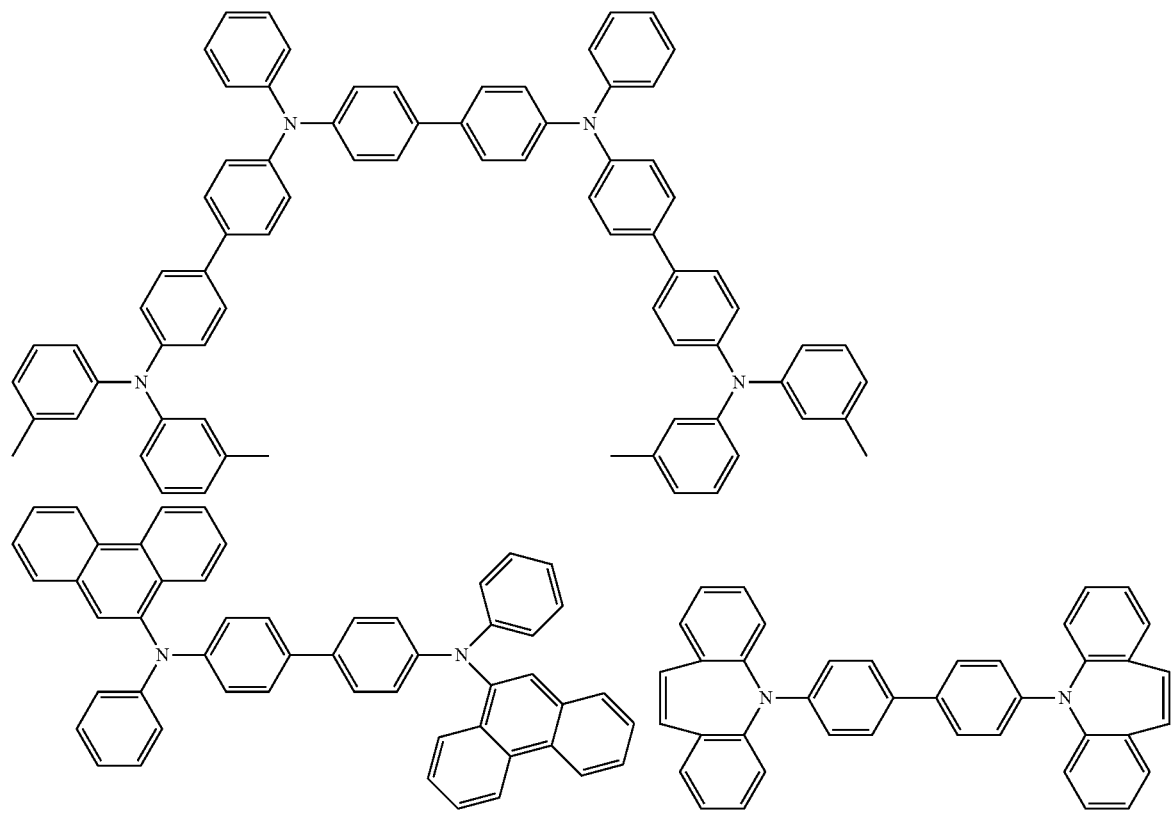
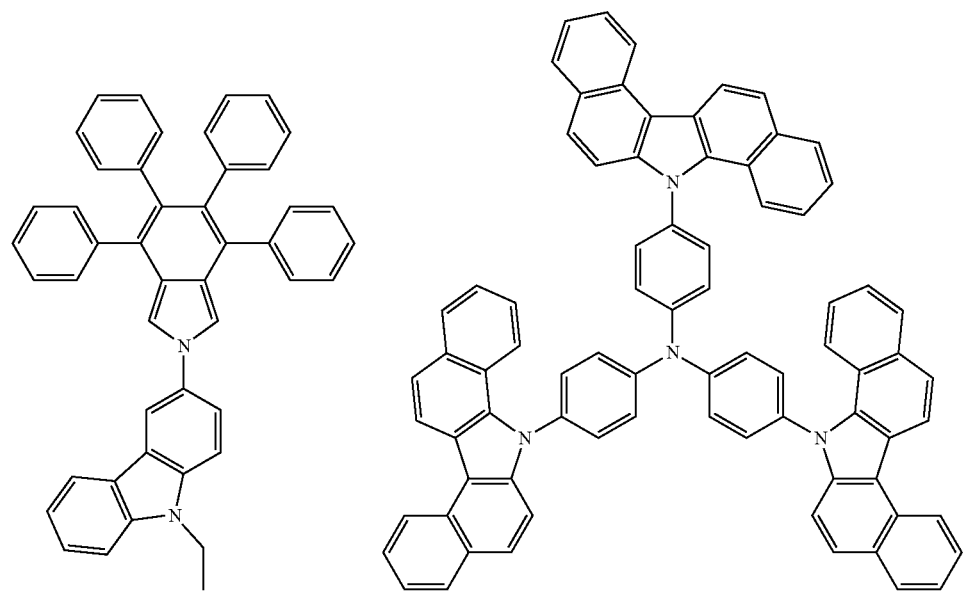

-continued
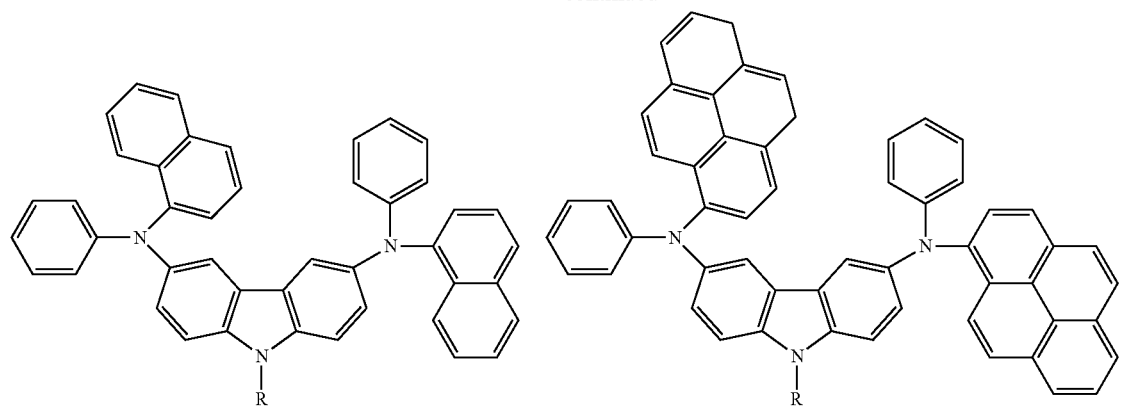
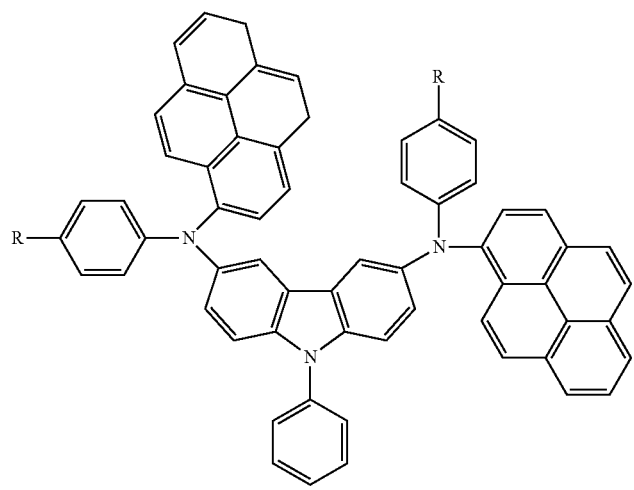
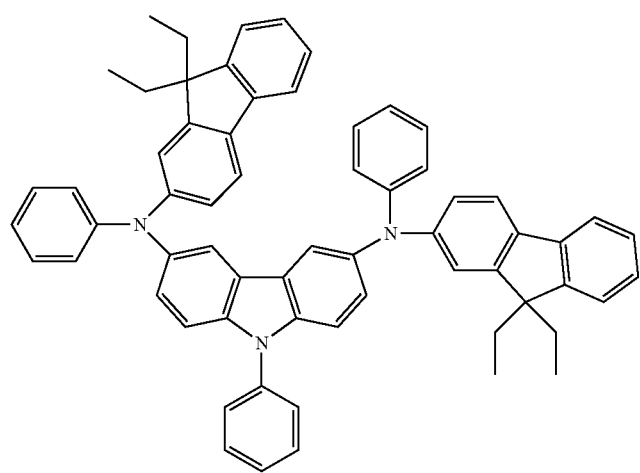

-continued
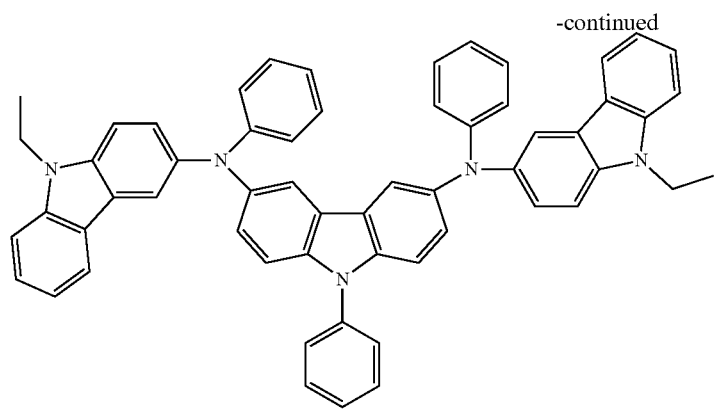
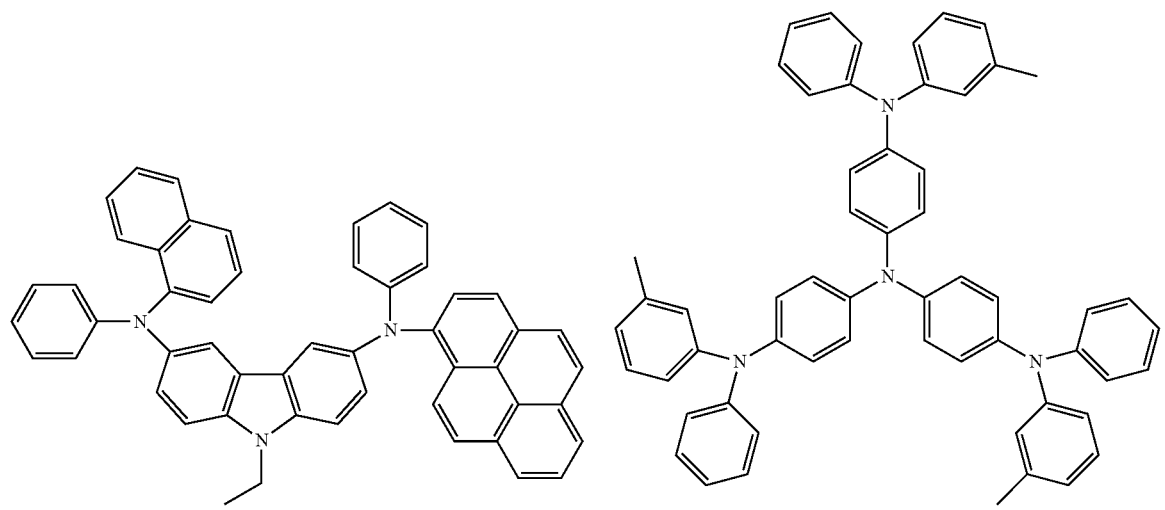
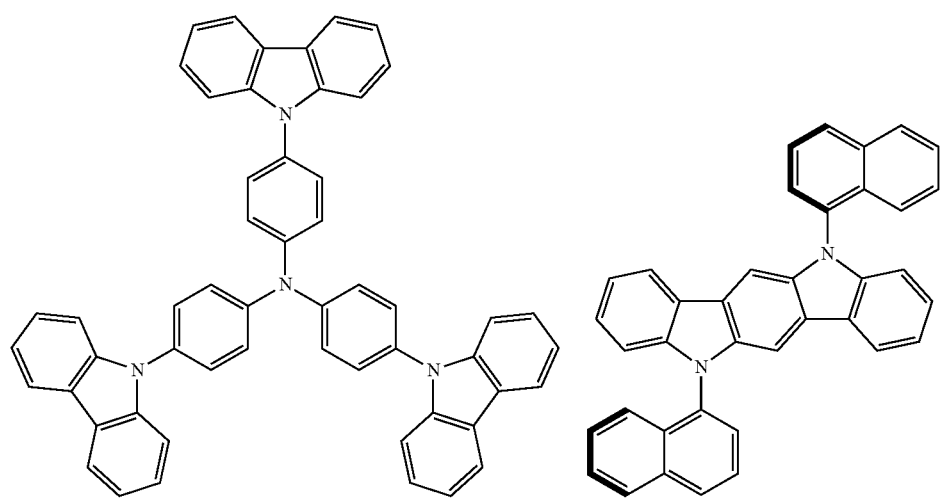

-continued
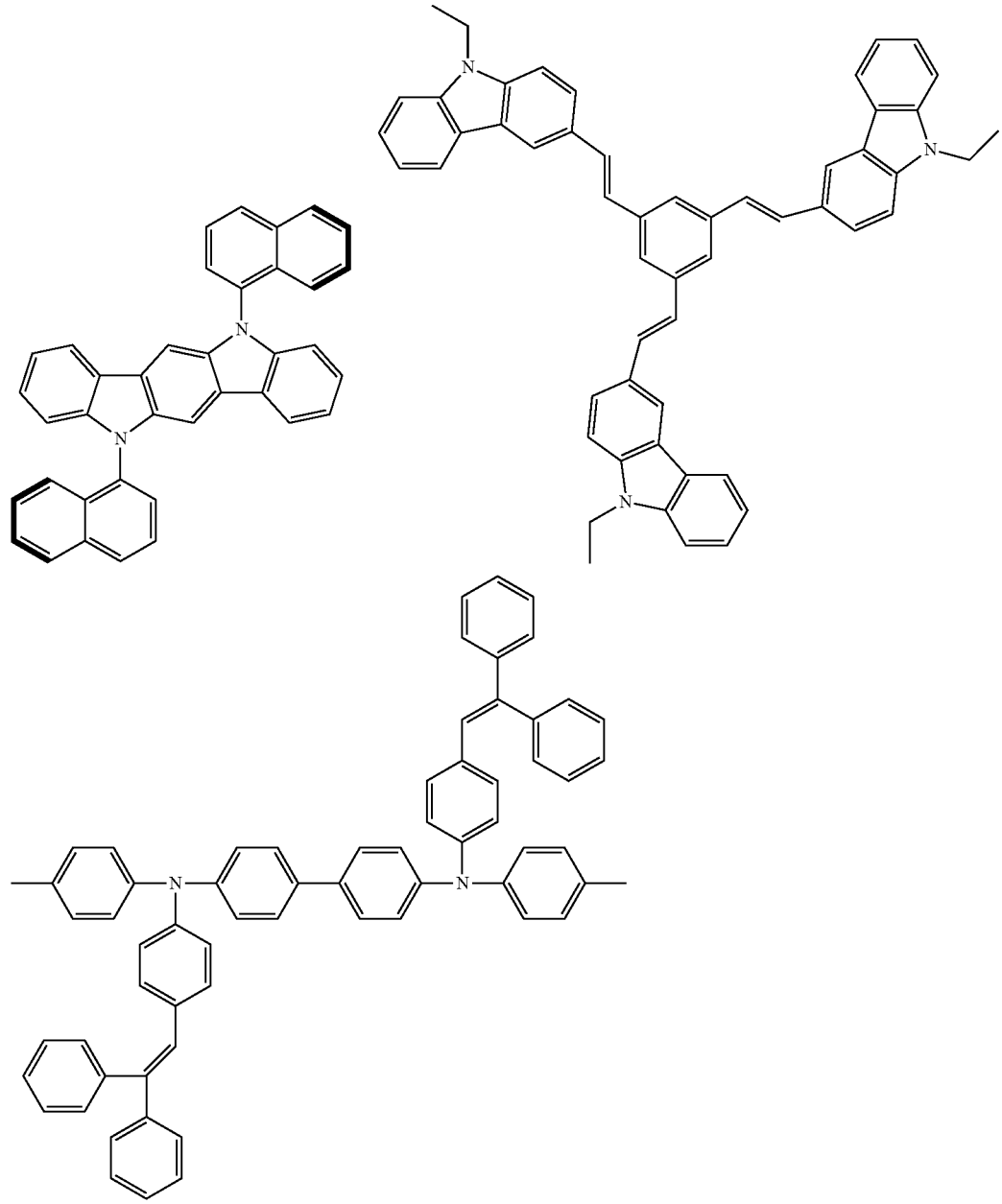
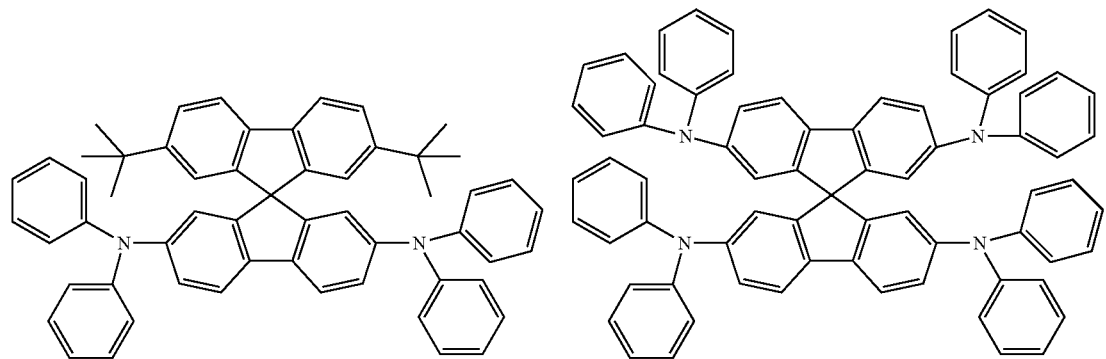

-continued
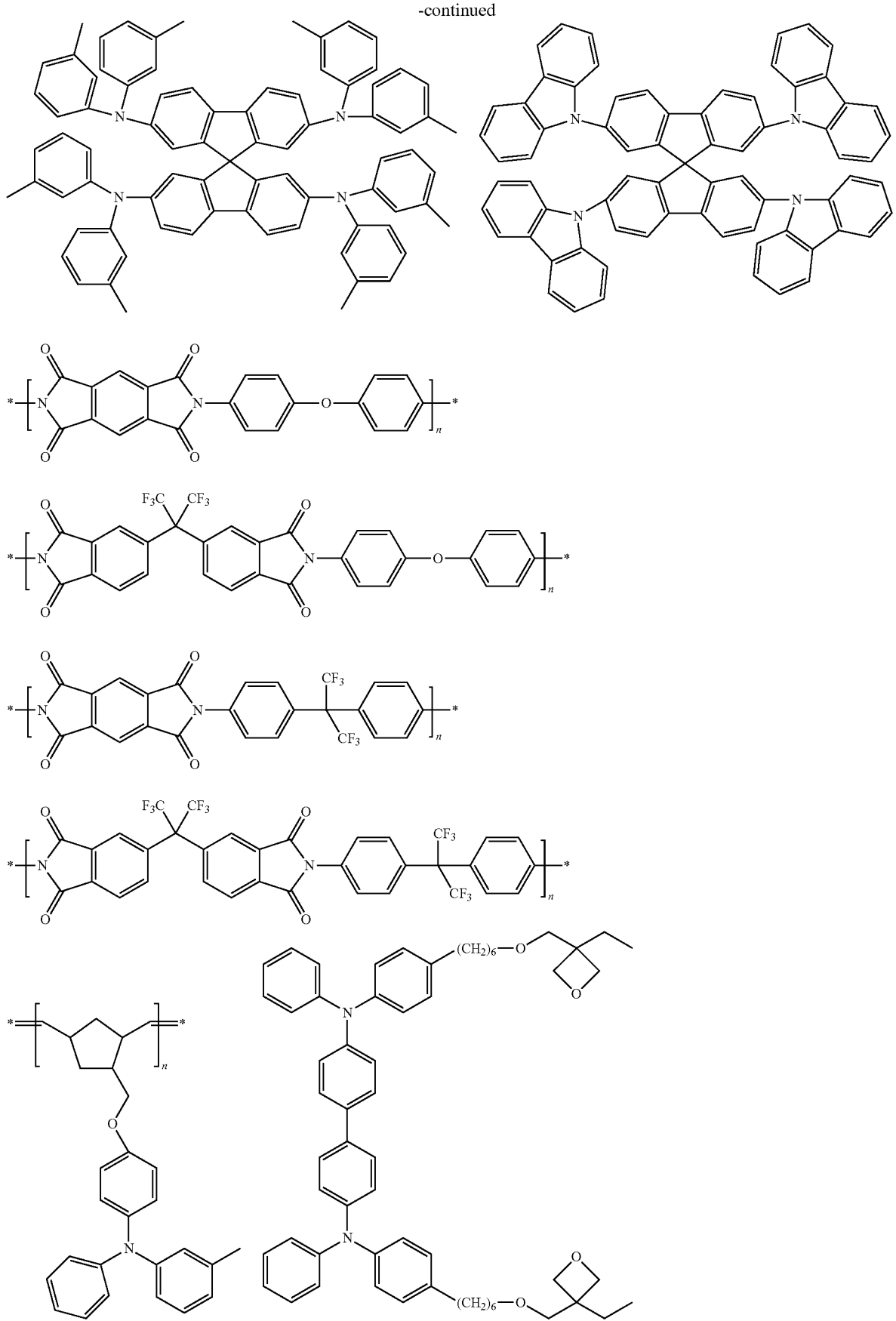

-continued
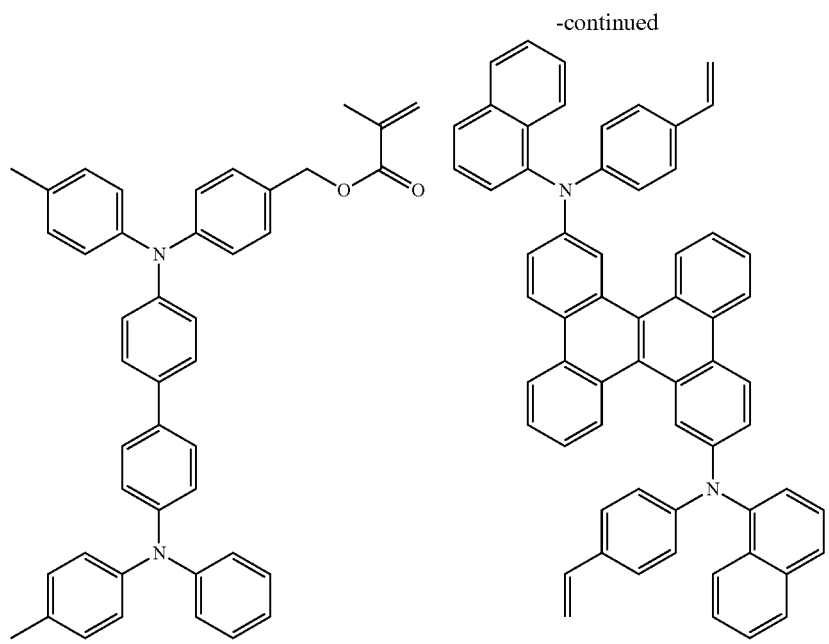
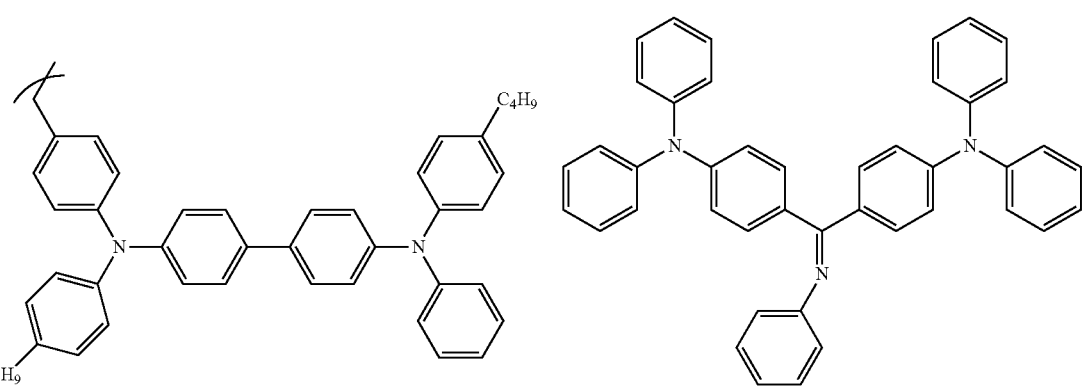
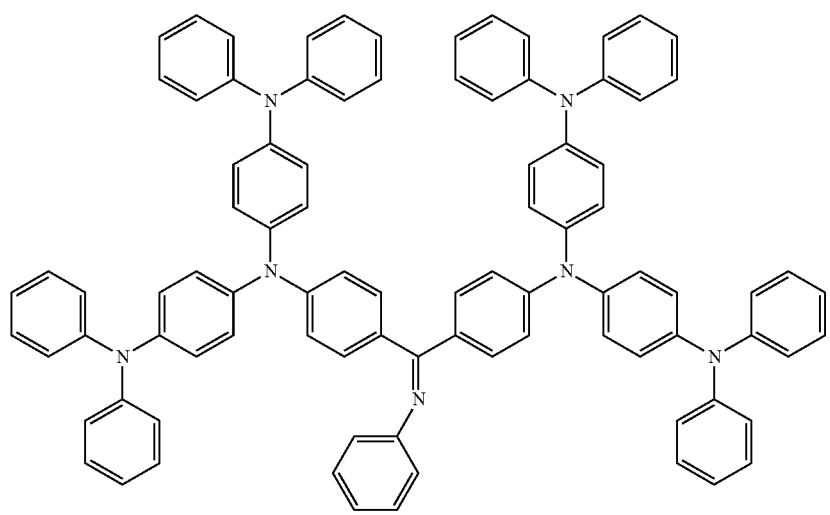

-continued
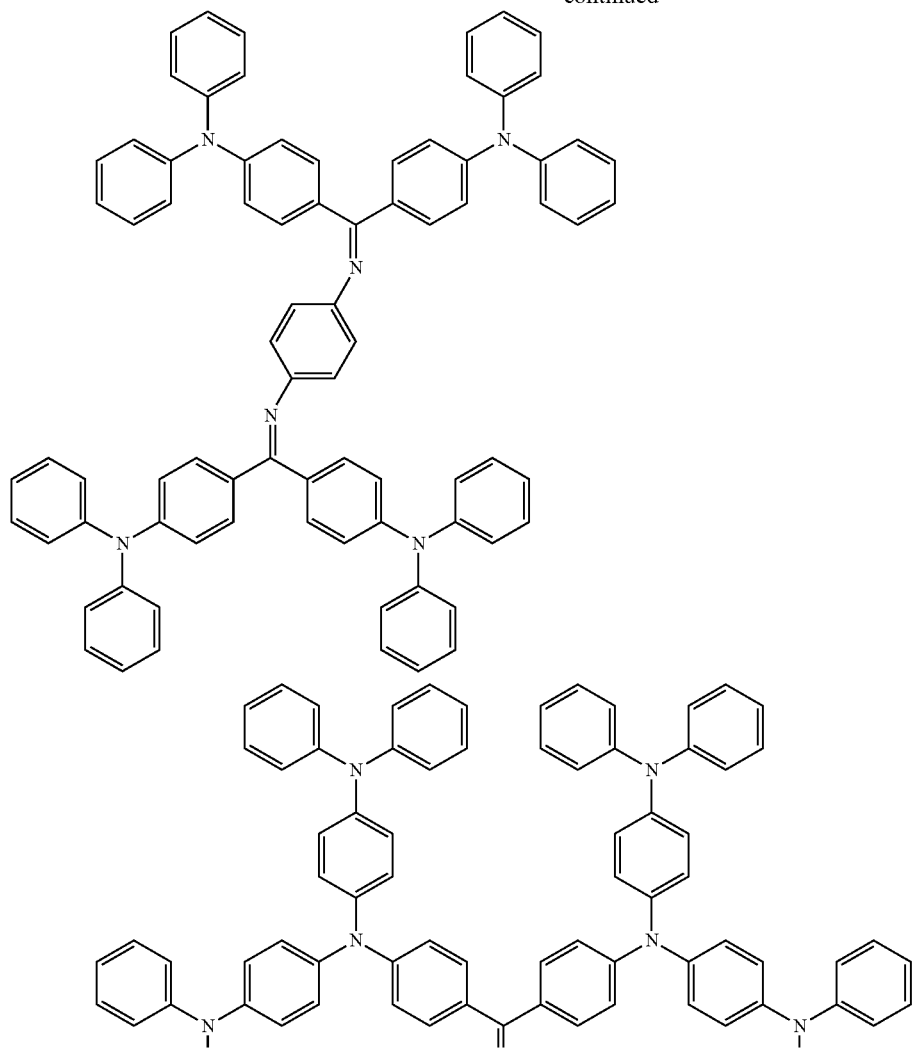
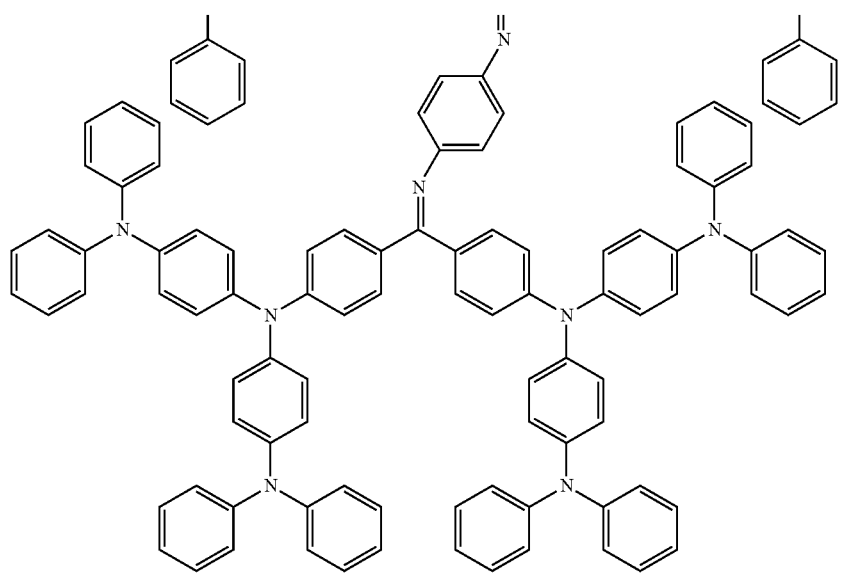

Next, preferred compound examples for use as the electron blocking material are mentioned below.
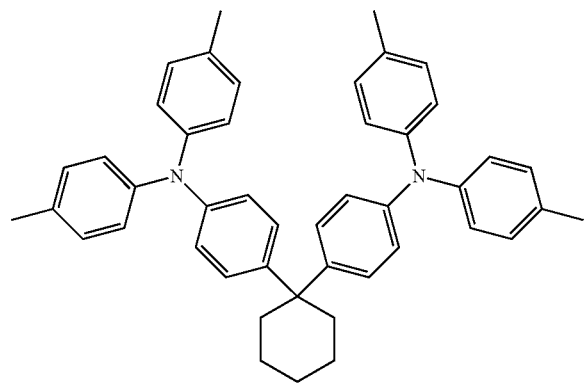
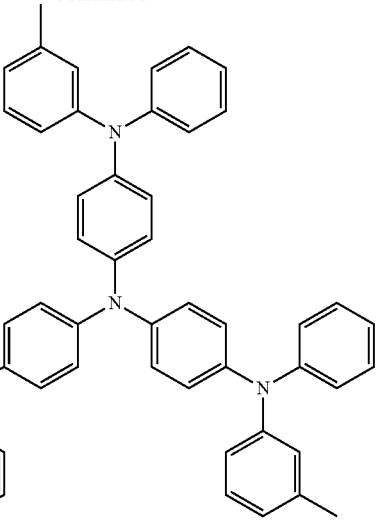
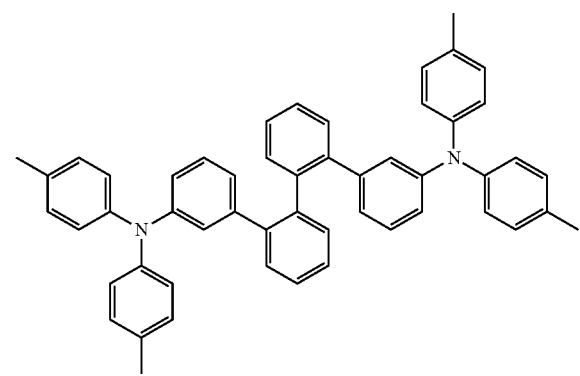
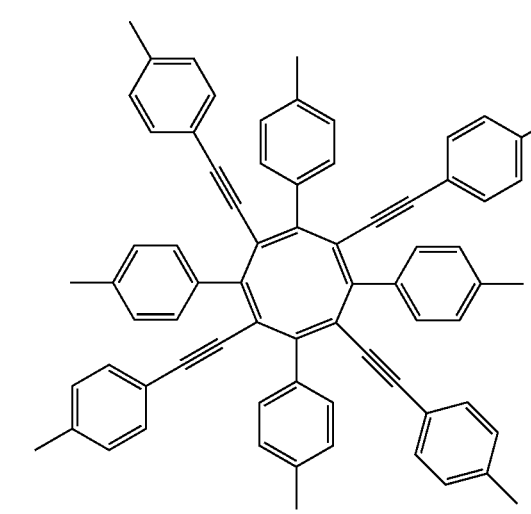
Next, preferred compound examples for use in the electron transport material are mentioned below.
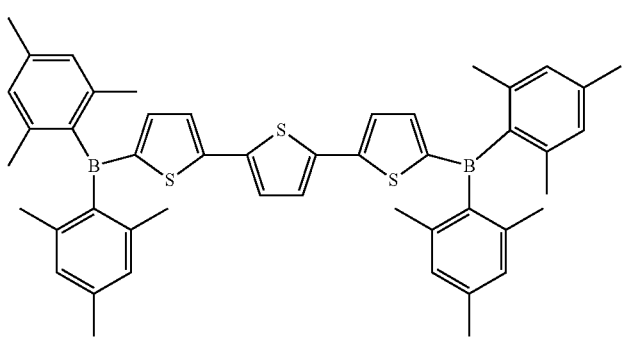

-continued
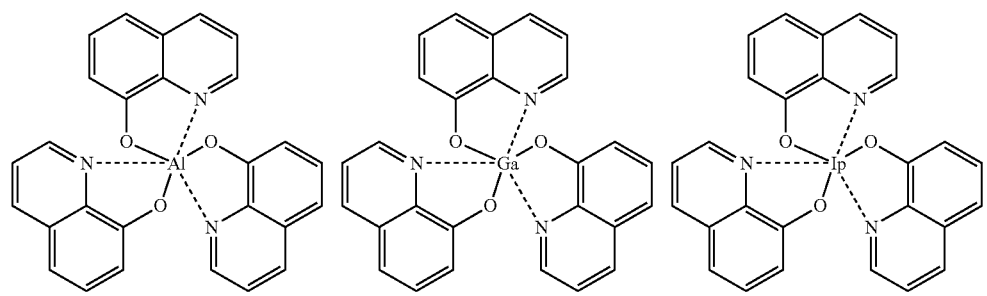
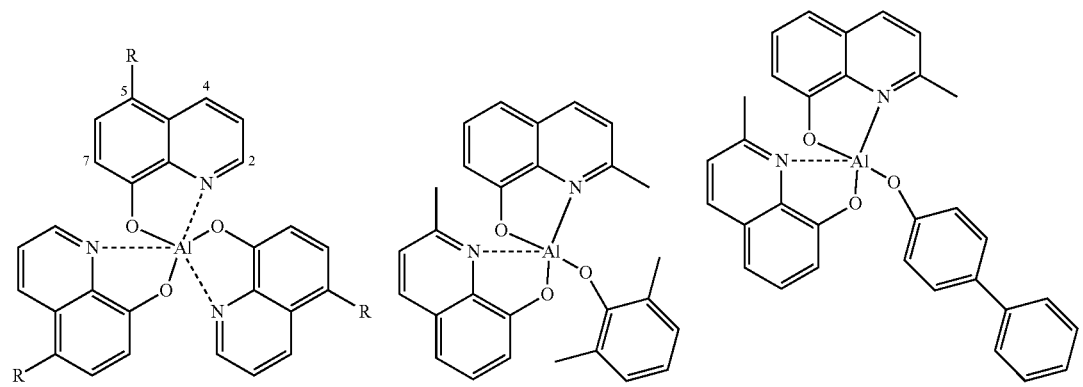
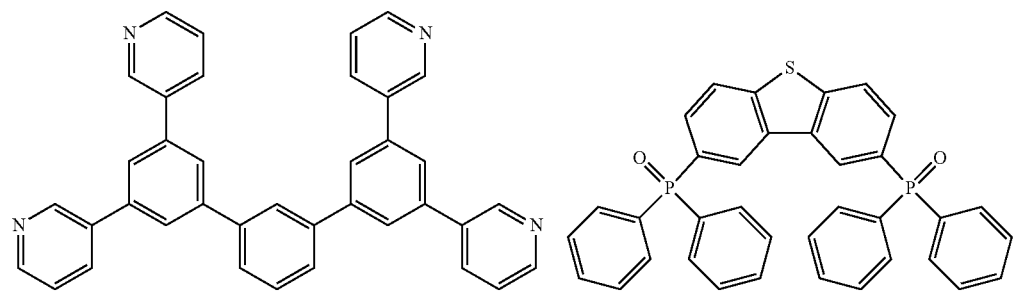
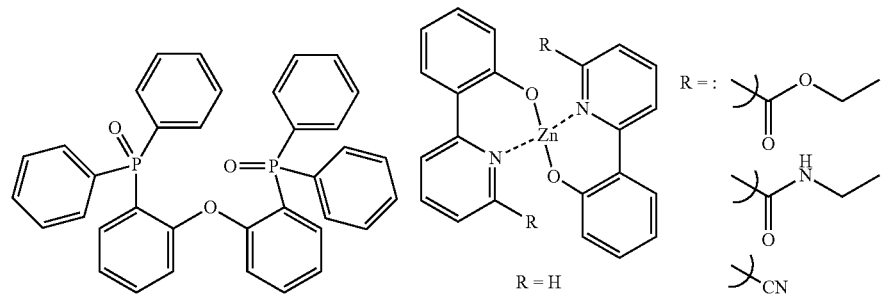
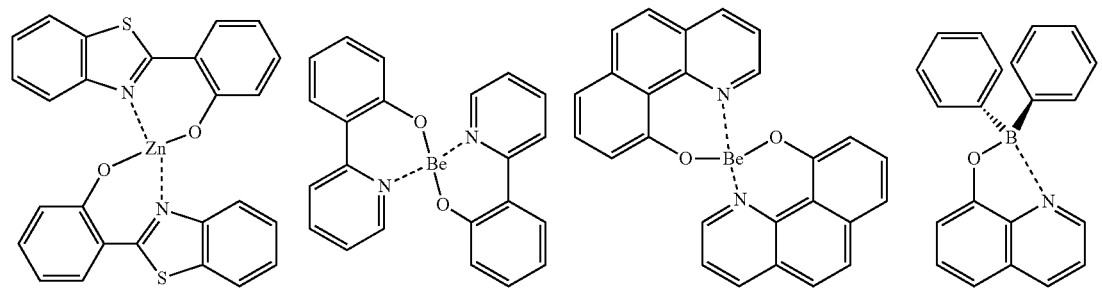

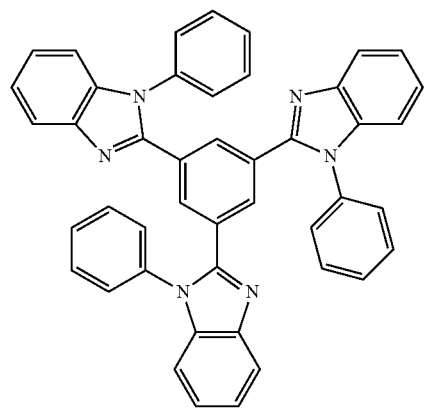
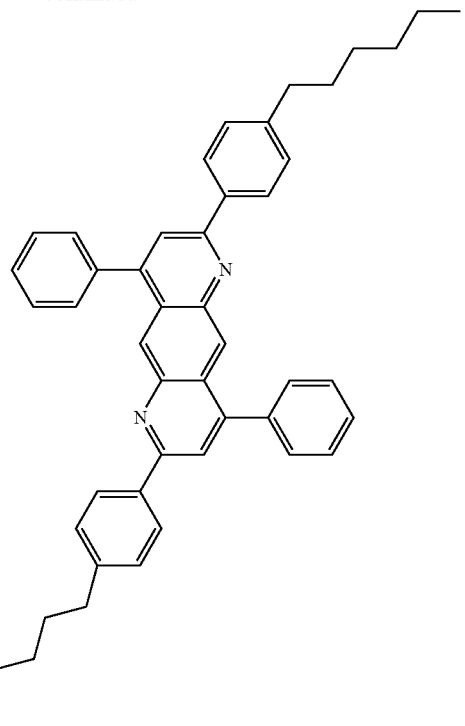
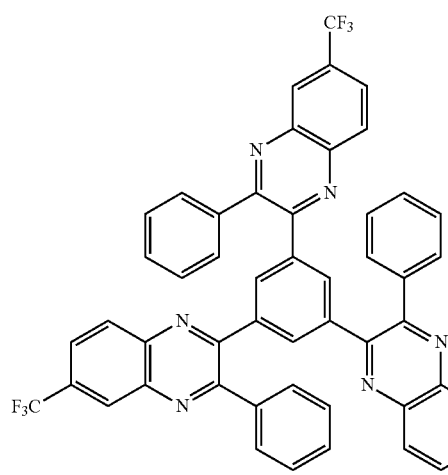
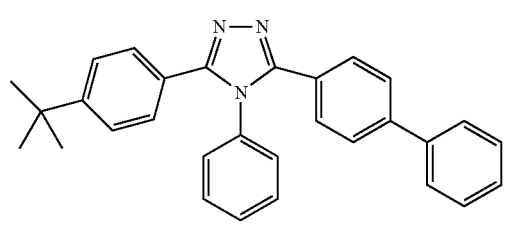
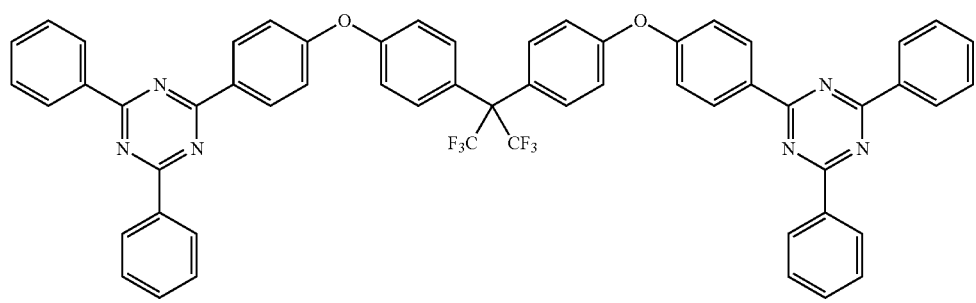
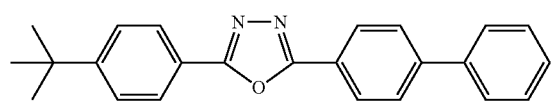

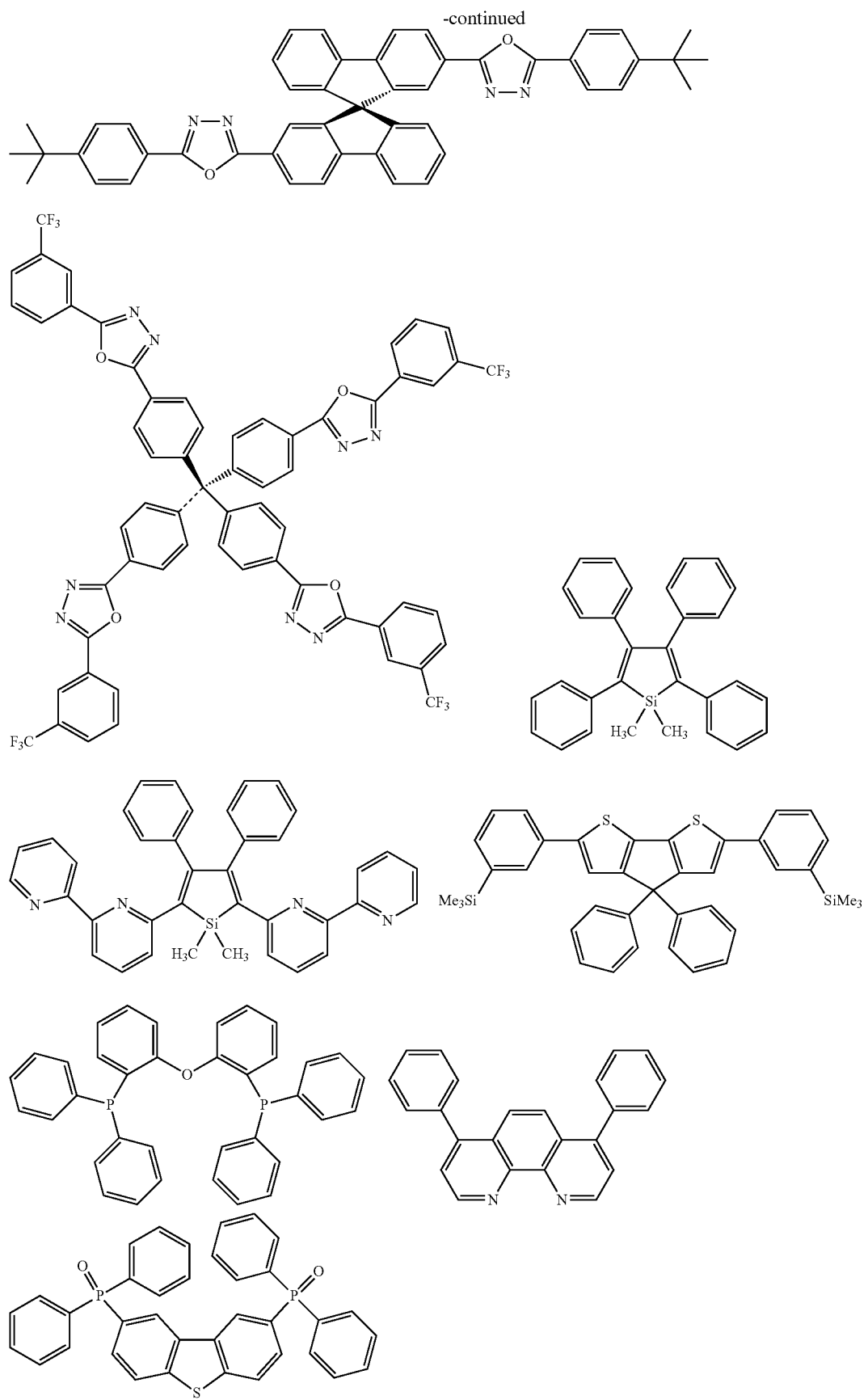

Next, preferred compound examples for use as the electron injection material are mentioned below.

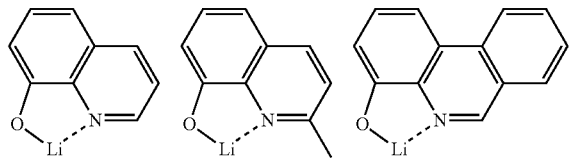

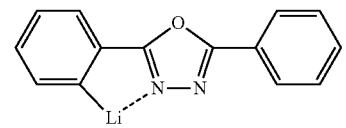

Further, preferred compound examples for use as additional materials are mentioned below. For example, these are considered to be added as a stabilization material.

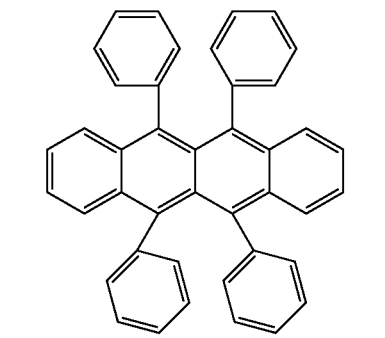

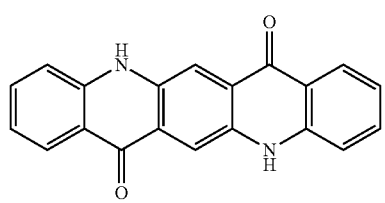

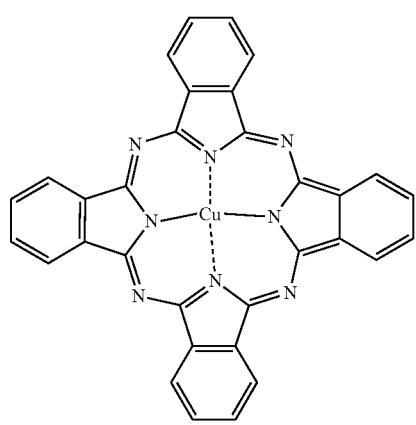

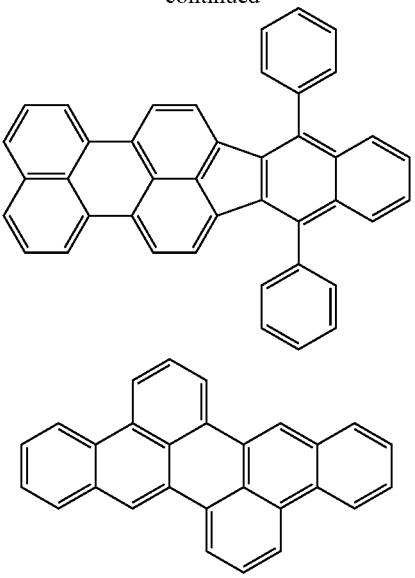

The organic electroluminescent device thus produced by the aforementioned method emits light on application of an electric field between the anode and the cathode of the device, in this case, when the light emission is caused by the excited singlet energy, light having a wavelength that, corresponds to the energy level thereof may be confirmed as fluorescent, light and delayed fluorescent light. When the light emission is caused by the excited triplet energy, light having a wavelength that corresponds to the energy level thereof may be confirmed as phosphorescent light. The normal fluorescent light has a shorter light emission lifetime than the delayed fluorescent light, and thus the light emission lifetime may be distinguished between the fluorescent light and the delayed fluorescent light.

The phosphorescent light may substantially not be observed with a normal organic compound at room temperature since the excited triplet energy is converted to heat or the like due to the instability thereof, and is immediately deactivated with a short lifetime. The excited triplet energy of the normal organic compound may be measured by observing light emission under an extremely low temperature condition.

The organic electroluminescent device of the invention may be applied to any of a single device, a structure with plural devices disposed in an array, and a structure having anodes and cathodes disposed in an X-Y matrix. The organic electroluminescent device of the present invention has the charge trap concentration reducing layer provided in the interlace between the light-emitting layer and the electron transport layer, and can therefore be protected from performance deterioration with time in driving, and the device enables high-brightness emission, for a long period of time and enables low-voltage driving. The organic electroluminescent device of the invention may be applied to a further wide range of purposes. For example, an organic electroluminescent display apparatus may be produced with, the organic electroluminescent device of the invention, and for the details thereof reference may be made to S. Tokito, C. Adachi and B. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLES

The features of the invention will be described more specifically with reference to examples below. The materials, processes, procedures and the like shown below may be appropriately modified unless they deviate from the substance of the invention. Accordingly, the scope of the invention is not construed as being limited to the specific examples shown below. The light emission characteristics were evaluated by using a source meter (2400 Series, produced by Keithley Instruments Inc.), a semiconductor parameter analyzer (E5273A, produced by Agilent technologies, Inc.), an optical power meter (19030C, produced by Newport Corporation), an optical spectrometer (USB2000, produced by ocean Optics, Inc.), a spectroradiometer (SR-3, produced by Topcon Corporation), and a streak camera (Model C4334, produced by Hamamatsu Photonics K.K.).

Regarding measurement of each energy level in the energy diagram, a photoelectronic spectrometer (AC3 by Riken Keiki Co., Ltd.) was used for HOMO, and a UV-visible light-near IR spectrometer (LAMBDA950 by Perkin Elmer Co., Ltd.) was used for LUMO.

For thermal stimulated current (TSC) measurement, a thermal stimulated current indicator (product name TSC-FETT EL2000) manufactured by Rigaku Corporation was used to carry out the measurement under the condition described in the section of definition of "charge trap concentration reducing layer" mentioned hereinabove.

(Example 1) Production and Evaluation of Organic Electroluminescent Device with a Light-Emitting Layer Containing 5% by Weight of 4CzIPN (Light-Emitting Material), mCBP (First Host Material) and T2T (Second Host Material)

On a glass substrate having, as formed thereon, an anode of indium-tin oxide (ITO) having a thickness of 100 nm, constituent layers were layered at a vacuum degree of $10^{-5}$ Pa according to a vacuum evaporation method. First, HAT-CN was formed to have a thickness of 10 nm on ITO, and Tris-PCZ was formed thereon to have a thickness of 30 nm. Next, 4CzIPN, mCBF and T2T were deposited through co-evaporation from different evaporation sources to form a layer having a thickness of 30 nm to be a light-emitting layer. At this time, the concentration of 4CzIPN (content thereof relative to the total amount of 4CzIPN, mCBP and T2T) was 5% by weight. The content of mCBP was 95% by weight relative to the total amount of mCBP and T2T (the total amount of the host materials), 90% by weight or by weight, and the content of T2T was 5% by weight, 10% by weight or 15% by weight relative to the total amount of the host materials. Next T2T was vapor-deposited to have a thickness of 10 nm to be a first electron transport layer. On this, BPy-TP2 was vapor-deposited to have a thickness of 40 nm to be a second electron transport layer. Further, lithium fluoride (LiF) was vapor-deposited in a thickness of 0.8 nm, and then aluminum (Al) was vapor-deposited to have a thickness of 100 nm, thereby forming a cathode to produce three kinds of organic electroluminescent devices (organic EL devices) differing from each other In point of the composition ratio of the host materials therein.

Regarding the lowest excited triplet energy level of the material is of the light-emitting layer used in this Example, 4CzIPN had 2.40 eV, mCBP had 2.90 eV, and T2T had 2.70 eV.

Figure 6:
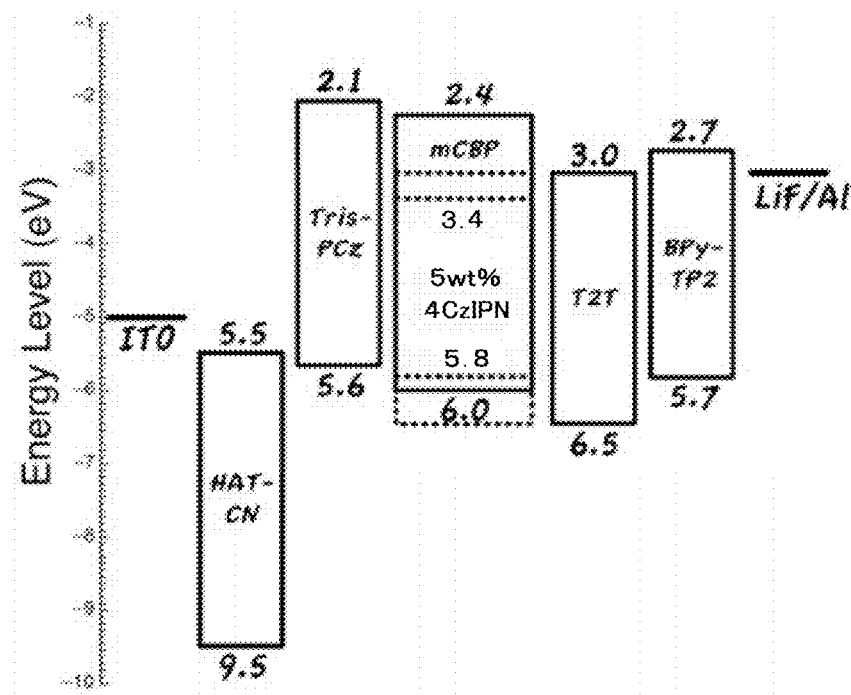
FIG. 6 This is an energy diagram of an organic electroluminescent device of Example 1, in which the light-emitting layer contains T2T (second host material).

The energy diagram of the organic EL devices produced in Example 1 is shown in FIG. 6. Regarding the numeral values in FIG. 6, the lower ones each indicate an absolute value of the HOMO level of each organic layer, and the upper ones each indicate an absolute value of the LUMO level of each organic layer. In the third organic layer from the side of ITO (light-emitting layer), the upper and lower solid lines each indicate the energy level of mCBP, the outside dotted lines each indicate the energy level of T2T, and the inner dotted lines each indicate the energy level of 4CzIPN.

(Comparative Example 1) Production and Evaluation of Organic Electroluminescent Device with a Light-Emitting Layer Containing 5% by Weight of 4CzIPN (Light-Emitting Material) and mCBP (First Host Material)

An organic electroluminescent device (organic EL device) was produced in the same manner as in Example 1 except that a light-emitting layer having a thickness of 30 nm was formed through co-evaporation from different evaporation sources of 4CzIPN and mCBP.

Figure 7:
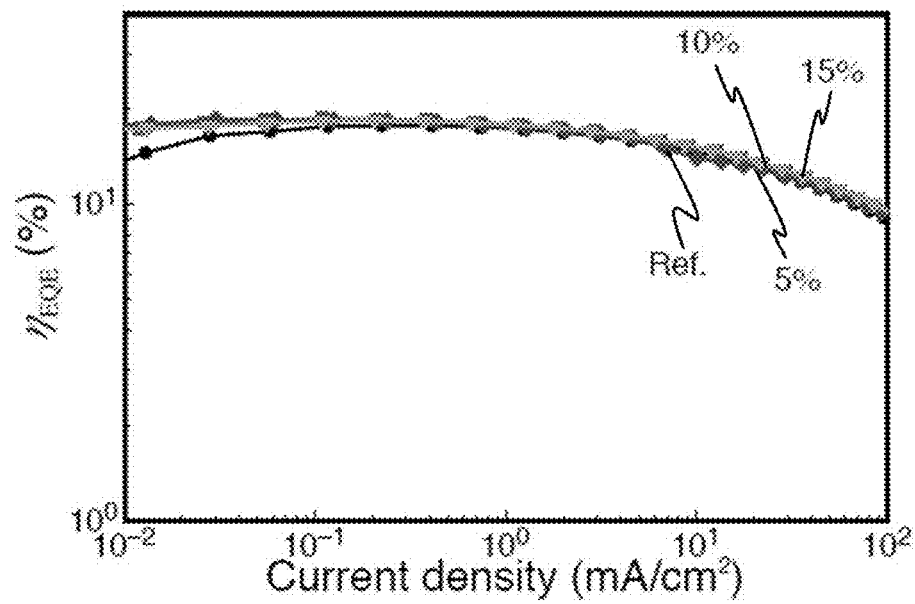
FIG. 7 This is a graph showing a current density-external quantum efficiency characteristic of an organic electroluminescent device of Example 1 in which the light-emitting layer contains T2T (second host material) and that of an organic electroluminescent device of Comparative Example 1 in which the light-emitting layer does not contain T2T (second host material).
Figure 8:
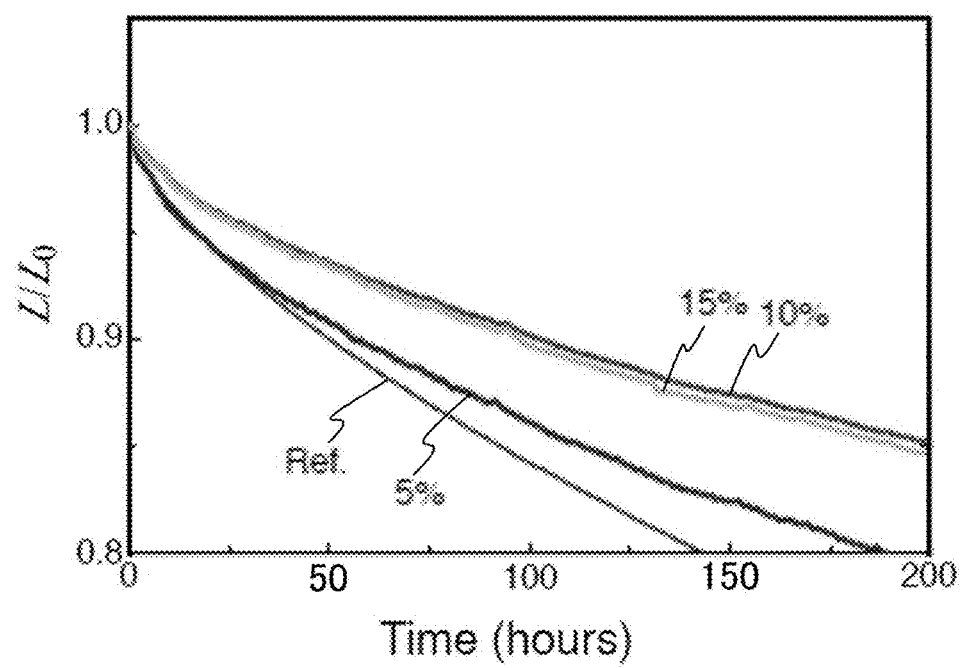
FIG. 8 This is a graph showing a time-dependent change of luminance ratio of an organic electroluminescent device of Example 1 in which the light-emitting layer contains T2T (second host material) and that of an organic electroluminescent device of Comparative Example 1 in which the light-emitting layer does not contain T2T (second host material).

The current density-external quantum efficiency characteristic of the organic EL devices produced in Example 1 and Comparative Example 1 is shown in FIG. 7, and the time-dependent change of luminance ratio thereof is in FIG. 8. In these drawings, "Ref." means the organic EL device (Comparative Example 1) in which the light-emitting layer does not contain T2T and "5%", "10%" and "15%" each mean the organic EL device (Example 1) in which the light-emitting layer contains T2T in the indicated content (content relative to the total amount of the host materials). In FIG. 8, "$L_0/L$" means a luminance ratio of the measured luminance L relative to the initial luminance $L_0$ (1000 cd/m$^2$). In the following FIGS. 10 and 20, "$L_0/L$" is the same as this.

(Example 2) Production and Evaluation of Organic Electroluminescent Device with a Light-Emitting Layer Containing 10% by Weight of 4CzIPN (Light-Emitting Material), mCBP (First Host Material) and T2T (Second Host Material)

Three kinds of organic electroluminescent devices (organic EL devices) differing in the composition ratio of the host material therein were produced in the same manner as in Example 1 except that the concentration of 4CzIPN in the light-emitting layer was changed to 10% by weight.

(Comparative Example 2) Production and Evaluation of Organic Electroluminescent Device with a Light-Emitting Layer Containing 10% by Weight of 4CzIPN (Light-Emitting Material) and mCBP (First Host Material)

An organic electroluminescent device (organic EL device) was produced in the same manner as in Example 2 except that a light-emitting layer having a thickness of 30 nm was formed through co-evaporation from different evaporation sources of 4CzIPN and mCBP.

Figure 9:
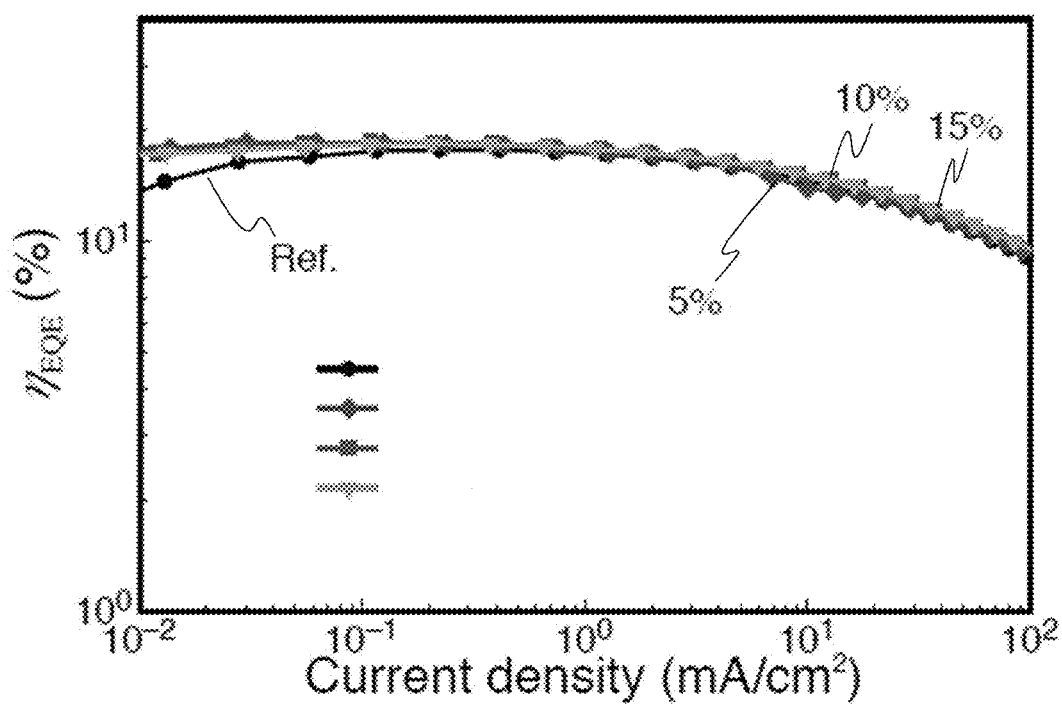
FIG. 9 This is a graph showing a current density-external quantum efficiency characteristic of an organic electroluminescent device of Example 2 in which the light-emitting layer contains T2T (second host material) and that of an organic electroluminescent device of Comparative Example 2 in which the light-emitting layer does not contain T2T (second host material).
Figure 10:
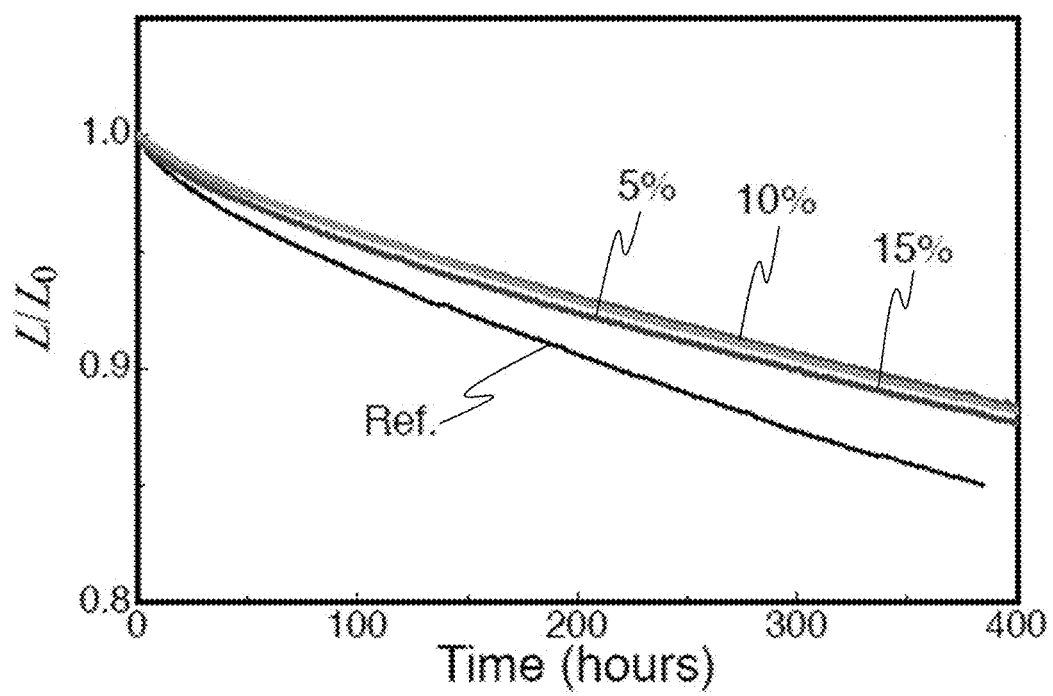
FIG. 10 This is a graph showing a time-dependent change of a luminance ratio of an organic electroluminescent device of Example 2 in which the light-emitting layer contains T2T (second host material) and that of an organic electroluminescent device of Comparative Example 2 in which the light-emitting layer does not contain T2T (second host material).

The current density-external quantum efficiency characteristic of the organic EL devices produced in Example 2 and Comparative Example 2 is shown in FIG. 9, and the time-dependent change of luminance ratio thereof is in FIG. 10. In these drawings, "Ref." means the organic EL device (Comparative Example 2) in which the light-emitting layer does not contain T2T, and "5%", "10%" and "15%" each mean the organic EL device (Example 2) in which the tight-emitting layer contains T2T in the indicated content (content relative to the total amount of the host materials).

(Example 3) Production and Evaluation of Organic Electroluminescent Device with a Light-Emitting Layer Containing 15% by Weight of 4CzIPN (Light-Emitting Material), mCBP (First Host Material) and T2T (Second Host Material)

Three kinds of organic electroluminescent devices (organic EL devices) differing in the composition ratio of the host material therein were produced in the same manner as in Example 1 except that the concentration of 4CzIPN in the light-emitting layer was changed to 15% by weight.

(Comparative Example 3) Production and Evaluation of Organic Electroluminescent Device with a Light-Emitting Layer Containing 15% by Weight of 4CzIPN (Light-Emitting Material) and mCBP (First Host Material)

An organic electroluminescent device (organic EL device) was produced in the same manner as in Example 3 except that a light-emitting layer having a thickness of 30 nm was formed through co-evaporation from different evaporation sources of 4CzIPN and mCBP.

Figure 11:
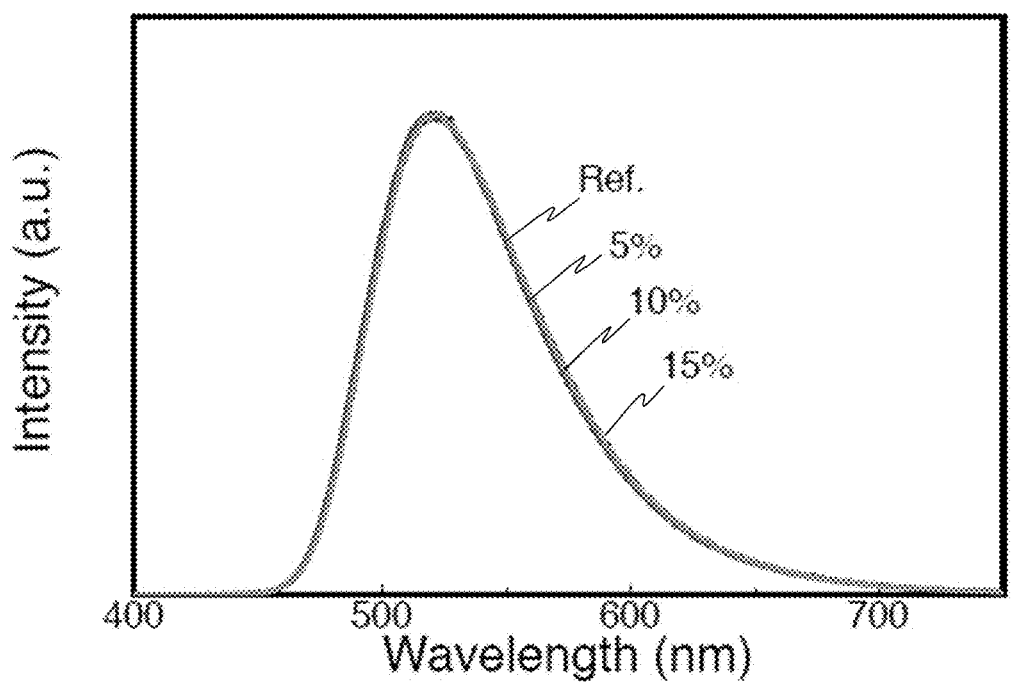
FIG. 11 This shows an emission spectrum of an organic electroluminescent device of Example 3 in which the light-emitting layer contains T2T (second host material) and that of an organic electroluminescent device of Comparative Example 3 in which the light-emitting layer does not contain T2T (second host material).
Figure 12:
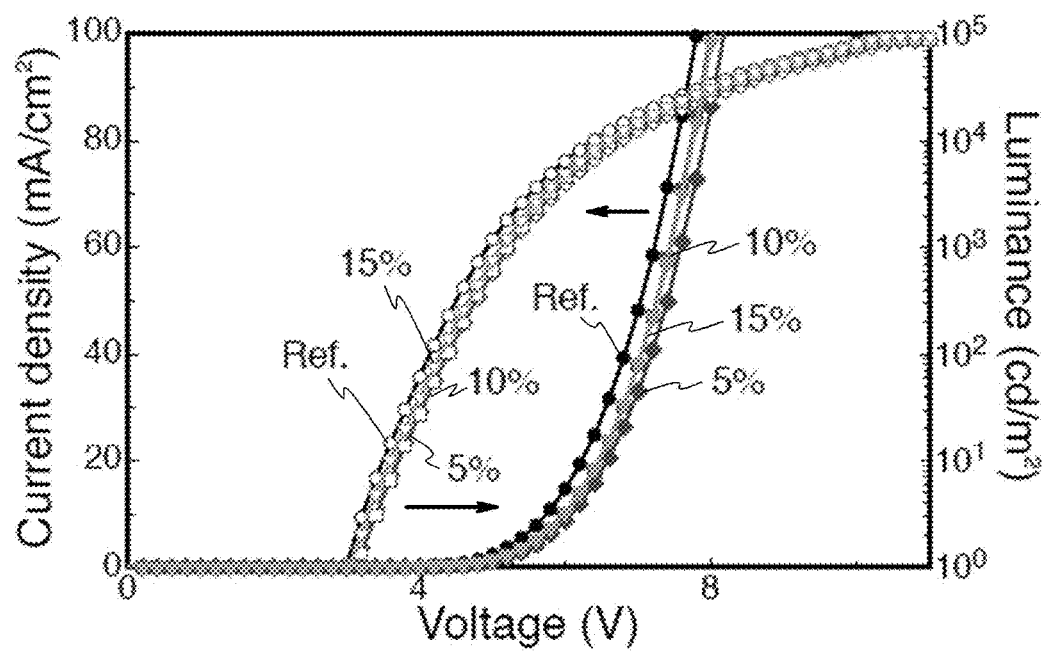
FIG. 12 This is a graph showing a voltage-current density-luminance characteristic of an organic electroluminescent device of Example 3 in which the light-emitting layer contains T2T (second host material) and that of an organic electroluminescent device of Comparative Example 3 in which the light-emitting layer does not contain T2T (second host material).
Figure 13:
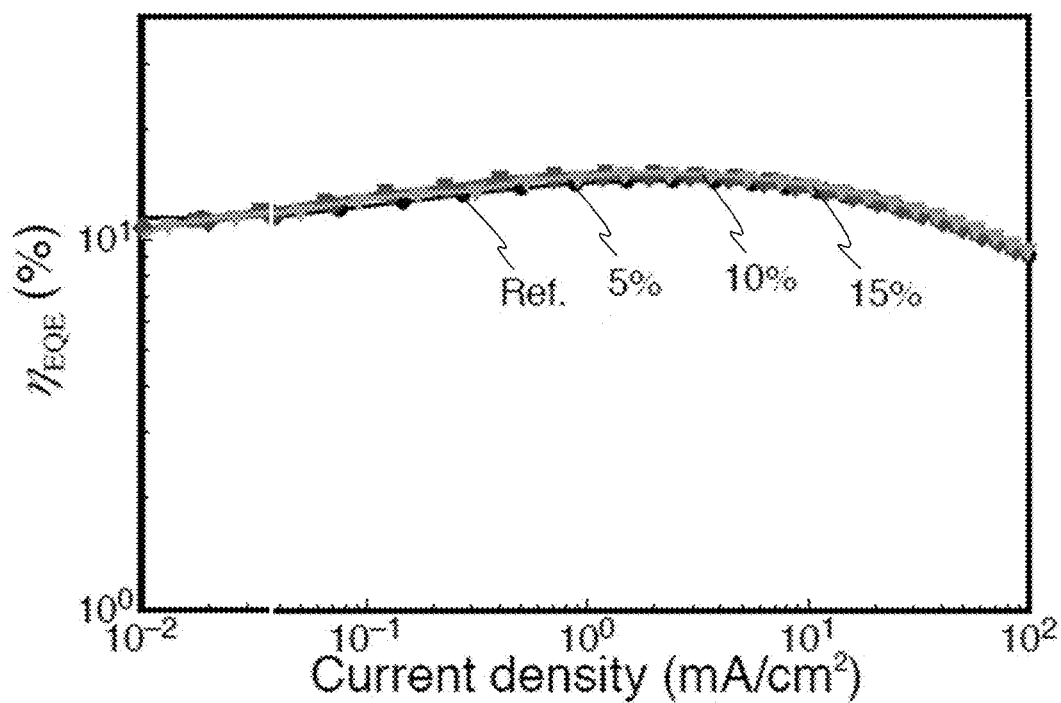
FIG. 13 This is a graph showing a current density-external quantum efficiency characteristic of an organic electroluminescent device of Example 3 in which the light-emitting layer contains T2T (second host material) and that of an organic electroluminescent device of Comparative Example 3 in which the light-emitting layer does not contain T2T (second host material).
Figure 14:
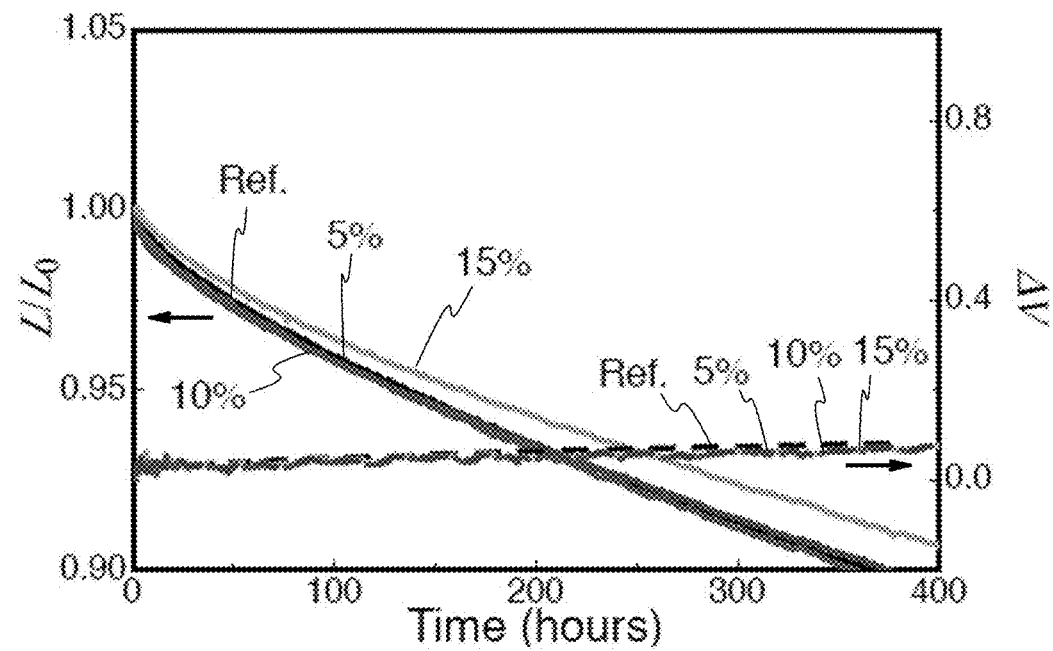
FIG. 14 This is a graph showing a time-dependent change of a luminance ratio and a voltage variation of an organic electroluminescent device of Example 3 in which the light-emitting layer contains T2T (second host material) and that of an organic electroluminescent device of Comparative Example 3 in which the light-emitting layer does not contain T2T (second host material).

The emission spectra of the organic EL devices produced in Example 3 and Comparative Example 3 are shown in FIG. 11, the voltage-current density-luminance characteristic thereof is in FIG. 12, the current density-external quantum efficiency characteristic thereof is in FIG. 13, and the time-dependent change of luminance ratio and voltage variation thereof is in FIG. 14. In FIG. 14, "$L_0/L$" means a luminance ratio of the measured luminance L relative to the initial luminance $L_0$ (1000 cd/m$^2$), and "$\Delta V$" means a voltage variation amount from the initial voltage. In the following FIGS. 25, 30 and 35, "$L_0/L$" and "$\Delta V$" are the same as these. In these drawings, "ref." means the organic EL device (Comparative Example 3) in which the light-emitting layer does not contain T2T, and "5%,", "10%" and "15%" each mean the organic EL device (Example 3) in which the light-emitting layer contains T2T in the indicated content (content relative to the total amount of the host materials).

The composition ratio of the light-emitting layer in the organic EL devices produced in Examples 1 to 3 and Comparative Examples 1 to 3 and the device characteristics are summarized in Table 1.

TABLE 1

| | Concentration of 4CzIPN | Proportion (% by weight) relative to all hosts | | Maximum External Quantum Efficiency | External Quantum Efficiency at 1000 cd | Time (hr) taken for $L_0/L$ to reach |
|---|---|---|---|---|---|---|
| | (% by weight) | mCBP | T2T | EQEmax (%) | EQE (%) | 0.9 LT90 (time) |
| Comparative Example 1 | 5 | 100 | 0 | 19.25 | 16.03 | 50 |
| Example 1 | 5 | 95 | 5 | 19.26 | 16.32 | 55 |
| | 5 | 90 | 10 | 21.16 | 17.05 | 102 |
| | 5 | 85 | 15 | 21.22 | 17.30 | 98 |
| Comparative Example 2 | 10 | 100 | 0 | 17.79 | 16.92 | 220 |
| Example 2 | 10 | 95 | 5 | 18.61 | 17.13 | 298 |
| | 10 | 90 | 10 | 18.70 | 17.48 | 330 |
| | 10 | 85 | 15 | 18.46 | 17.52 | 320 |
| Comparative Example 3 | 15 | 100 | 0 | 14.68 | 14.68 | 370 |
| Example 3 | 15 | 95 | 5 | 15.01 | 15.01 | 376 |
| | 15 | 90 | 10 | 15.43 | 15.43 | 360 |
| | 15 | 85 | 15 | 15.41 | 15.40 | 440 |

From Table 1, and FIGS. 8, 10 and 14, it is known that the organic EL devices (Examples 1 to 3) where the light-emitting layer contains T2T can suppress time-dependent luminance ratio reduction as compared with the organic EL devices (Comparative Examples 1 to 3) where the light-emitting layer does not contain T2T. Table 1, and FIGS. 7, 9 and 13 are referred to. As in these, the organic EL devices (Examples 1 to 3) where the light-emitting layer contains T2T have an external quantum efficiency on the same level as or more than that of the organic EL devices (Comparative Examples 1 to 3) where the light-emitting layer does not contain T2T. From these, it is confirmed that, by adding T2T (second host material) to the light-emitting layer, the lifetime of the organic EL devices can be prolonged without detracting rom the external quantum efficiency.

(Example 4) Production and Evaluation of Organic Electroluminescent Device with a Light-Emitting Layer Containing 10% by Weight of 4CzIPN (Light-Emitting Material), mCBP (First Host Material) and T2T (Second Host Material) and with Second Electron Transport Layer Containing BPy-TP2 and Liq An organic electroluminescent device (organic EL device) was produced in the same manner as m Example 1 except that the concentration of 4CzIPN in the light-emitting layer was changed to 10% by weight, the content of mCBP relative to the total amount of the host materials was changed to 90% by weight, the content of T2T relative to the total amount of the host materials was changed to 10% by weight, and the second electron transport layer was formed through co-evaporation from different evaporation sources of BPy-TP2 and Liq. In that manner, three kinds of organic EL devices differing in point of the Liq concentration therein were produced, in which the concentration of Liq in the second electron transport layer was 25% by weight, 50% by weight or 75% by weight.

Figure 15:
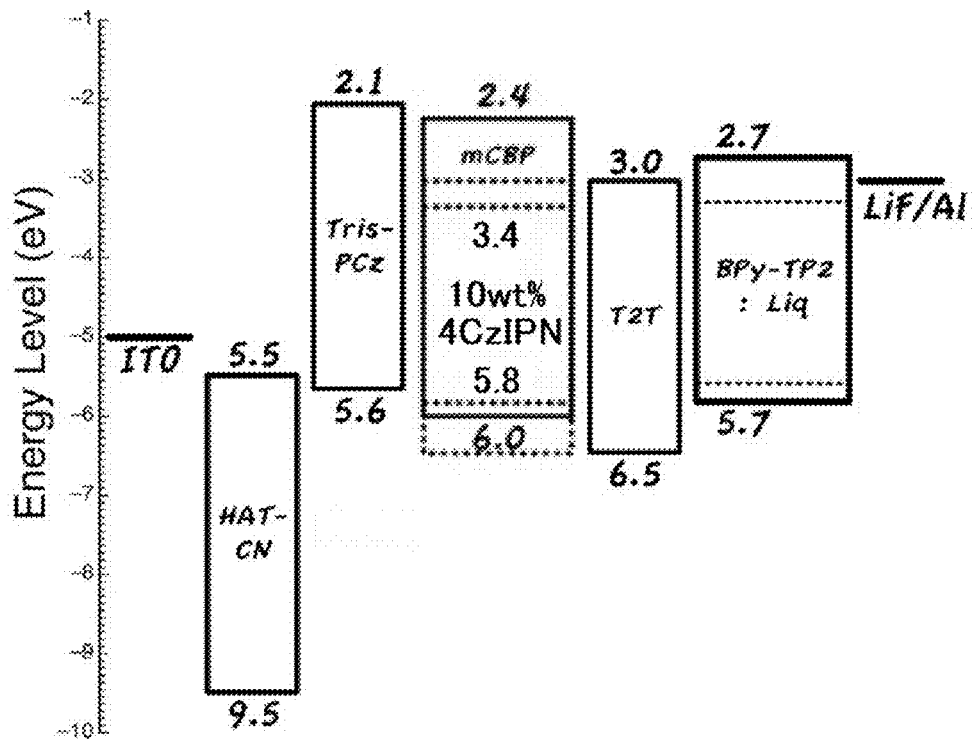
FIG. 15 This is an energy diagram of an organic electroluminescent device of Example 4, in which the light-emitting layer contains T2T (second host material) and the second electron transport layer contains Liq.
Figure 16:
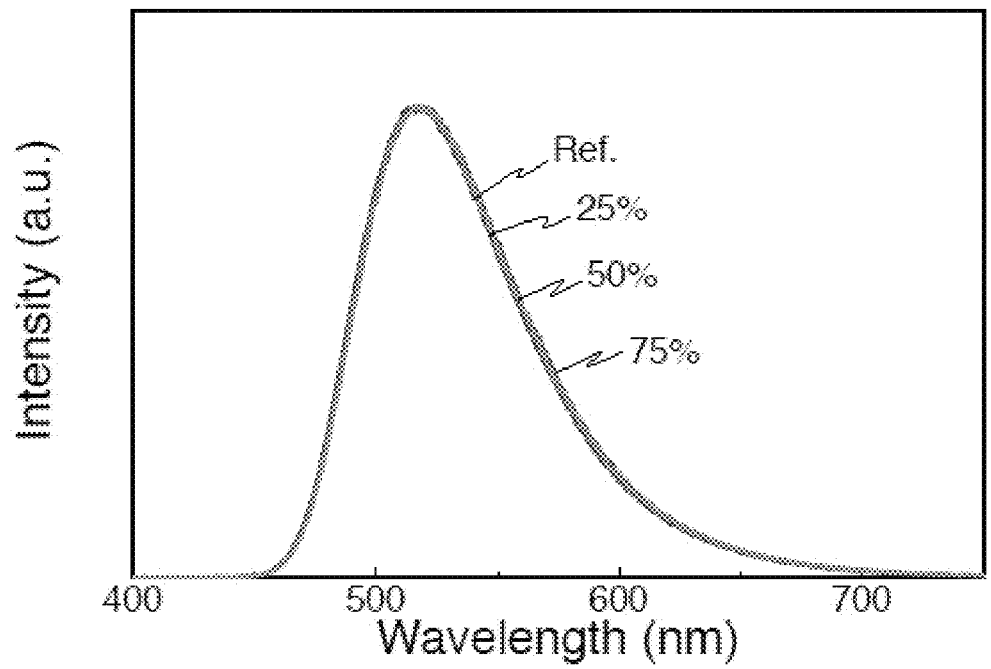
FIG. 16 This is an emission spectrum of an organic electroluminescent device of Example 4, in which the light-emitting layer contains T2T (second host material) and the second electron transport layer contains Liq.
Figure 17:
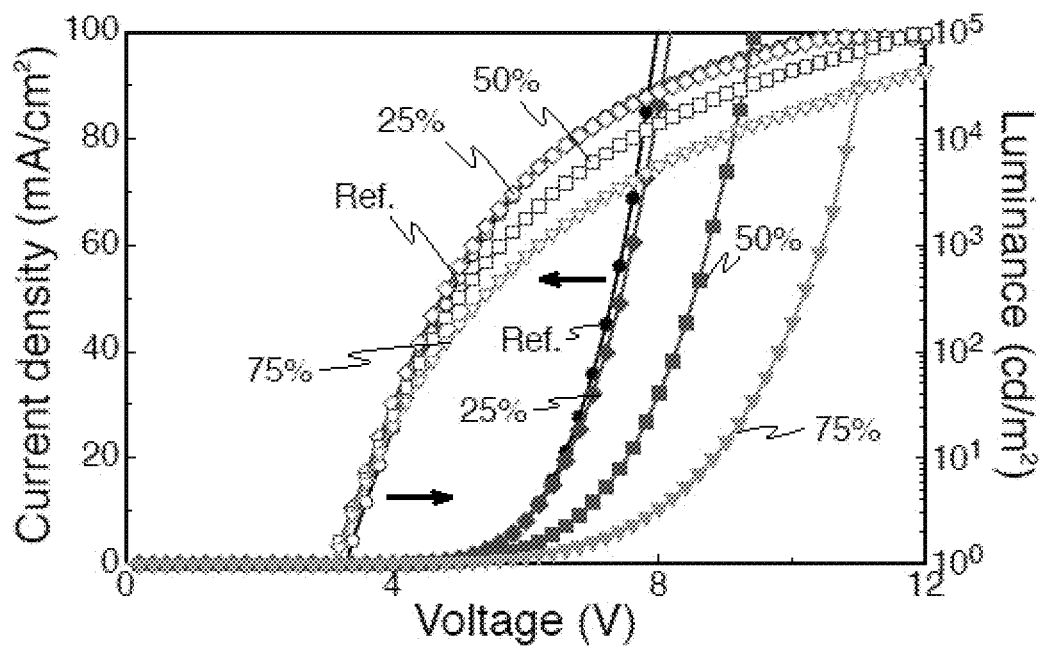
FIG. 17 This is a graph showing a voltage-current density-luminance characteristic of an organic electroluminescent device of Example 4 in which light-emitting layer contains T2T (second host material) and the second electron transport layer contains Liq.
Figure 18:
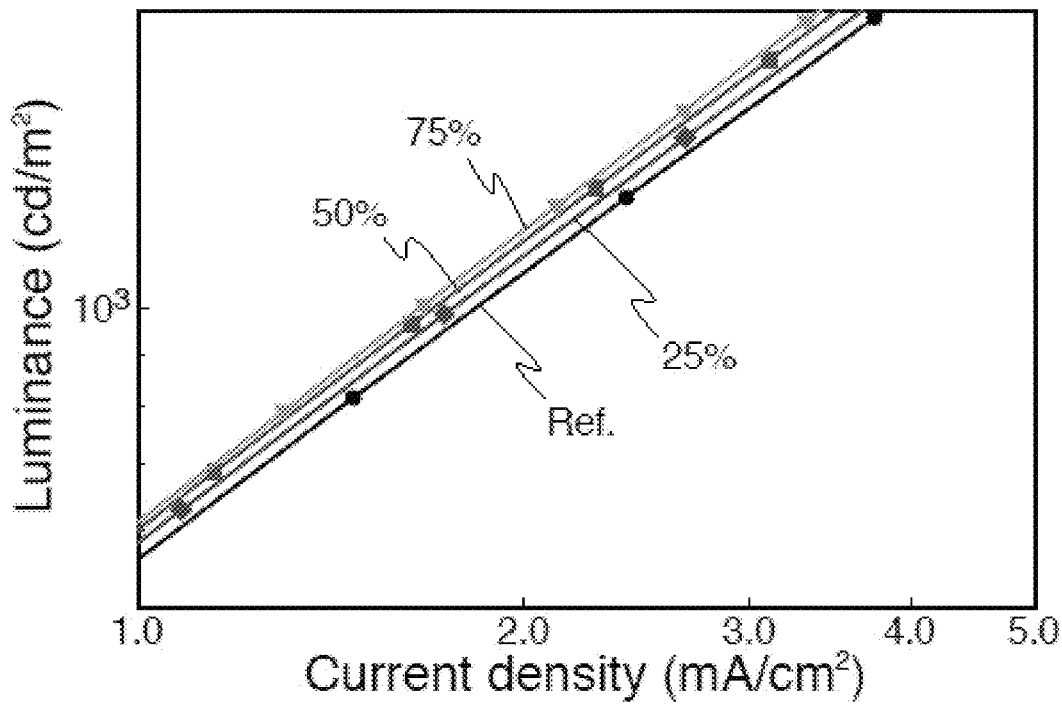
FIG. 18 This is a graph showing a current density-luminance characteristic of an organic electroluminescent device of Example 4 in which the light-emitting layer contains T2T (second host material) and the second electron/transport layer contains Liq.
Figure 19:
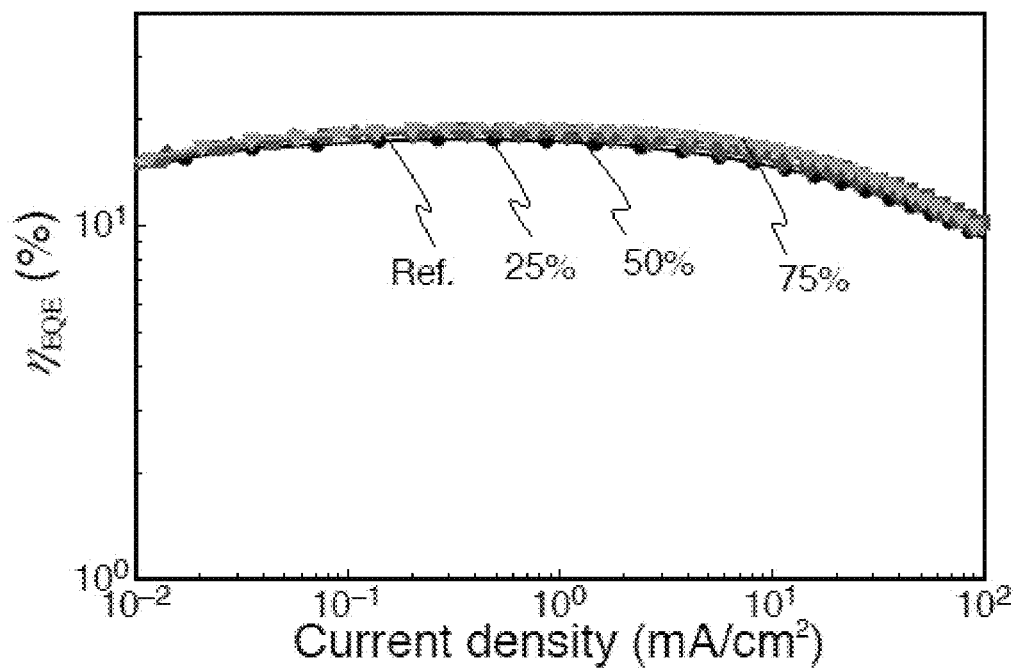
FIG. 19 This is a graph showing a current density-external quantum efficiency characteristic of an organic electroluminescent device of Example 4 in which the light-emitting layer contains T2T (second host material) and the second electron transport layer contains Liq.
Figure 20:
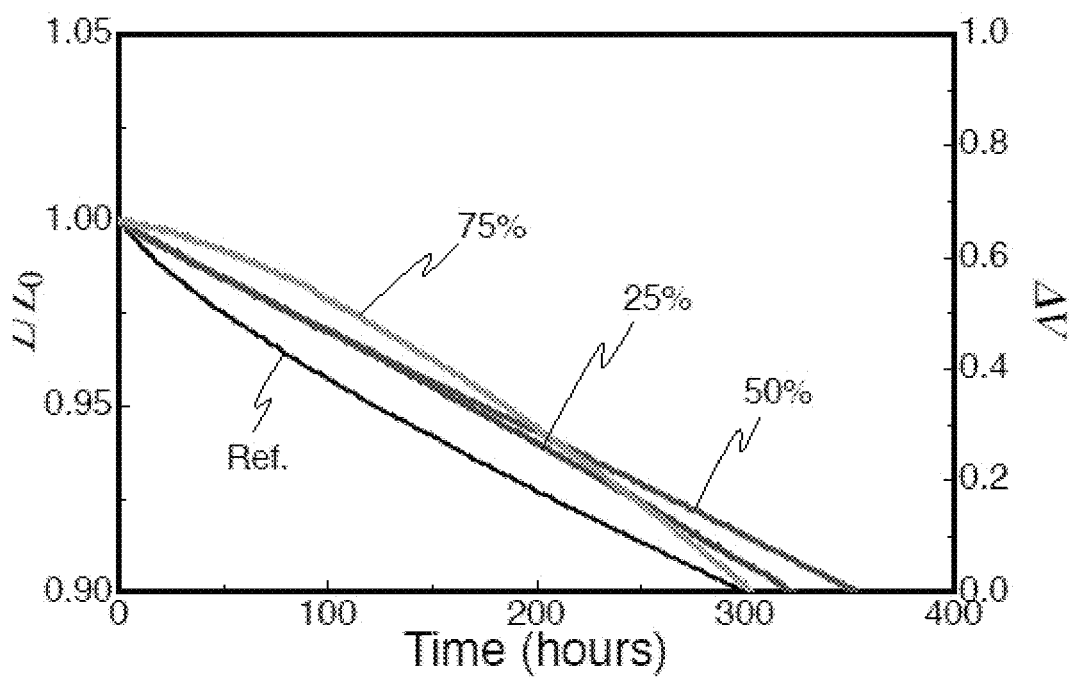
FIG. 20 This is a graph showing a time-dependent change of a luminance ratio of an organic electroluminescent device of Example 4 in which the light-emitting layer contains T2T (second host material) and the second electron transport layer contains Liq.

The energy diagram of the organic EL devices produced in Example 4 is shown in FIG. 15, the emission spectra thereof are in FIG. 16, the voltage-current density-luminance characteristic thereof is in FIG. 17, the current density-luminance characteristic thereof is in FIG. 18, the current density-external quantum efficiency characteristic thereof is in FIG. 19, and the time-dependent change of luminance ratio thereof is in FIG. 20. In each drawing, the measurement results of organic EL devices produced in the same manner as above except that the second electron transport layer was formed through single vaporization of BPy-TP2 are also shown. The meanings of the numeral values in FIG. 15 are the same as those in FIG. 6. In the first organic layer (second electron transport layer) from the side of LiF/Al, the upper and lower solid lines indicate the energy level of BPy-TP2, and the dotted lines indicate the energy level of Liq. In FIGS. 6 to 20, "Ref." means the organic EL device in which the second electron transport layer does not contain, Liq, and "25%," "50%" and "75%" each mean the organic EL device in which the second electron transport layer contains Liq in the indicated content.

From FIG. 20, itis known that the organic EL device where the second electron transport layer contains Liq can suppress time-dependent luminance ratio reduction as compared with the organic EL device where the second electron transport layer does not contain Liq. From this, it is known that, by adding T2T (second host material) to the light-emitting layer and additionally by adding Liq to the second electron transport layer, the lifetime of the organic EL device can be further more prolonged.

(Example 5) Production and Evaluation of Organic Electroluminescent Device Having a Light-Emitting Layer Containing 4CzIPN (Light-Emitting Material), mCBP (First Host Material) and T2T (Second Host Material) and Having a Charge Trap Concentration Reducing Layer of Liq in the Interface Between the Light-Emitting Layer and the First Electron Transport Layer An organic electroluminescent, device (organic EL device) was produced in the same manner as in Example 1 except that a first electron transport layer was formed after Liq was vapor-deposited in a thickness of 1 nm on the light emitting layer to form a charge trap concentration reducing layer. In this, the content of T2T In the light-emitting layer was fixed to be 10% by weight relative to the total amount of the host materials while the concentration of 4CzIPN was varied to 5% by weight, 10% by weight, 15% by weight or 20% by weight, and in that manner, 4 kinds of organic EL devices differing in the 4CzIPN concentration therein were produced.

Figure 21:
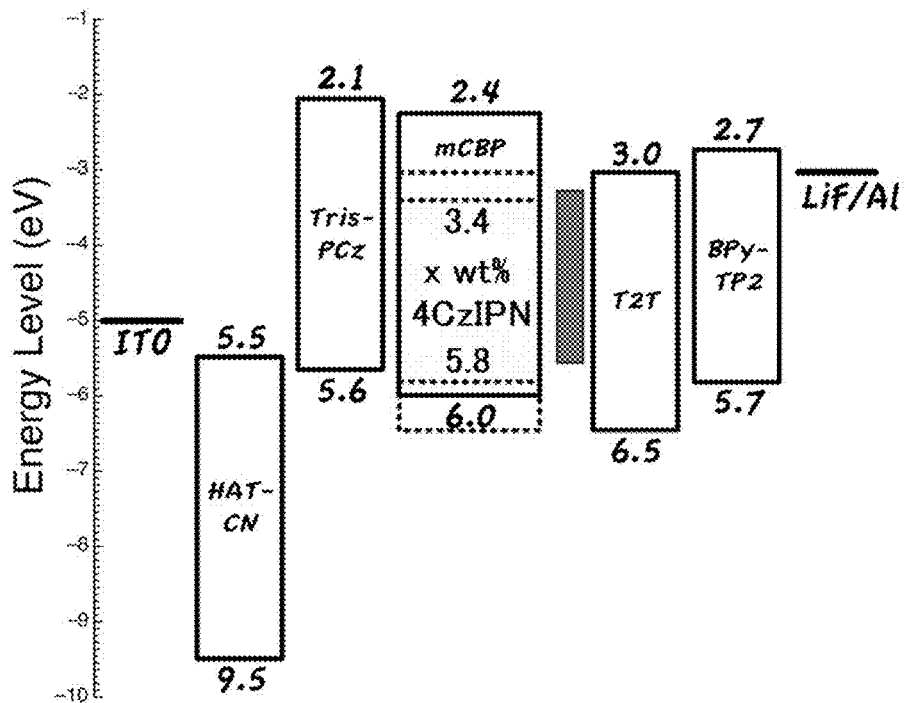
FIG. 21 This is an energy diagram of an organic electroluminescent device of Example 5 which has a charge trap concentration reducing layer and in which the light-emitting layer contains T2T (second host material).
Figure 22:
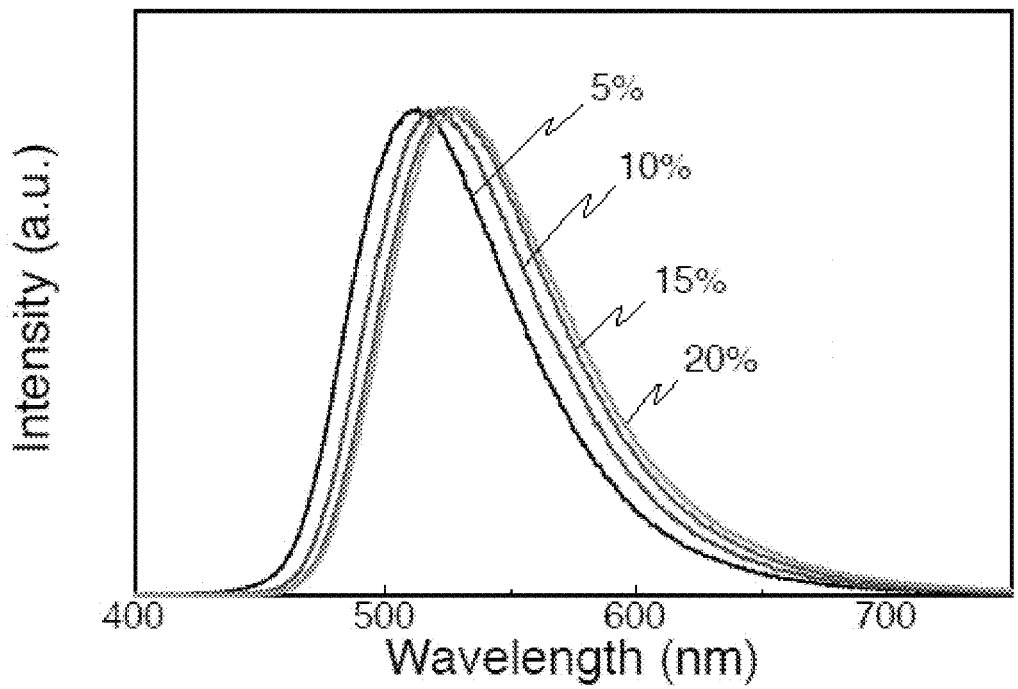
FIG. 22 This is an emission spectrum of an organic electroluminescent device of Example 5 which has a charge trap concentration reducing layer and in which the light-emitting layer contains T2T (second host material).
Figure 23:
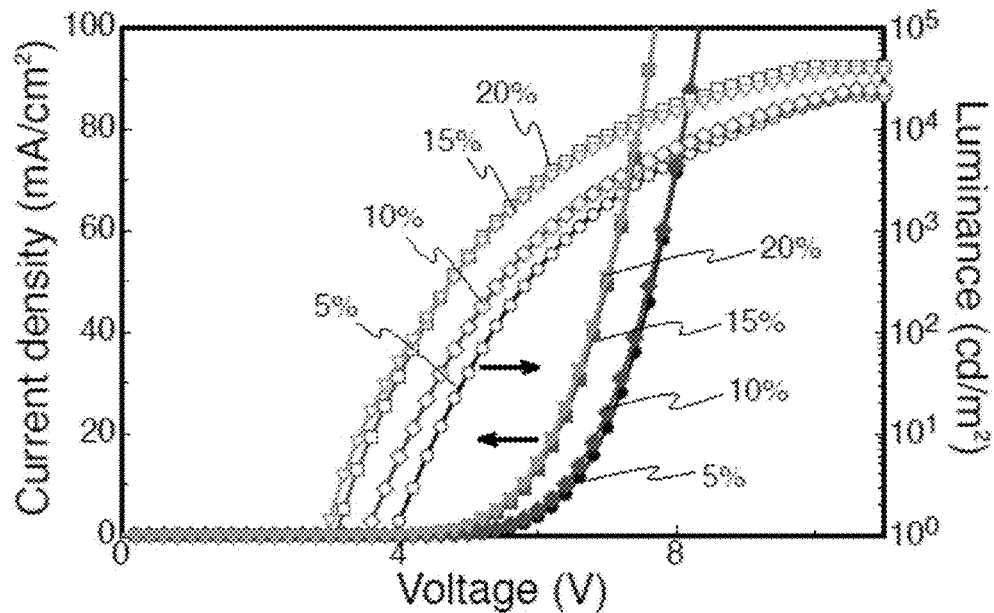
FIG. 23 This is a graph showing a voltage-current density-luminance characteristic of an organic electroluminescent device of Example 5 which has a charge trap concentration reducing layer and in which the light-emitting layer contains T2T (second host material).
Figure 24:
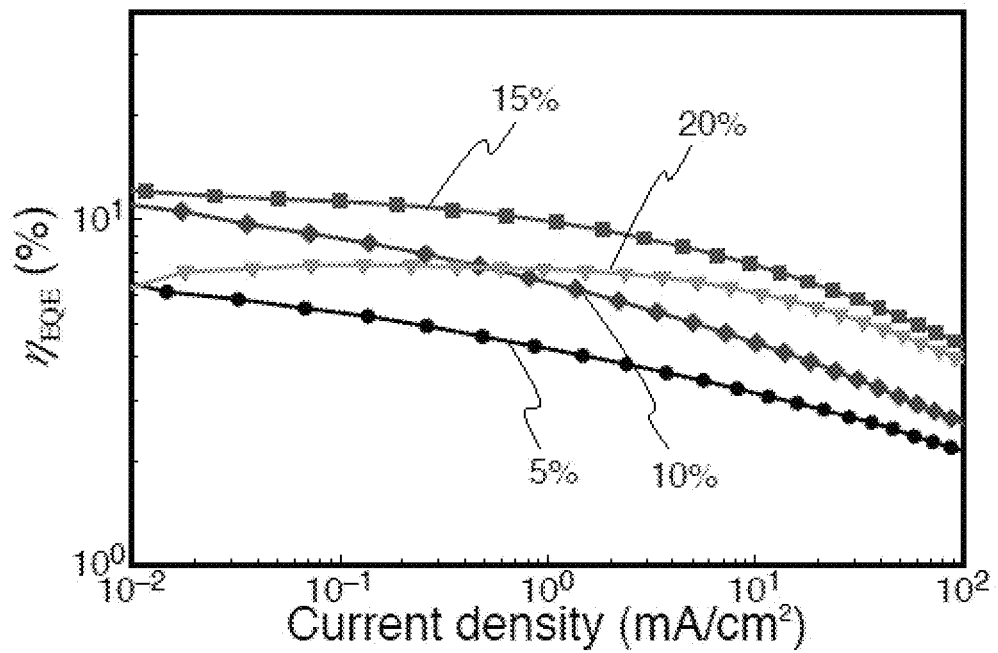
FIG. 24 This is a graph showing a current density-external quantum efficiency characteristic of an organic electroluminescent device of Example 5 which has a charge trap concentration reducing layer and in which the light-emitting layer contains T2T (second host material).
Figure 25:
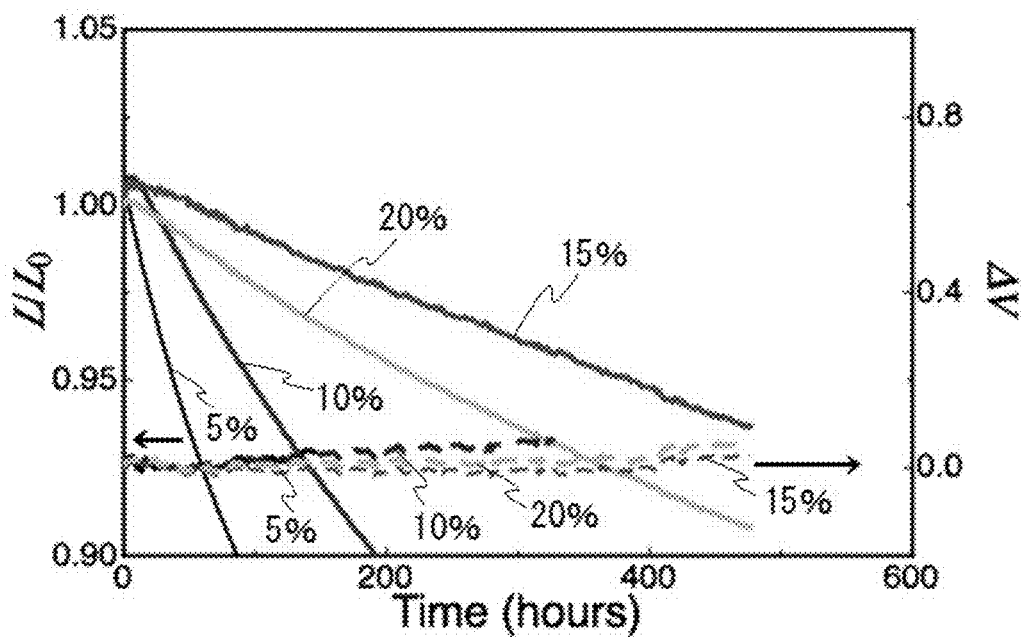
FIG. 25 This is a graph showing a time-dependent change of a luminance ratio and a voltage variation of an organic electroluminescent device of Example 5 which has a charge trap concentration reducing layer and in which the light-emitting layer contains T2T (second host-material).

The energy diagram oi the organic EL devices produced is shown in FIG. 21, the emission spectra thereof are in FIG. 22, the voltage-current density-luminance characteristic thereof is in FIG. 23, the current density-external quantum efficiency characteristic thereof is in FIG. 24, and the time-dependent change of luminance ratio and voltage variation thereof is in FIG. 25. The meanings of the numeral values in FIG. 21 are the same as those in FIG. 6. In FIGS. 22 to 25, "5%", "10%", "15%" and "20%" each mean the organic EL device in which the light-emitting layer contains 4CzIPN in the indicated concentration.

The organic EL device having a 4CzIPN concentration of 15% by weight and having a longest lifetime among the characteristic diagram of FIG. 23, and she organic EL device containing 10% T2T among the characteristic diagram of FIG. 14 (Example 3) are compared with each other, it is known that the organic EL device of this Example (organic EL device having a charge trap concentration reducing layer) can more effectively suppress time-dependent luminance ratio reduction than the organic EL device of Example 3 (organic EL device not having a charge trap concentration reducing layer). From this, it is known that, by adding T2T (second host material) to the light-emitting layer and additionally by forming a charge trap concentration reducing layer in the interface between the light-emitting layer and the first electron transport layer, the lifetime of the organic EL device can be further more prolonged.

(Example 6) Production and Evaluation of Organic Electroluminescent Device Having a Light-Emitting Layer Containing 15% by Weight of 4CzIPN (Light-Emitting Material), mCBP (First Host Material) and T2T (Second Host Material), Having a Second Electron Transport Layer Containing BPy-TP2 and Liq, and Having a Charge Trap Concentration Reducing Layer of Liq in the Interface Between the Light-Emitting Layer and the First Electron Transport Layer An organic electroluminescent device (organic EL device) was produced in the same manner as in Example 1 except that the concentration of 4CzIPN in the light-emitting layer was changed to 15% by weight, the content of mCBP relative to the total amount of the host materials was changed to 90% by weight, the content of T2T relative to the total amount of the host materials was changed to 10% by weight, a first electron transport layer was formed after formation of a charge trap concentration reducing layer through vapor deposition of Liq in a thickness of 3 nm on the light-emitting layer, a second electron transport layer formed through co-evaporation of BPy-TP2 and Liq from different evaporation sources, and Liq was formed in place of LiF. In this case, the concentration of Liq in the second electron transport layer was 50% by weight or 75% by weight, and in that manner, two kinds of organic EL devices differing in the Liq concentration therein were produced.

Figure 26:
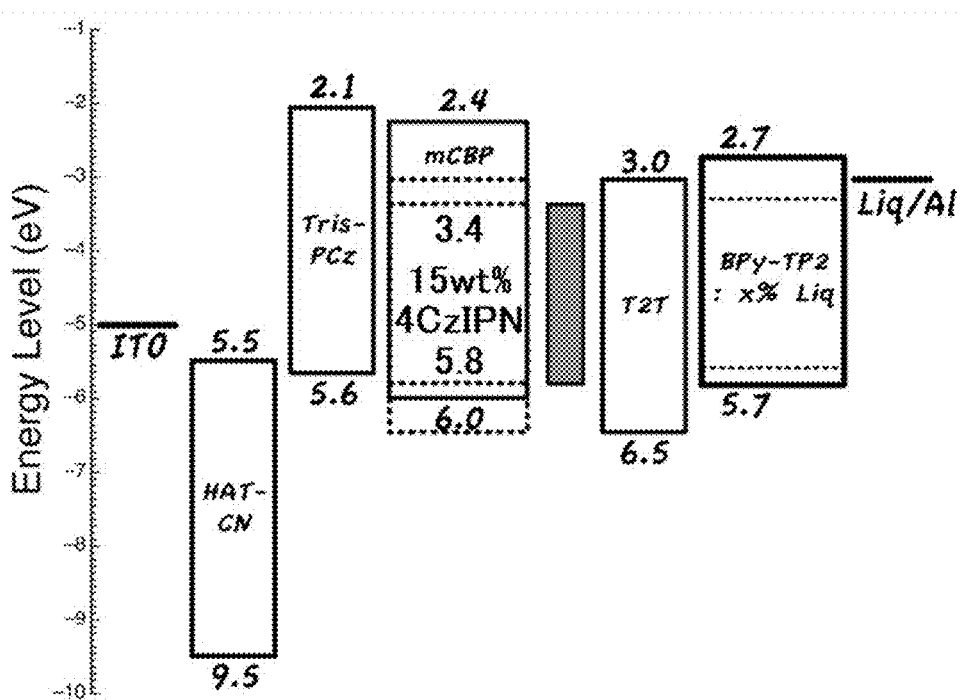
FIG. 26 This is an energy diagram of an organic electroluminescent device of Example 6 which has a charge trap concentration reducing layer and in which the light-emitting layer contains T2T (second host material) and the second electron transport layer contains Liq.
Figure 27:
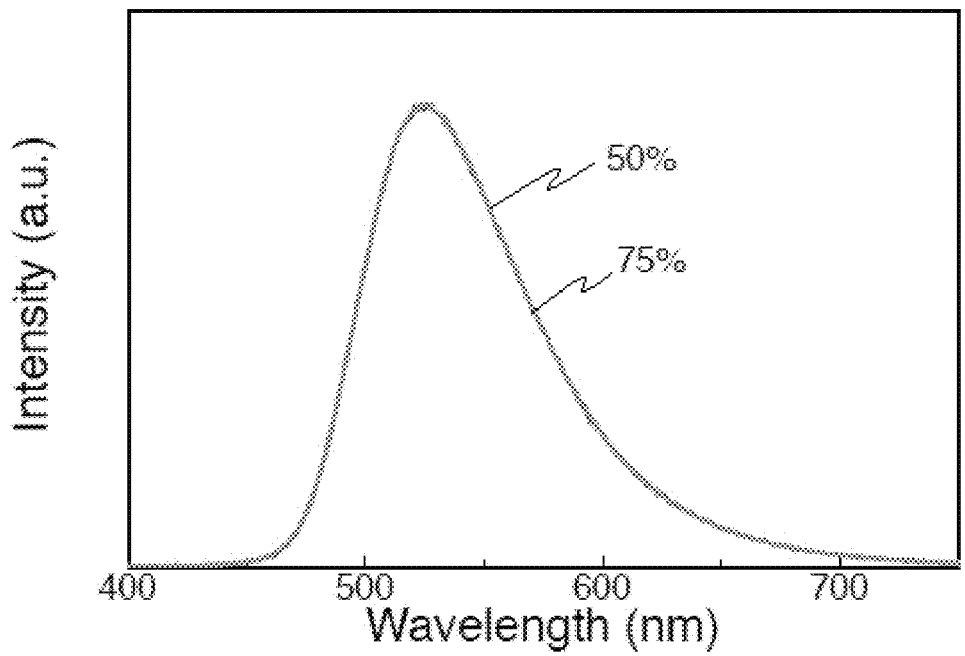
FIG. 27 This is an emission spectrum of an organic electroluminescent device of Example 6 which has a charge trap concentration reducing layer and in which the light-emitting layer contains T2T (second host material) and the second electron transport layer contains Liq.
Figure 28:
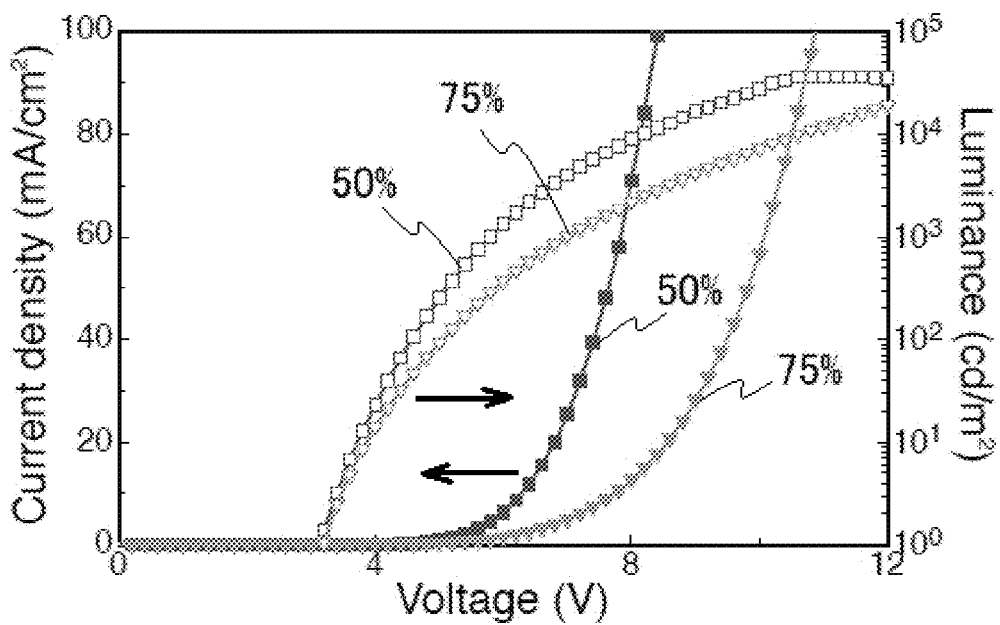
FIG. 28 This is a graph showing a voltage-current density-luminance characteristic of an organic electroluminescent device of Example 6 which has a charge trap concentration reducing layer and in which the light-emitting layer contains T2T (second host material) and the second electron transport layer contains Liq.
Figure 29:
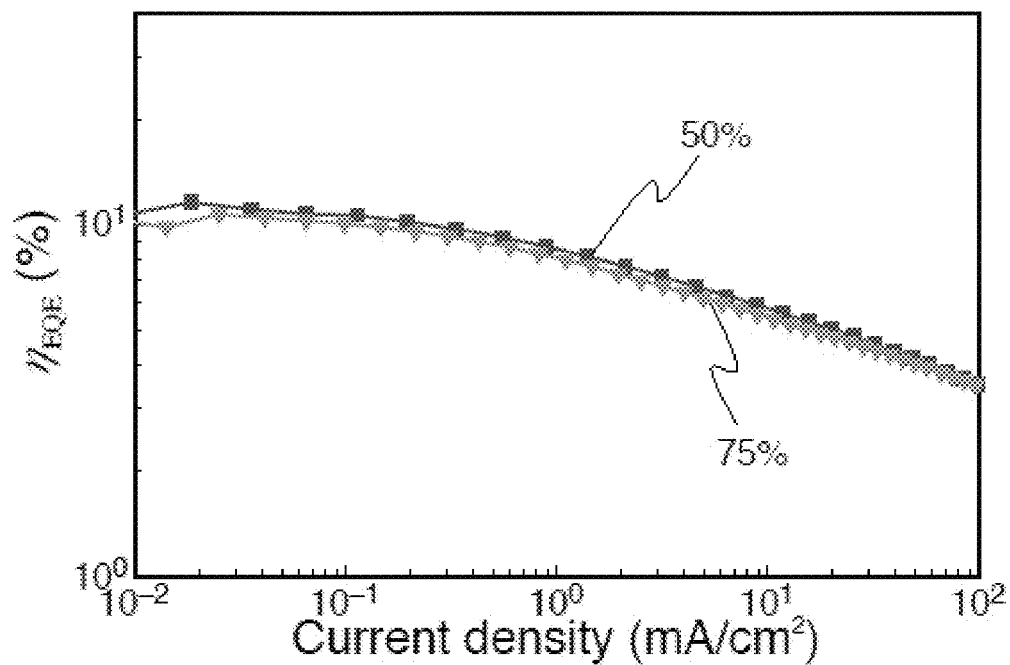
FIG. 29 This is a graph showing a current density-external quantum efficiency characteristic of an organic electroluminescent device of Example 6 which has a charge trap concentration reducing layer and in which the light-emitting layer contains T2T (second host material) and the second electron transport layer contains Liq.
Figure 30:
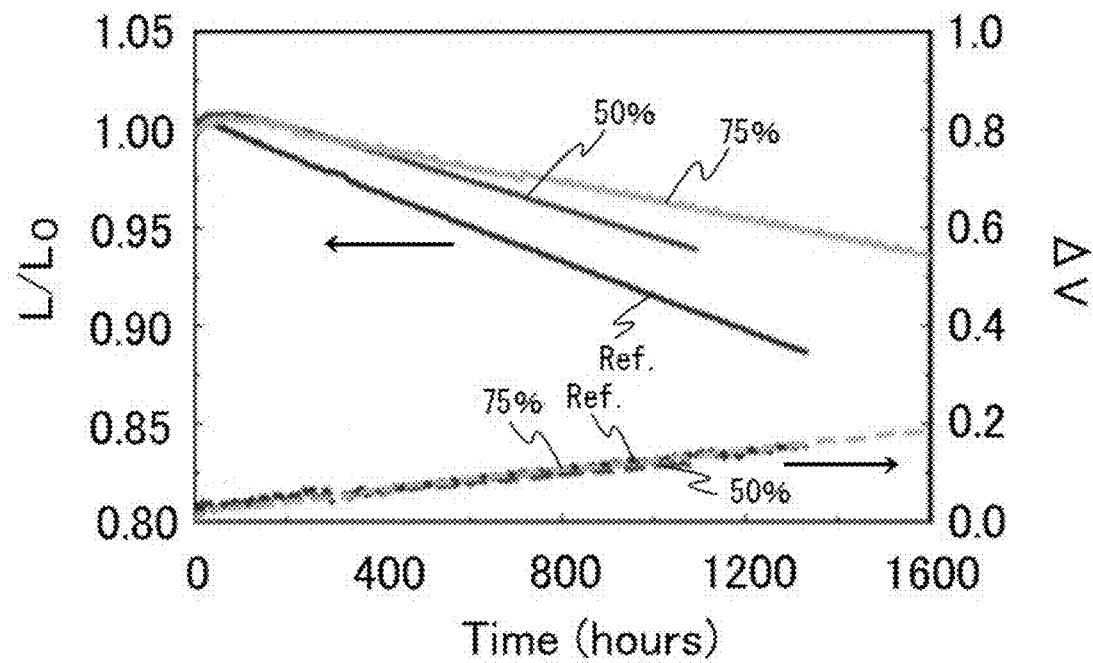
FIG. 30 This is a graph showing a time-dependent change of a luminance ratio and a voltage variation of an organic electroluminescent device of Example 6 which has a charge trap concentration reducing layer and in which the light-emitting layer contains T2T (second host material) and the second electron transport layer contains Liq.

The energy diagram of the organic EL devices produced is shown in FIG. 26, the emission spectra thereof are in FIG. 27, the voltage-current density-luminance characteristic thereof is in FIG. 28, the current density-external quantum efficiency characteristic thereof is in FIG. 29, and the time-dependent change of luminance ratio and voltage variation thereof is in FIG. 30. The meanings of the numeral values in FIG. 26 are the same as those in FIG. 15. In FIGS. 27 to 30, "Ref." means the organic EL device in which the second electron transport layer does not contain Liq, and "50%" and "75%" each mean the organic EL device in which the second electron transport layer contains Liq in the indicated concentration.

The characteristic diagram of FIG. 30 is compared with the characteristic diagram of FIG. 20 (Example 4). It is known that the organic EL device of this Example (organic EL device having a charge nap concentration reducing layer) can significantly suppress the luminance ratio reduction rate as compared with the organic EL device of Example 4 (organic EL device not having a charge trap concentration reducing layer). From this, it is known that, by adding T2T (second host material) to the light-emitting layer and adding Liq to the second electron transport layer, and by further forming the charge trap concentration reducing layer in the interface between the light-emitting layer and the first electron transport layer, the lifetime of the organic EL device can be markedly prolonged.

(Example 7) Production and Evaluation of Organic Electroluminescent Device Having a Light-Emitting Layer Containing 15% by Weight of 4CzIPN (Light-Emitting Material), mCBP (First Host Material) and T2T (Second Host Material), Having a Second Electron Transport Layer Containing BPy-TP2 and 50% by Weight of Liq, and Having a Charge Trap Concentration Reducing Layer of Liq in the Interface Between the Light-Emitting Layer and the First Electron Transport Layer An organic electroluminescent device (organic EL device) was produced in the same manner as in Example 6 except that the content of mCBP in the light-emitting layer was changed to 90% by weight, 70% by weight, 50% by weight or 30% by weight relative to the total amount of the host materials, the content of T2T was changed to 10% by weight 30% by weight, 50% by weight or 70% by weight relative to the total amount of the host materials, and the concentration of Liq in the second electron transport layer was fixed to be 50% by weight, and in that manner, 4 kinds of organic electroluminescent devices (organic EL devices) differing in the composition ratio of the host material therein were produced.

Figure 31:
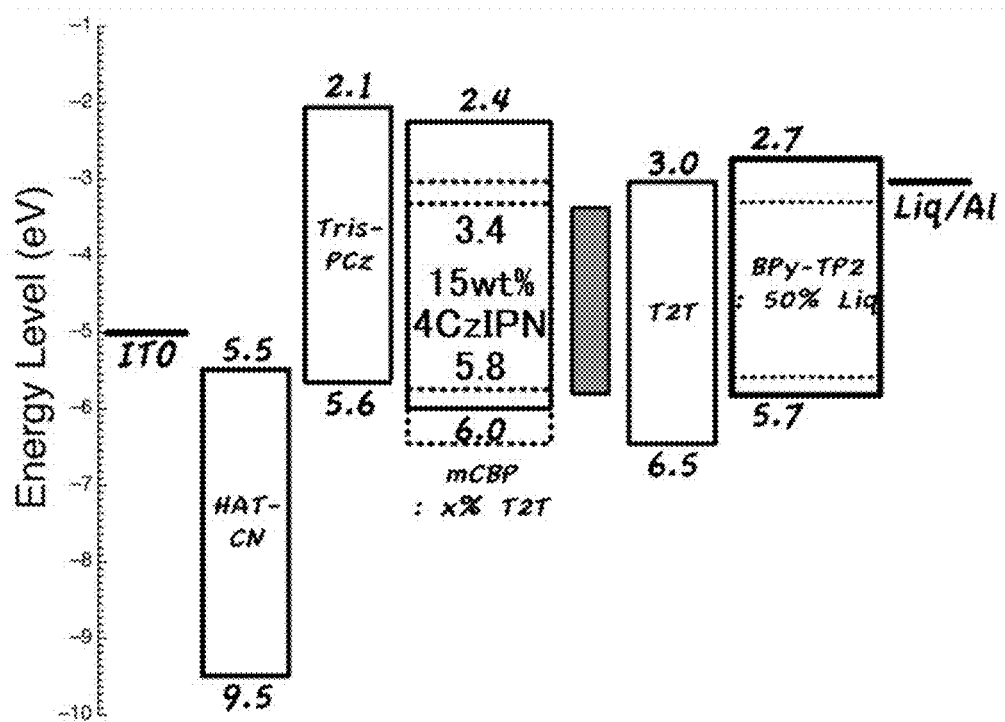
FIG. 31 This is an energy diagram of an organic electroluminescent device of Example 7 which has a charge trap concentration reducing layer and m which the light-emitting layer contains T2T (second host material) and the second electron transport layer contains Liq.
Figure 32:
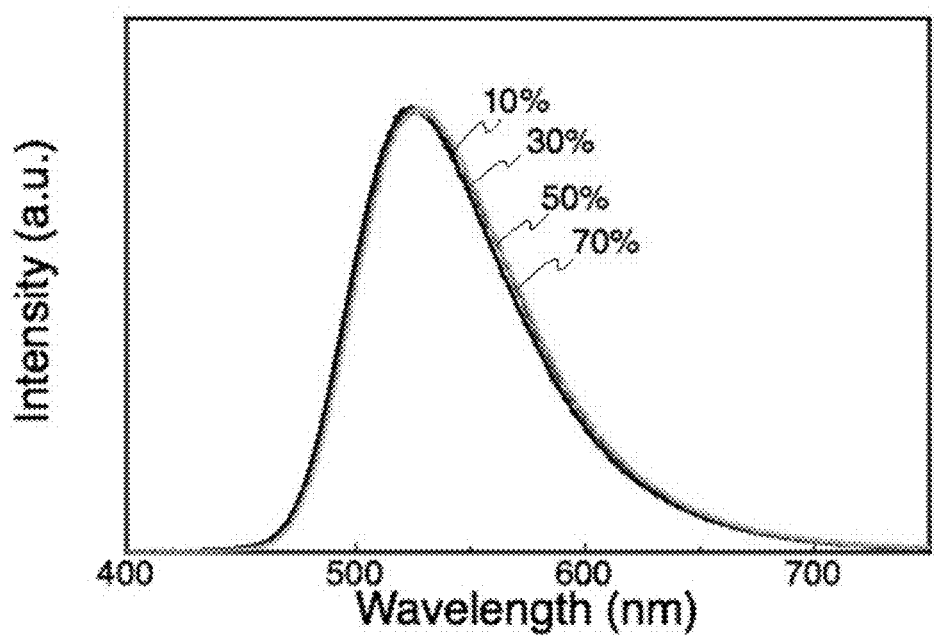
FIG. 32 This is an emission spectrum of an organic electroluminescent device of Example 7 which has a charge trap concentration reducing layer and in which the light-emitting layer contains T2T (second host material) and the second electron transport layer contains Liq.
Figure 33:
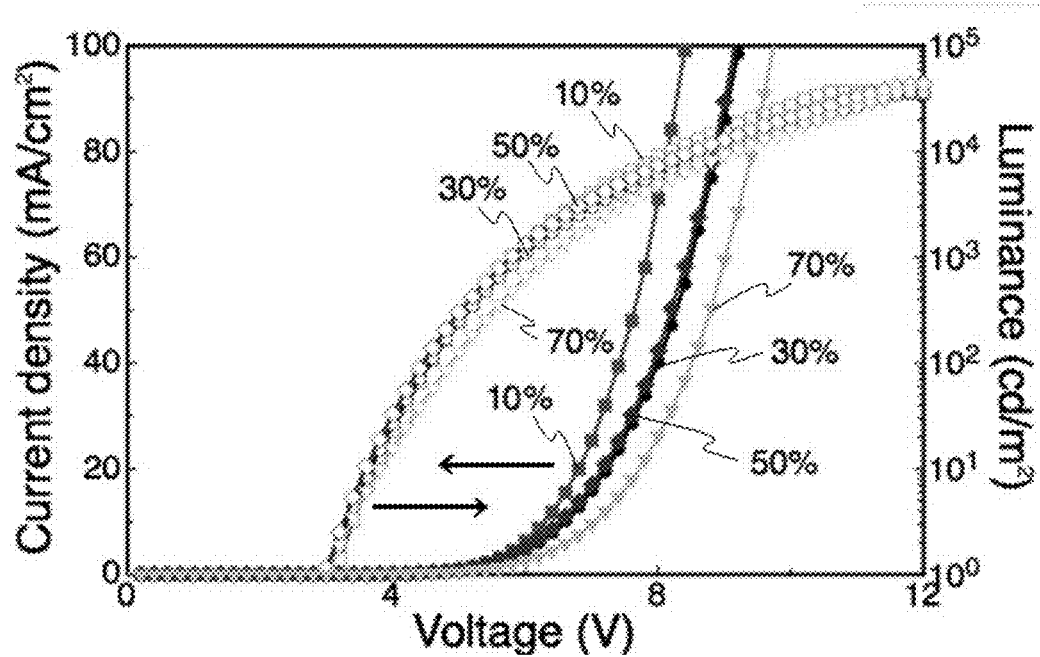
FIG. 33 This is a graph showing a voltage-current density-luminance characteristic of an organic electroluminescent device of Example 7 which has a charge trap concentration reducing layer and in which the light-emitting layer contains T2T (second host material) and the second electron transport layer contains Liq.
Figure 34:
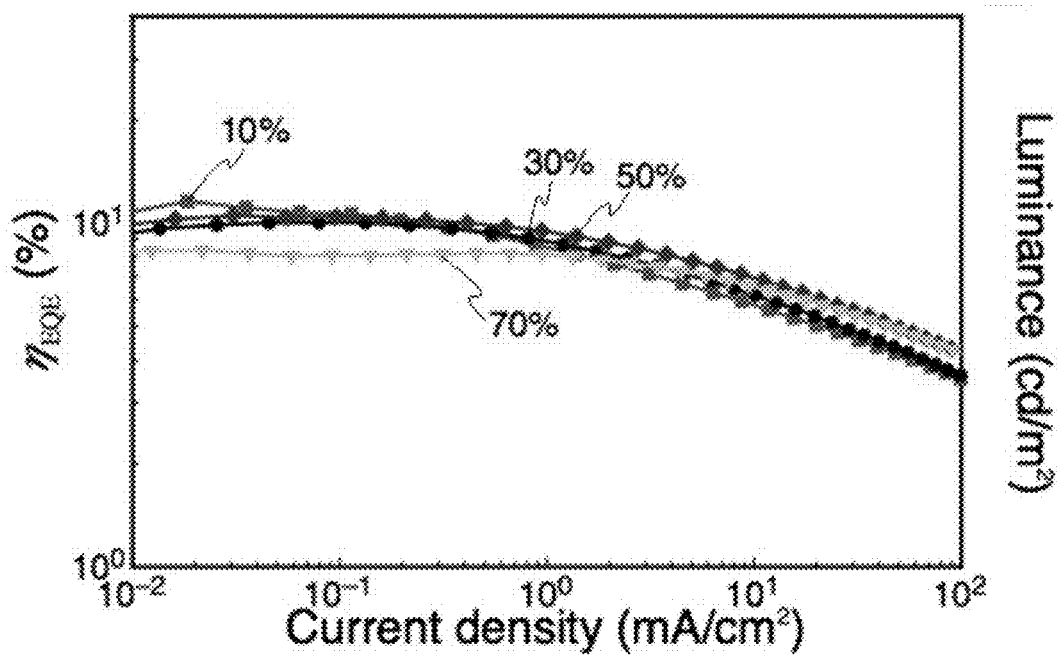
FIG. 34 This is a graph showing a current density-external quantum efficiency characteristic of an organic electroluminescent device of Example 7 which has a charge trap concentration reducing layer and in which the light-emitting, layer contains T2T (second host material) and the second electron transport layer contain Liq.
Figure 35:
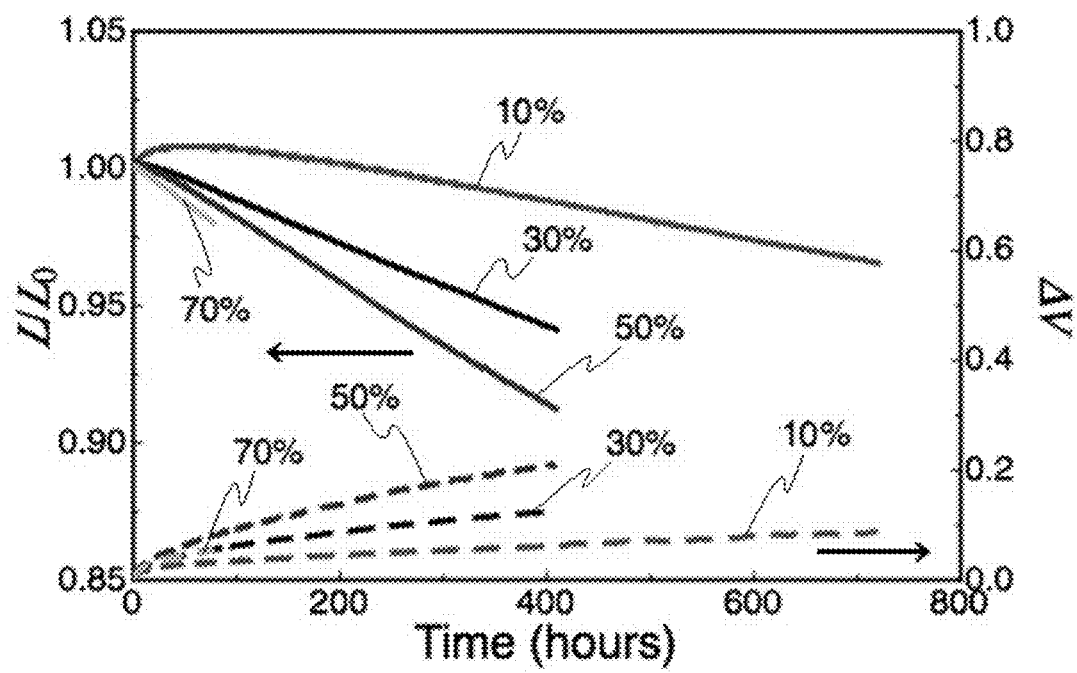
FIG. 35 This is a graph showing a time-dependent change of a luminance ratio and a voltage variation of an organic electroluminescent device of Example 7 which has a charge trap concentration reducing layer and in which the light-emitting layer contains T2T (second host material) and the second electron transport layer contains Liq.

The energy diagram of the organic EL devices produced is shown in FIG. 31, the emission spectra thereof are in FIG. 32, the voltage-current density-luminance characteristic thereof is in FIG. 33, the current density-external quantum efficiency characteristic thereof is in FIG. 34, and the time-dependent change of luminance ratio and voltage variation thereof is in FIG. 35. The meanings of the numeral values in FIG. 31 are the same as those in FIG. 15. In FIGS. 32 to 35, "10%", "30%", "50%" and "70%" each mean the organic EL device in winch the light-emitting layer contains T2T in the indicated content (content relative to the total amount of the host materials).

From the characteristic diagram of FIG. 35, it is known that when the content of T2T (second first material) relative to the total amount of the host materials was too large, the time-dependent luminance ratio reduction tended to increase as compared with the case where the content is small. From this, it is known that there is an upper limit to the content of the second host material in the light-emitting layer, and preferably, the content is 90% by weight or less, more preferably by weight or less, even more preferably 50% by weight or less, further more preferably 30% by weight or less.

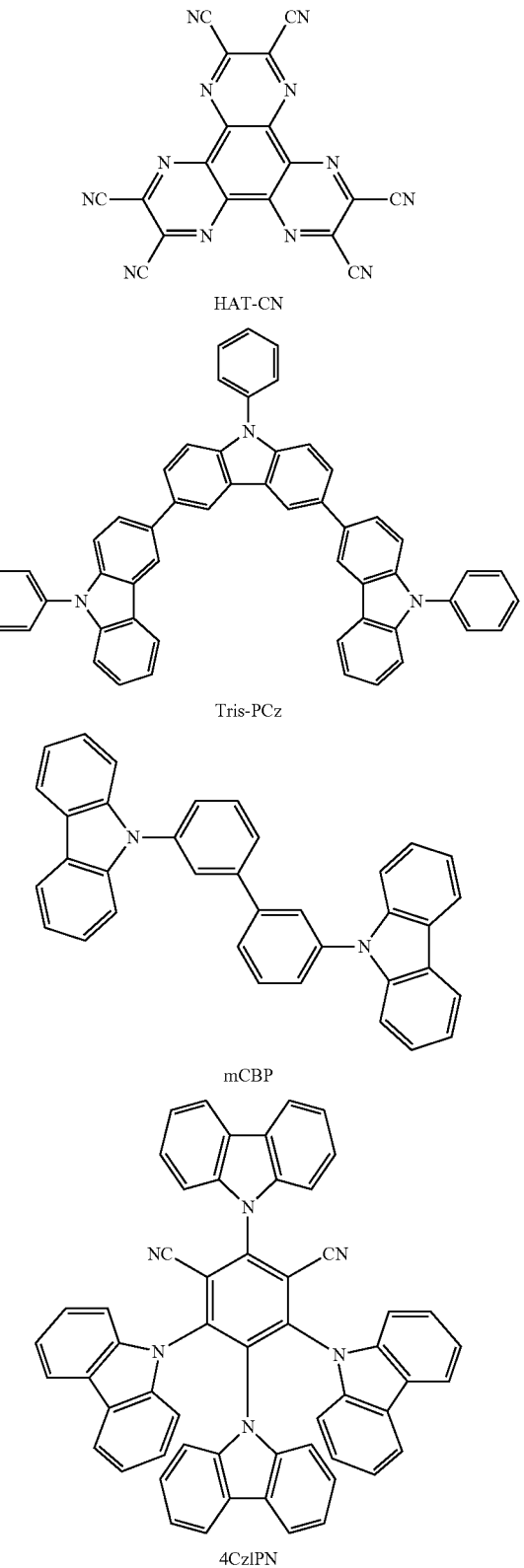

HAT-CN

Tris-PCz mCBP

4CzIPN

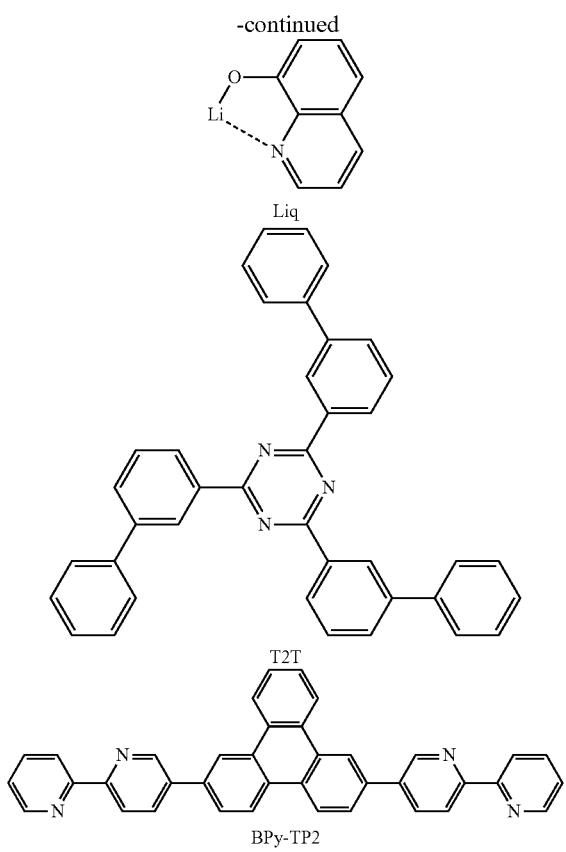

INDUSTRIAL APPLICABILITY

The organic electroluminescent device of the present invention is protect from performance deterioration with time in driving and has an extremely long lifetime. Accordingly, the industrial applicability of the present invention is great.

REFERENCE SIGNS LIST

1 Substrate
2 Anode
3 Light-Emitting Layer
4 Cathode
5 Electron Transport Layer
5a First Electron Transport Layer
5b Second Electron Transport Layer
6 Hole injection Layer
7 Hole transport Layer

The invention claimed is:
1. An organic electroluminescent device having a structure of at least an anode, a light-emitting layer, a charge trap concentration reducing layer, an electron transport layer and a cathode layered in that order, wherein:
the light-emitting layer comprises a first host material, a second host material and a light-emitting material of a delayed fluorescent dopant, and both the first host material and the second host material have a lowest excited triplet energy level higher than the lowest excited triplet energy level of the light-emitting material;
the second host material has a HOMO level lower than HOMO level of the light-emitting material and HOMO level of the first host material, and the second host material has a LUMO level higher than LUMO level of the light-emitting material and lower than LUMO level of the first host material;
the content of the second host material in the light-emitting layer is 5% to 15% by weight relative to the total amount of the host materials and the remainder consists of the first host material having the following structure:

the electron transport layer contains an 8-hydroxyquinolinolate derivative in an amount of 90% by weight or less;
the charge trap concentration reducing layer consists of an 8-hydroxyquinolinolate derivative;
the second host material is a compound having the following structure:

and
the light-emitting material of a delayed fluorescent dopant is a compound having the following structure:

2. The organic electroluminescent device according to claim 1, which has, between the charge trap concentration reducing layer and the electron transport layer, an additional electron transport layer.

* * * * *